US008664846B2

(12) United States Patent
van de Ven et al.

(10) Patent No.: US 8,664,846 B2
(45) Date of Patent: Mar. 4, 2014

(54) SOLID STATE LIGHTING DEVICE INCLUDING GREEN SHIFTED RED COMPONENT

(75) Inventors: Antony Paul van de Ven, Sai Kung (HK); Gerald H. Negley, Chapel Hill, NC (US); Ronan P. LeToquin, Fremont, CA (US); Bernd P. Keller, Santa Barbara, CA (US); James Ibbetson, Santa Barbara, CA (US)

(73) Assignee: Cree, Inc., Durham, NC (US)

( * ) Notice: Subject to any disclaimer, the term of this patent is extended or adjusted under 35 U.S.C. 154(b) by 68 days.

(21) Appl. No.: 13/440,992

(22) Filed: Apr. 6, 2012

(65) Prior Publication Data

US 2013/0020929 A1    Jan. 24, 2013

Related U.S. Application Data

(60) Provisional application No. 61/474,169, filed on Apr. 11, 2011.

(51) Int. Cl.
*H01L 23/00* (2006.01)

(52) U.S. Cl.
USPC ............ 313/498; 313/499; 313/500; 362/231

(58) Field of Classification Search
USPC ........... 313/498–512; 362/231, 612, 800, 260
See application file for complete search history.

(56) References Cited

U.S. PATENT DOCUMENTS

| 3,875,456 | A  | 4/1975  | Kano et al.      |
|-----------|----|---------|------------------|
| 7,095,056 | B2 | 8/2006  | Vitta et al.     |
| 7,213,940 | B1 | 5/2007  | Van De Ven et al.|
| 7,250,715 | B2 | 7/2007  | Mueller et al.   |
| 7,391,060 | B2 | 6/2008  | Oshio            |
| 7,453,195 | B2 | 11/2008 | Radkov           |
| 7,564,180 | B2 | 7/2009  | Brandes          |

(Continued)

FOREIGN PATENT DOCUMENTS

| JP | 2002-217454 A | 8/2002 |
| JP | 2004-080046 A | 3/2004 |

(Continued)

OTHER PUBLICATIONS

Cree, Inc., "Cree XLamp MC-E LED" Product Family Data Sheet (2008-2012).

(Continued)

*Primary Examiner* — Anh Mai
*Assistant Examiner* — Elmito Breval
(74) *Attorney, Agent, or Firm* — Vincent K. Gustafson; Jenkins, Wilson, Taylor & Hunt, P.A.

(57) ABSTRACT

A green-shifted red solid state lighting device includes at least one green solid state light emitter arranged to stimulate emissions from at least one red lumiphor, arranged in combination with at least one blue solid state light emitter. Such device may be devoid of any yellow lumiphor arranged to be stimulated by a blue solid state light emitter. A green shifted red plus blue (GSR+B) lighting device exhibits reduced Stokes Shift losses as compared to a blue shifted yellow plus red (BSY+R) lighting device, with comparable color rendering performance and similar efficiency, enhanced color stability over a range of operating temperatures, and enhanced color rendering performance at higher correlated color temperatures. Additional solid state emitters and/or lumiphors may be provided.

45 Claims, 32 Drawing Sheets

(56) References Cited

U.S. PATENT DOCUMENTS

| | | |
|---|---|---|
| 7,655,957 B2 | 2/2010 | Loh et al. |
| 8,125,137 B2 | 2/2012 | Medendorp, Jr. et al. |
| 2005/0002191 A1 | 1/2005 | Shimizu et al. |
| 2007/0259206 A1 | 11/2007 | Oshio |
| 2008/0106895 A1* | 5/2008 | Van De Ven et al. ......... 362/231 |
| 2008/0304260 A1 | 12/2008 | Van De Ven et al. |
| 2008/0304261 A1* | 12/2008 | Van De Ven et al. ......... 362/231 |
| 2009/0046453 A1 | 2/2009 | Kramer |
| 2009/0108269 A1 | 4/2009 | Negley et al. |
| 2010/0001299 A1 | 1/2010 | Chang et al. |
| 2010/0079059 A1 | 4/2010 | Roberts et al. |
| 2011/0221330 A1 | 9/2011 | Negley et al. |
| 2011/0222277 A1 | 9/2011 | Negley et al. |

FOREIGN PATENT DOCUMENTS

| | | |
|---|---|---|
| JP | 2006-245443 A | 9/2006 |
| JP | 2007-173397 A | 7/2007 |
| JP | 2007-258620 A | 10/2007 |
| JP | 2010-034183 A | 2/2010 |
| JP | 2010-182724 A | 8/2010 |
| JP | 2010-232529 A | 10/2010 |
| TW | 546854 | 8/2003 |

OTHER PUBLICATIONS

International Search Report and Written Opinion corresponding to International Patent Application No. PCT/US2012/032442 dated Aug. 27, 2013.

* cited by examiner

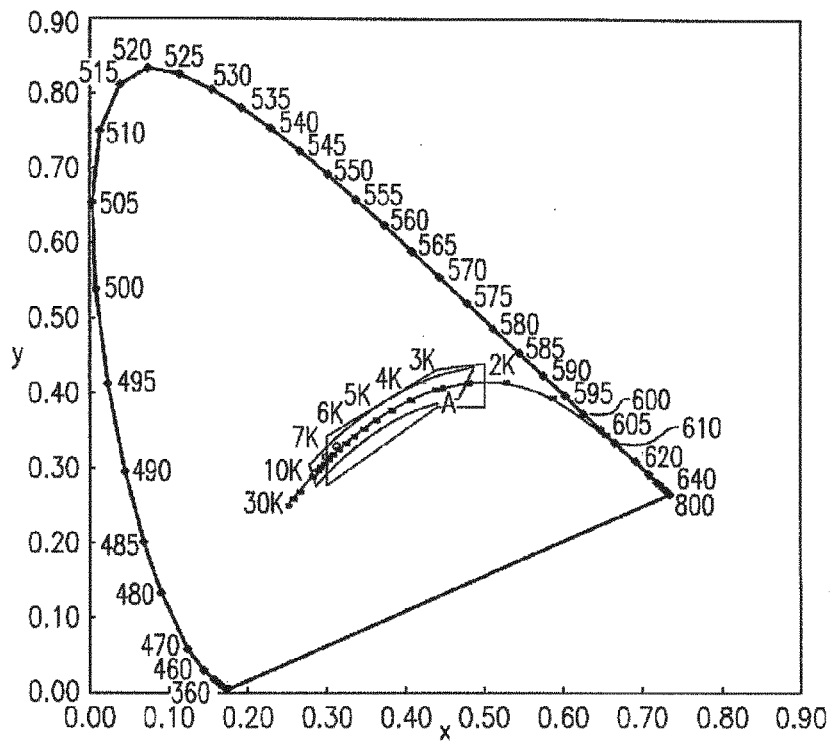
FIG._1
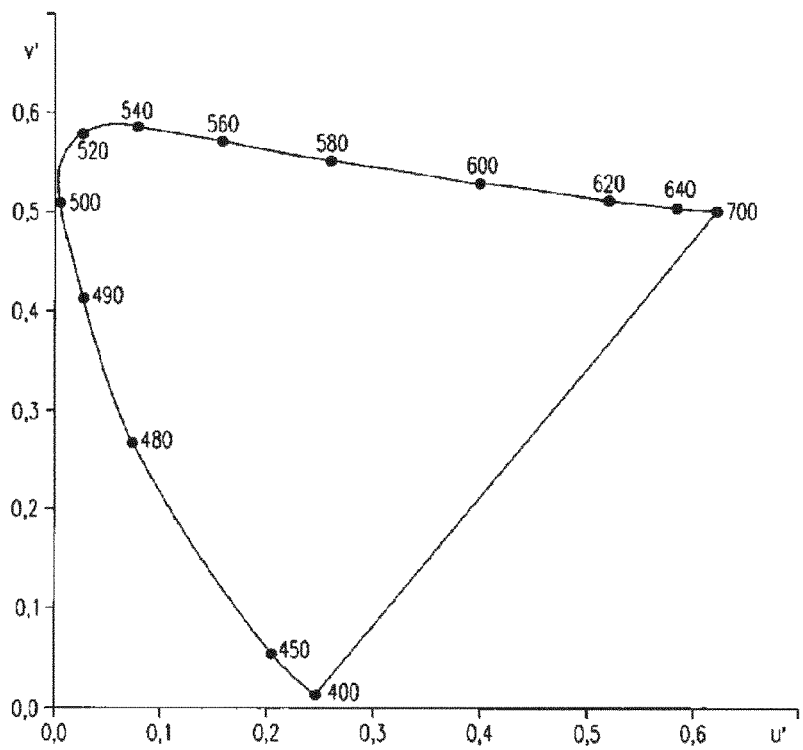
FIG._2

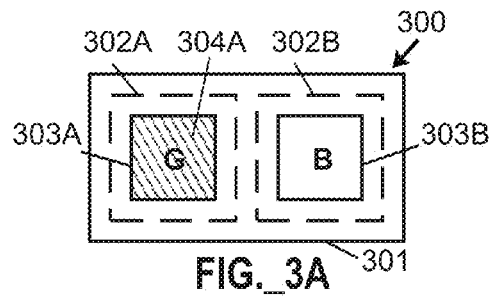
FIG._3A
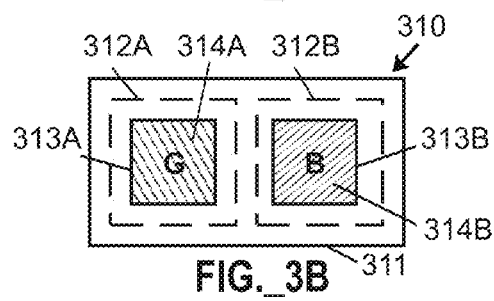
FIG._3B
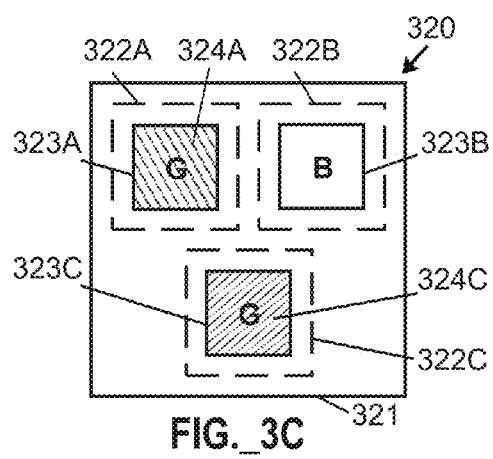
FIG._3C
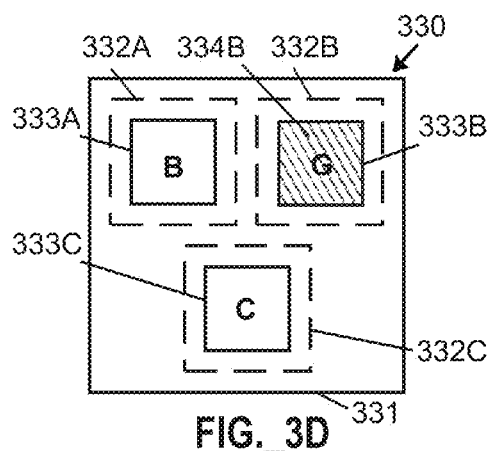
FIG._3D
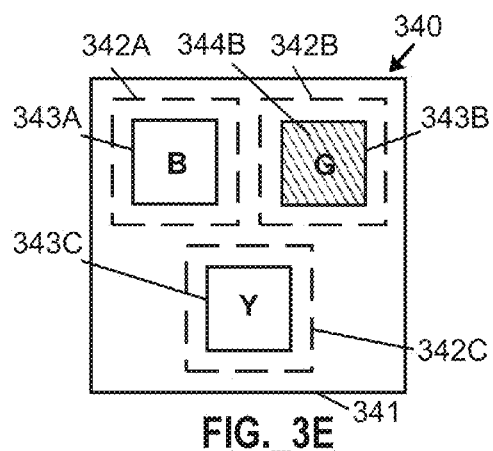
FIG._3E
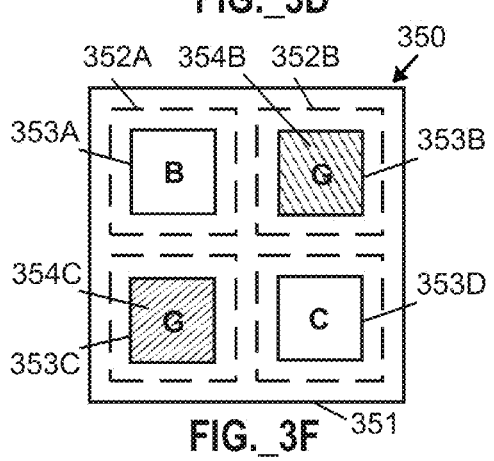
FIG._3F
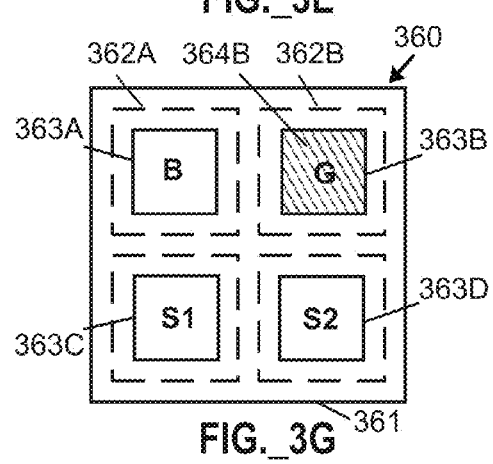
FIG._3G

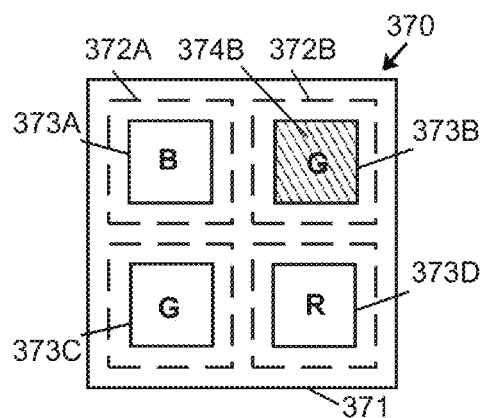
FIG._3H
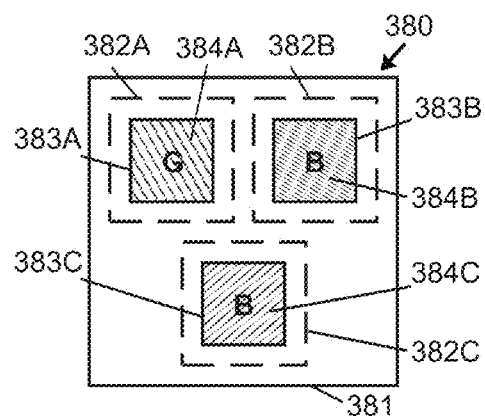
FIG._3I
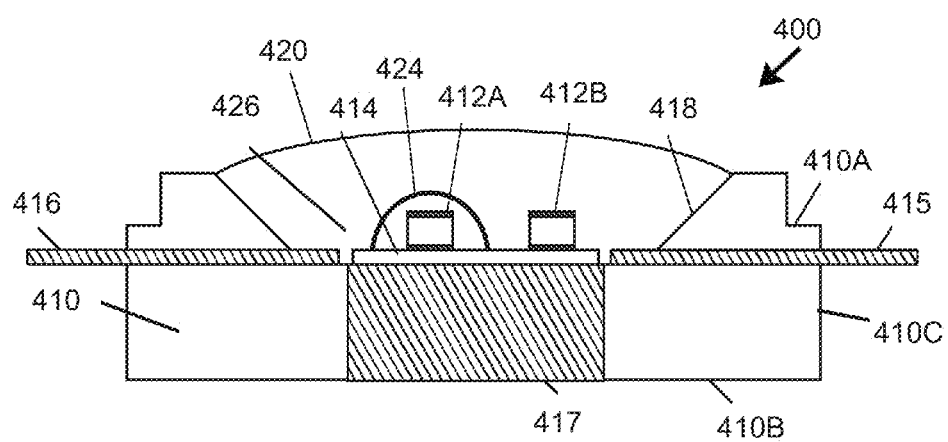
FIG._4

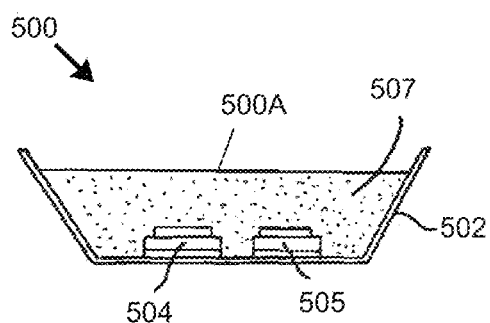
FIG._5A
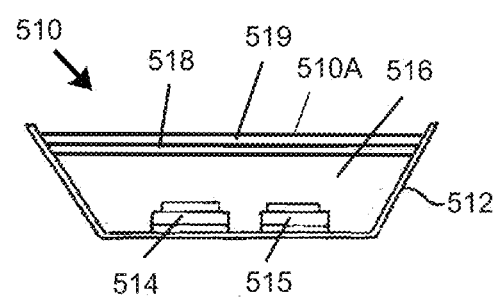
FIG._5B
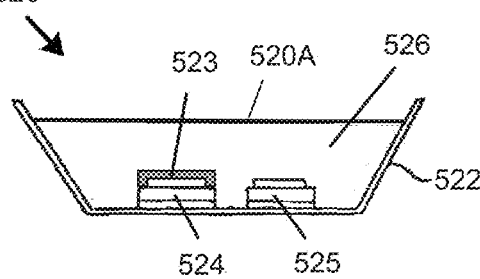
FIG._5C
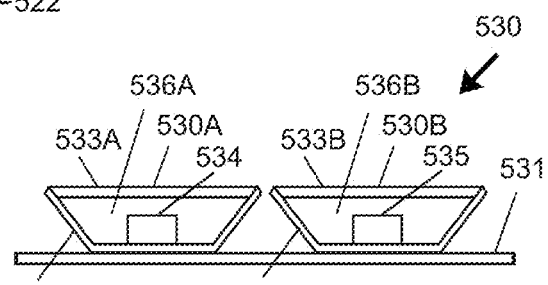
FIG._5D
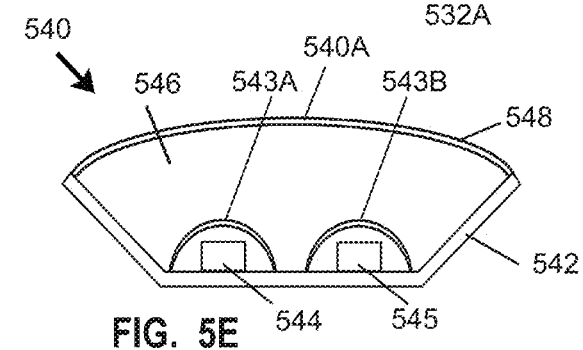
FIG._5E

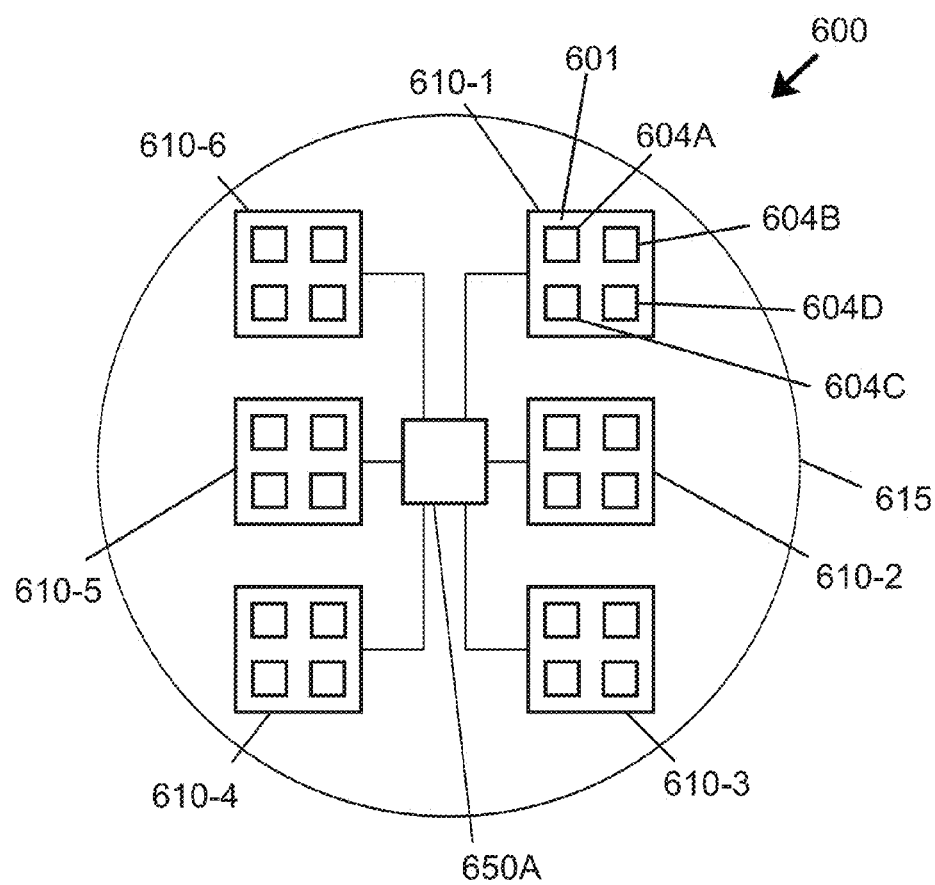
FIG._6

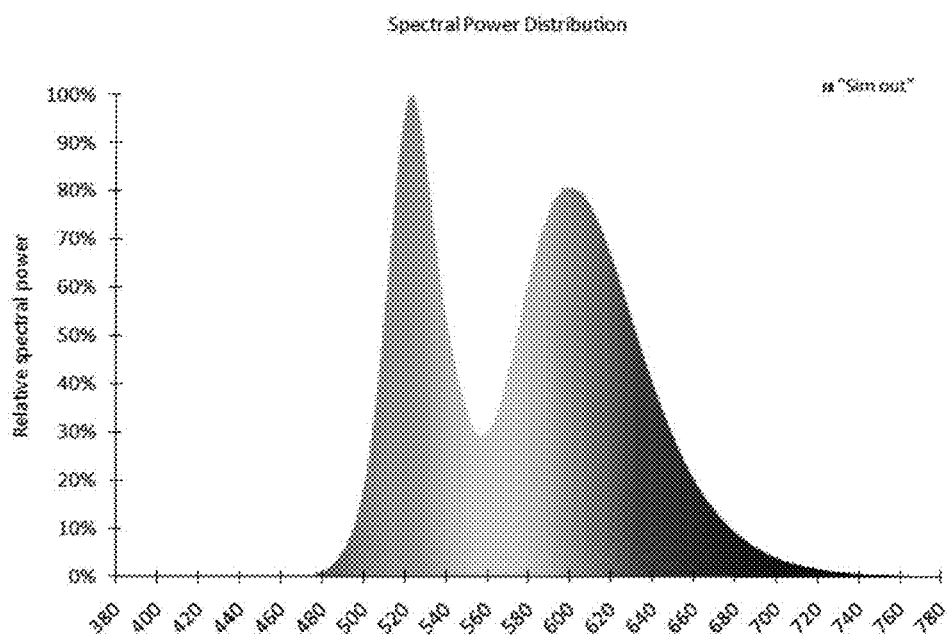
FIG._7
| x | y | u' | v' | nm (dom) | nm (peak) | Comp | Purity | CCT | FWHM |
|---|---|---|---|---|---|---|---|---|---|
| 0.4588 | 0.5142 | 0.2224 | 0.5608 | 574 | 523 | 462 | 91% | 3398 | 91 |
FIG._8

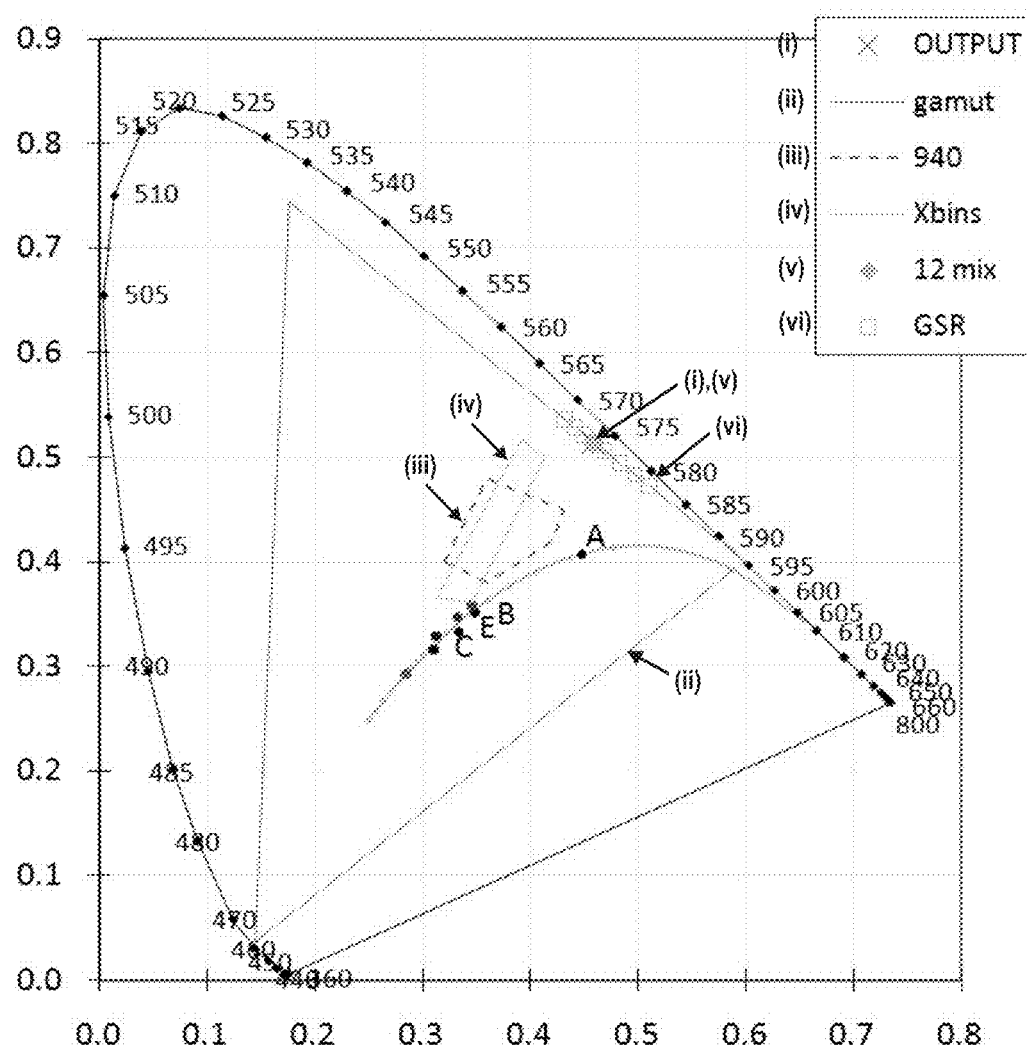
FIG._9

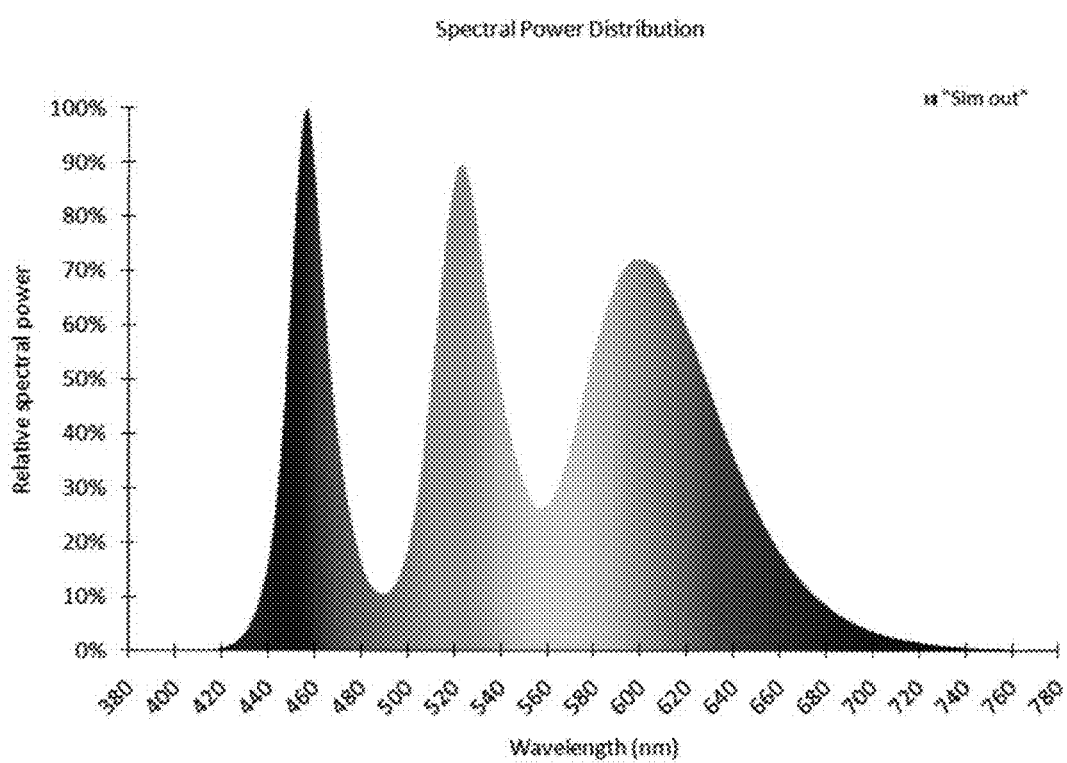
FIG._10

| CCT | CRI Ra | R9 | CQS | GAI | LER | O6040 L% | 530nm L% | 460nm L% | GSR x | GSR y | GSR dom |
|---|---|---|---|---|---|---|---|---|---|---|---|
| 6532 | 93 | 63 | 92 | 101% | 308 | 43% | 52% | 4.6% | 0.4320 | 0.5360 | 570 |
| 5666 | 93 | 55 | 92 | 97% | 317 | 46% | 50% | 4.1% | 0.4415 | 0.5283 | 572 |
| 5027 | 92 | 44 | 91 | 91% | 325 | 48% | 49% | 3.5% | 0.4494 | 0.5219 | 573 |
| 4503 | 93 | 37 | 91 | 86% | 332 | 50% | 46% | 3.1% | 0.4588 | 0.5142 | 574 |
| 3985 | 92 | 26 | 90 | 78% | 340 | 53% | 44% | 2.6% | 0.4691 | 0.5059 | 576 |
| 3465 | 90 | 11 | 89 | 68% | 346 | 58% | 40% | 2.1% | 0.4833 | 0.4944 | 578 |
| 3045 | 87 | -5 | 86 | 57% | 352 | 62% | 36% | 1.6% | 0.4971 | 0.4832 | 580 |
| 2725 | 83 | -21 | 83 | 46% | 356 | 66% | 33% | 1.3% | 0.5102 | 0.4725 | 582 |
FIG._11
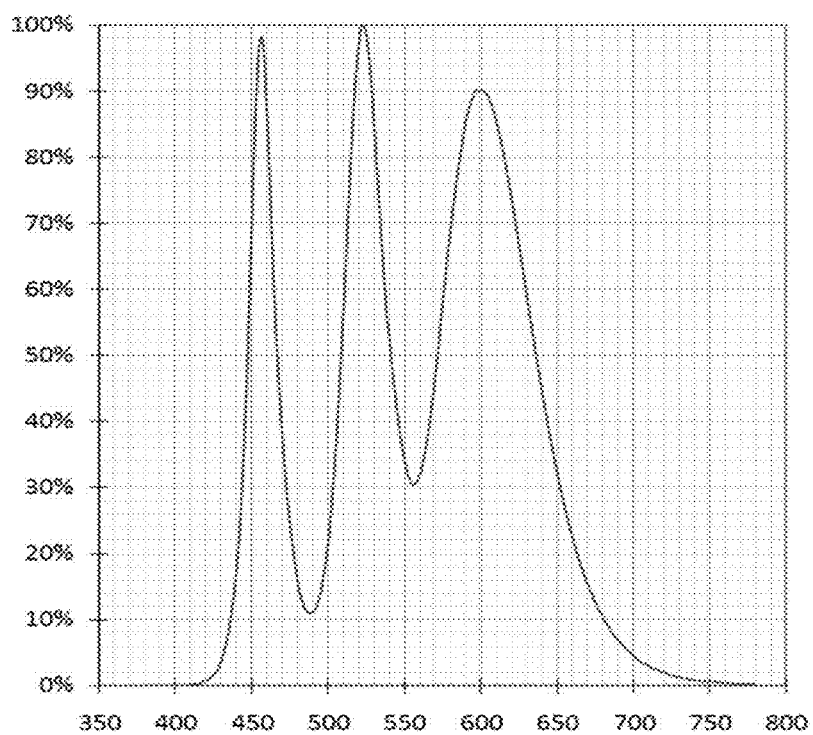
FIG._12

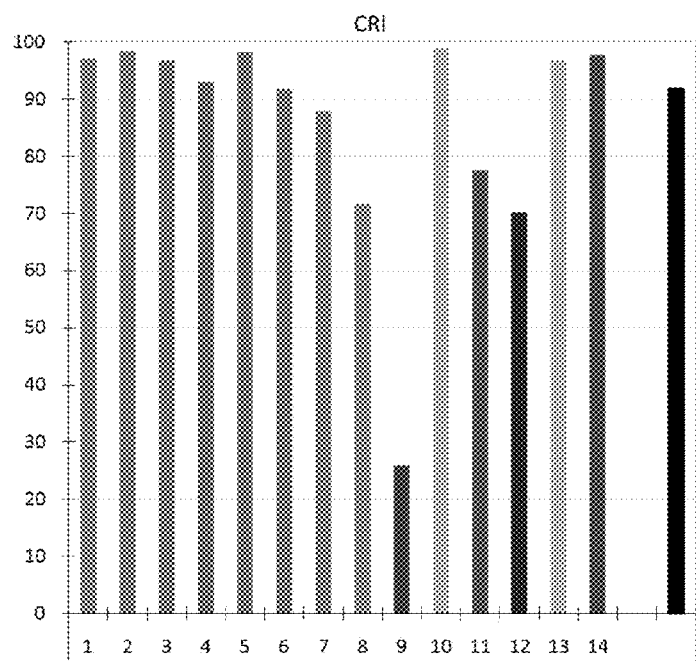
FIG._13A
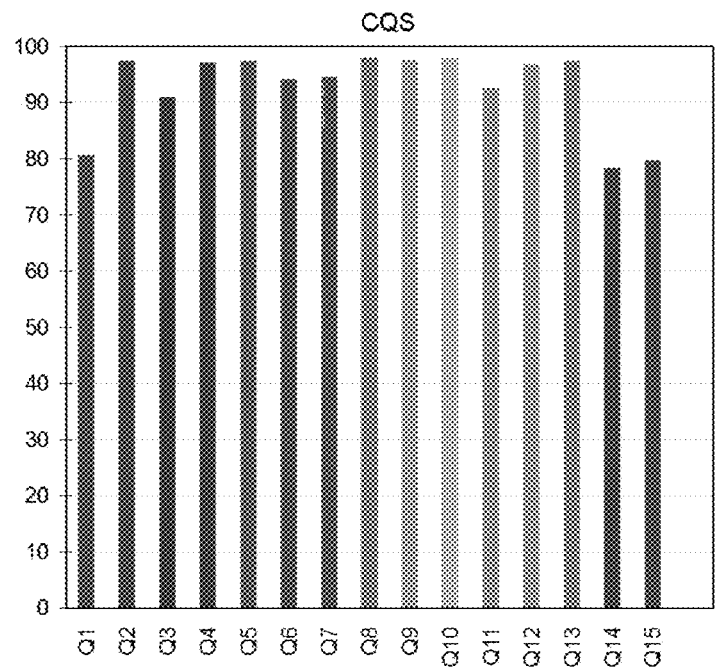
FIG._13B

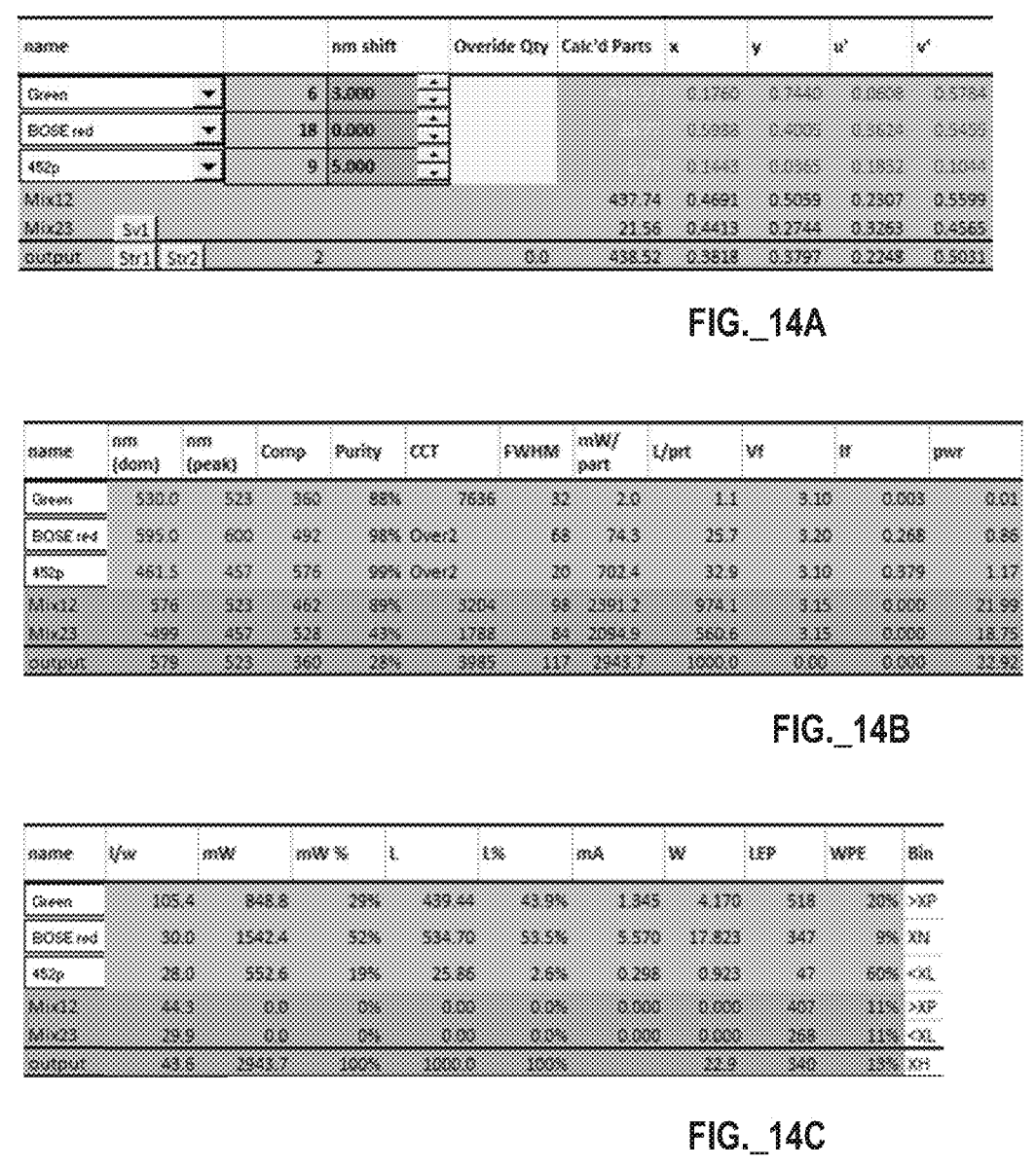

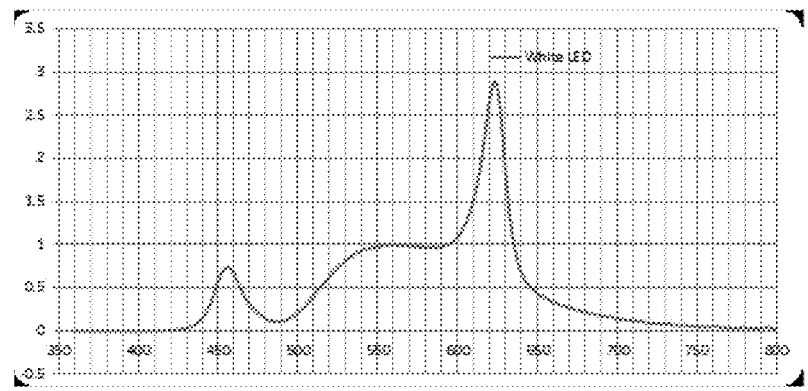
FIG._15
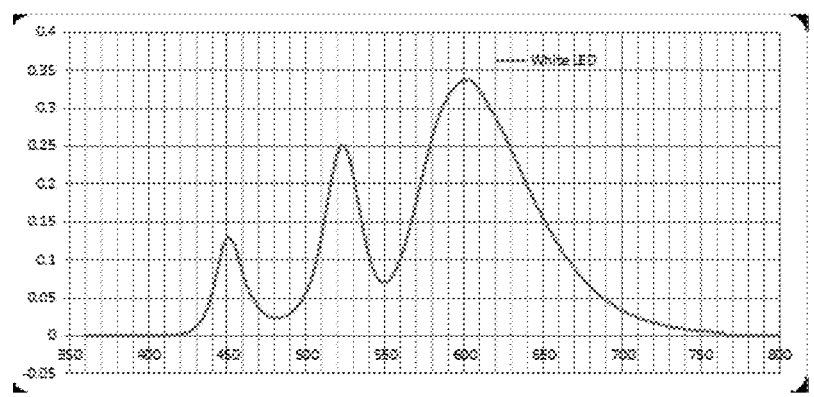
FIG._16
| | BSY + R<br>YAG 335 + 455 nm B<br>624 nm R | GSR + B<br>455 nm B<br>O6040  525 nm G |
|---|---|---|
| LER | 342 Lum/W-Opt | 320 Lum/W-Opt |
| Stokes | 20.2% | 12.1% |
| CRI/R9 | 90 / 46 | 87 / 27 |
| B (%W / L) | 9.5 / 1.4 | 8.3 / 1.3 |
| G (%W / L) | 66.4 / 81.4 | 22.3 / 34.1 |
| R (%W / L) | 24.1 / 17.2 | 69.4 / 64.6 |
FIG._17

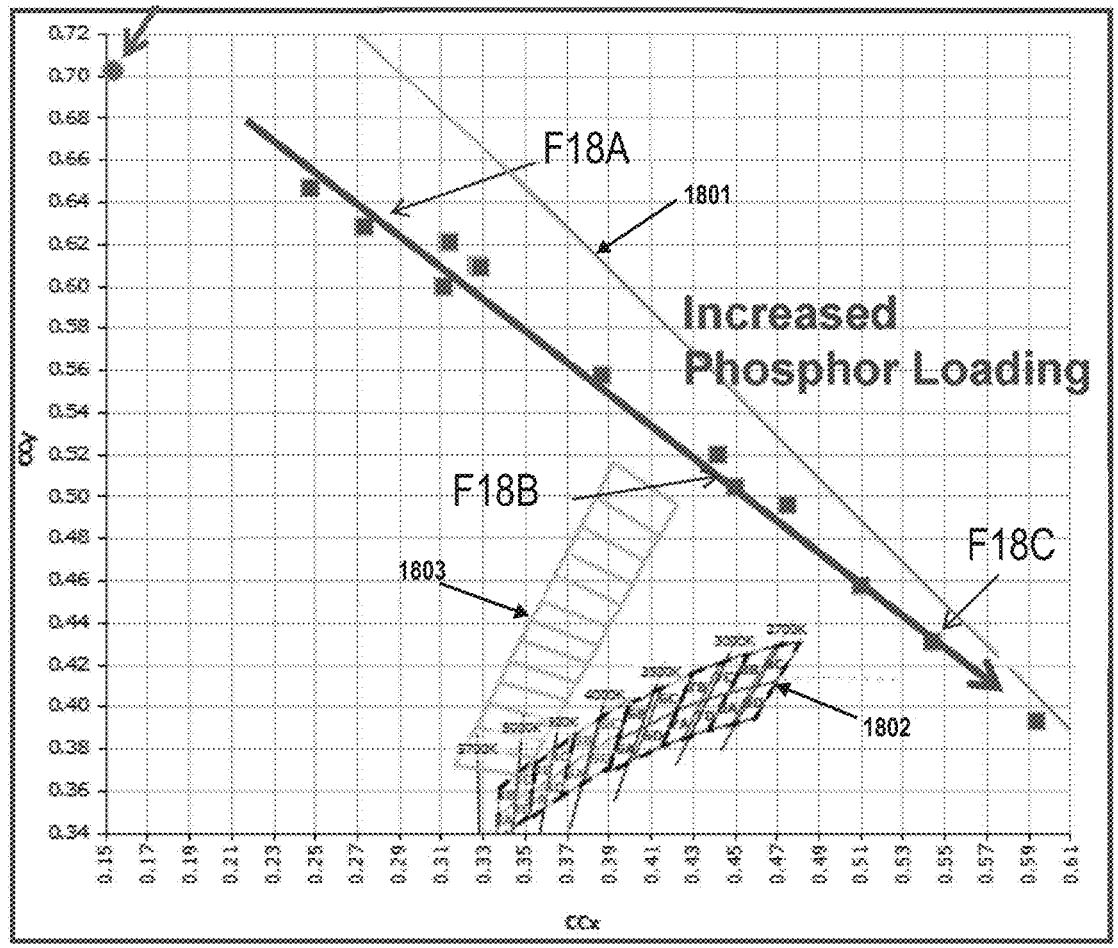
FIG._18

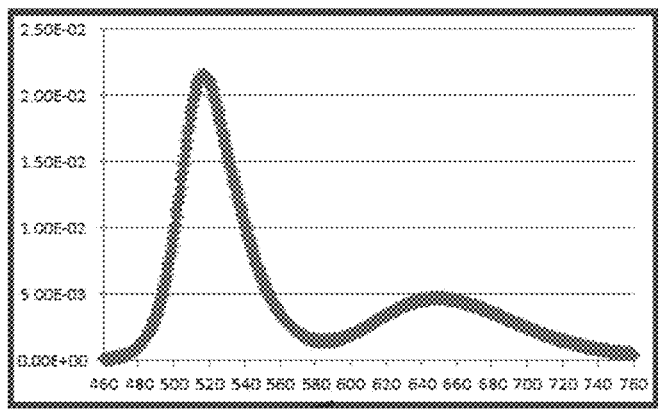
FIG._18A
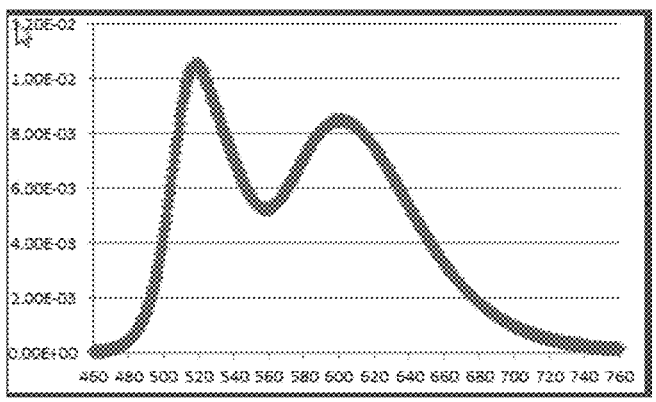
FIG._18B
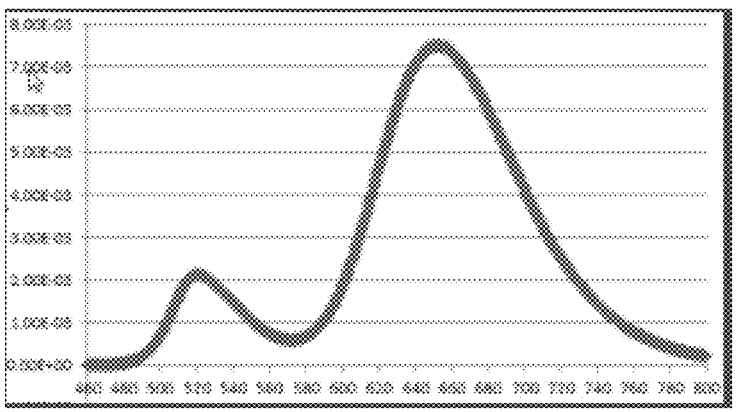
FIG._18C

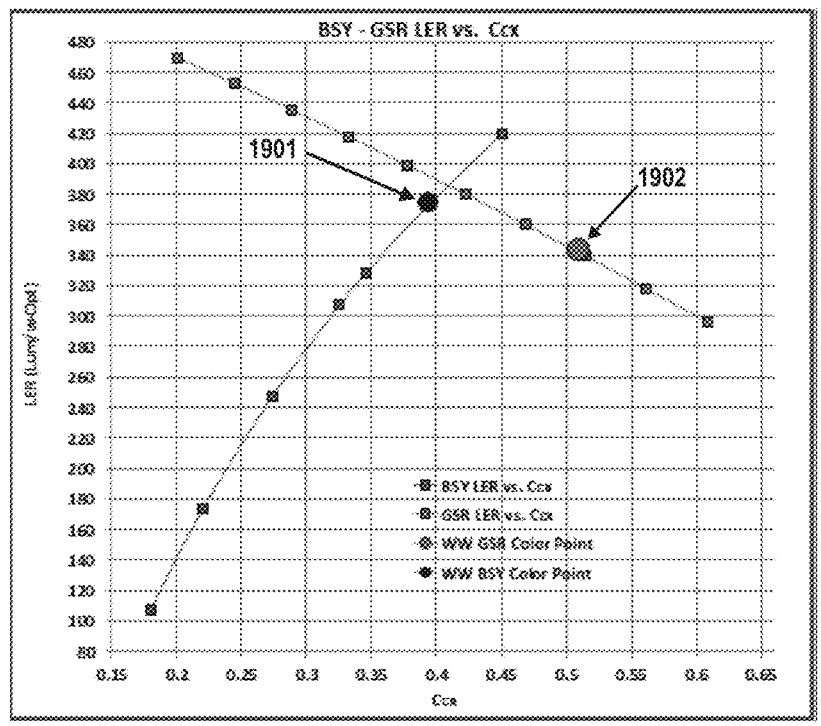
FIG._19
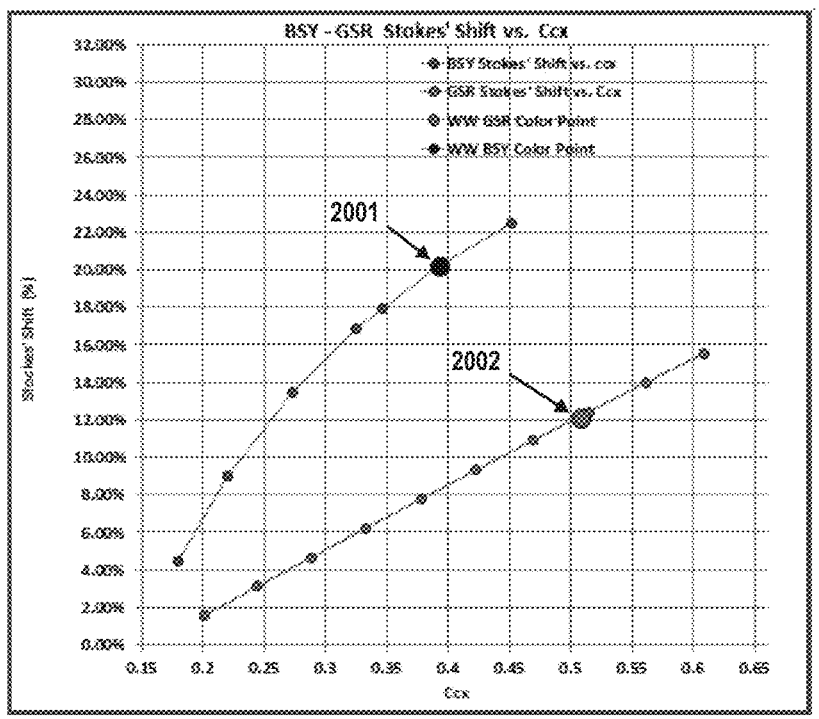
FIG._20

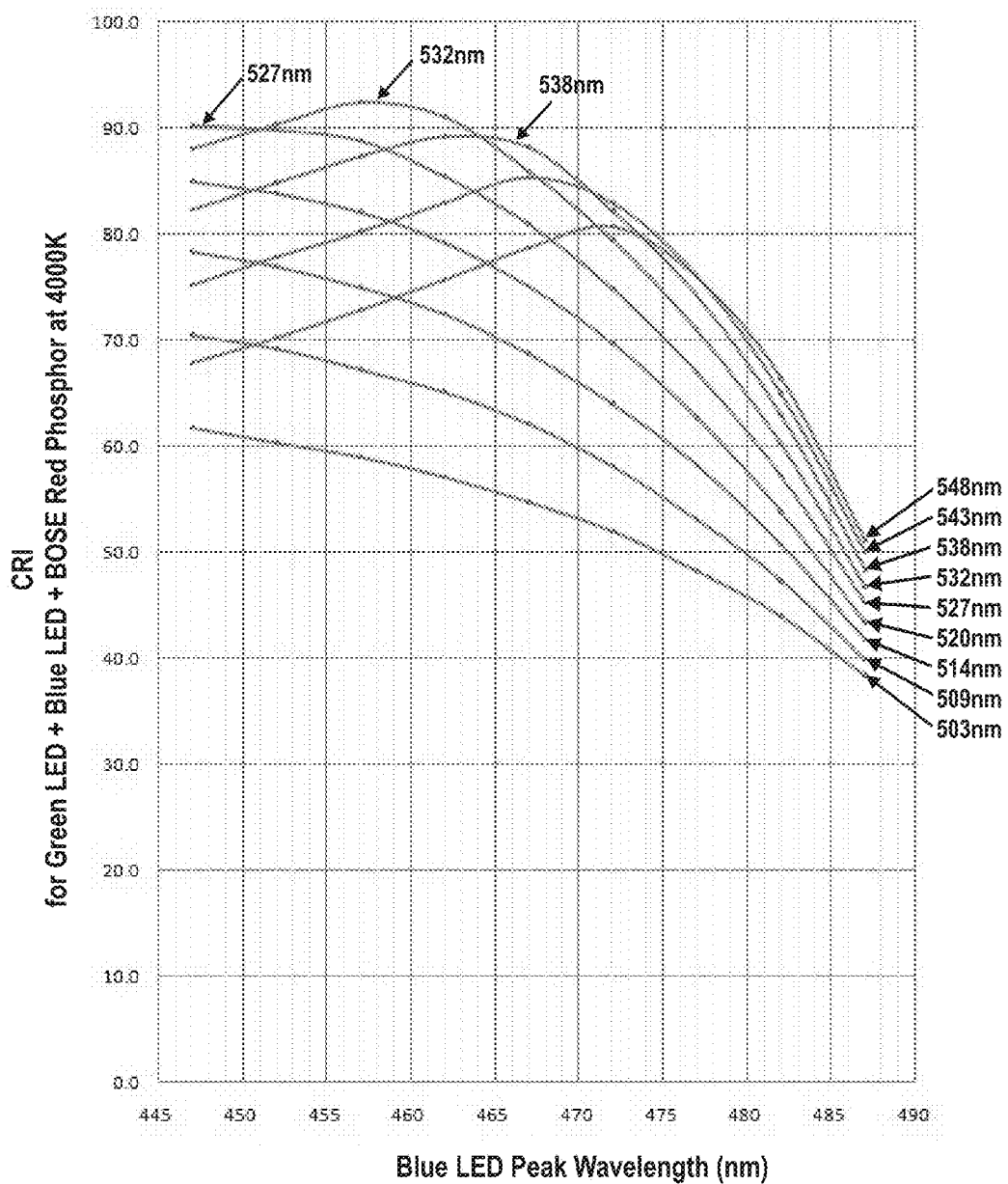
FIG._21

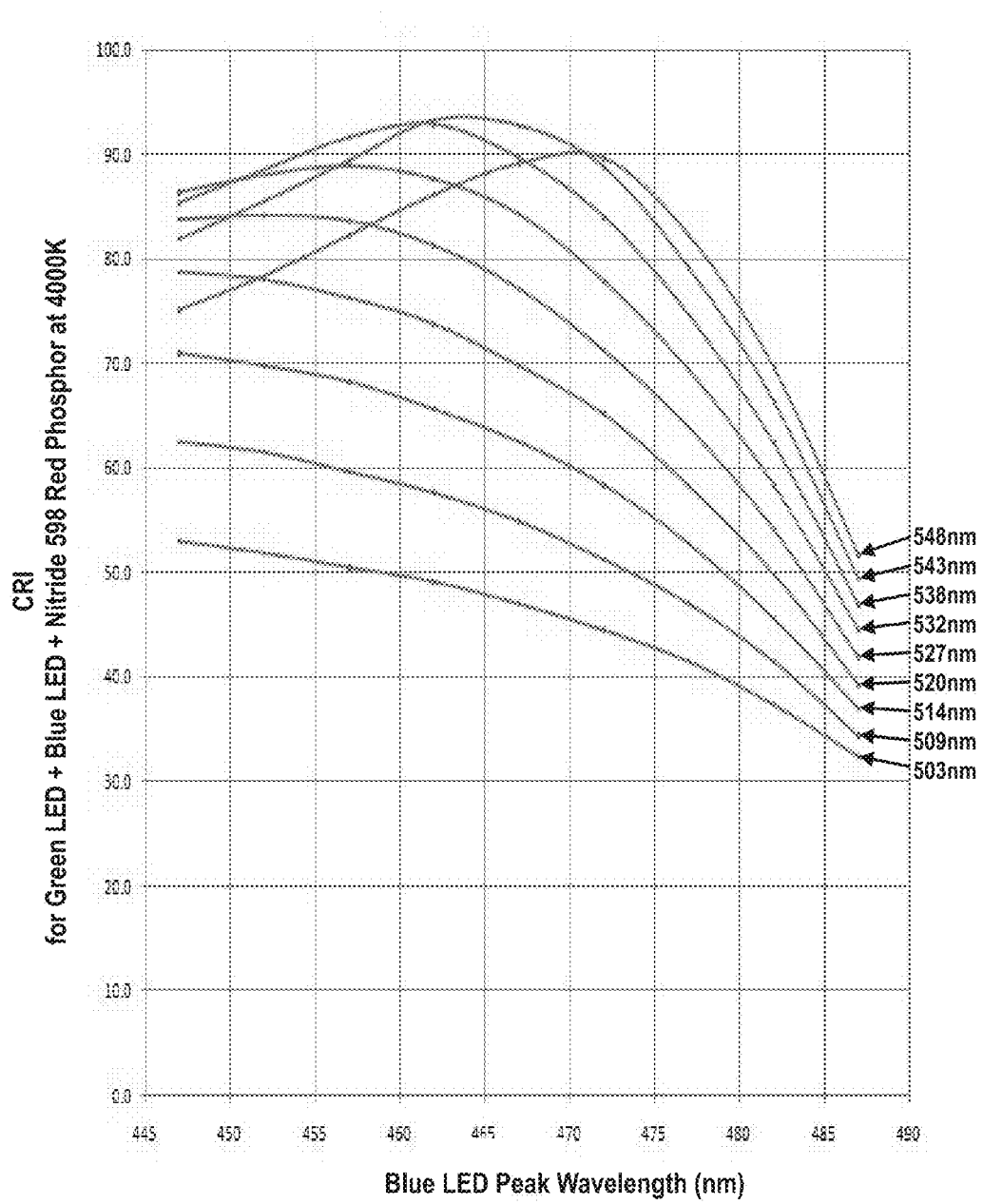
FIG._23

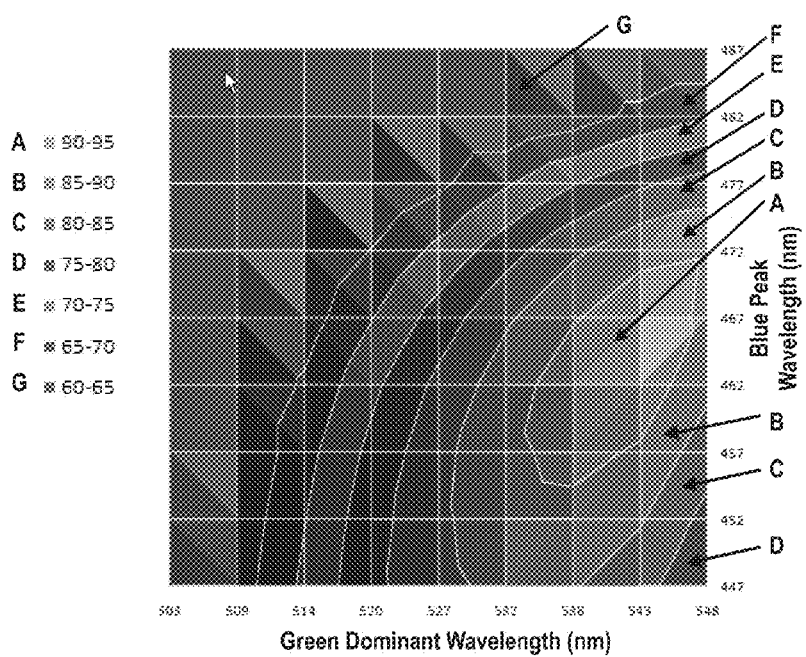
FIG._25A
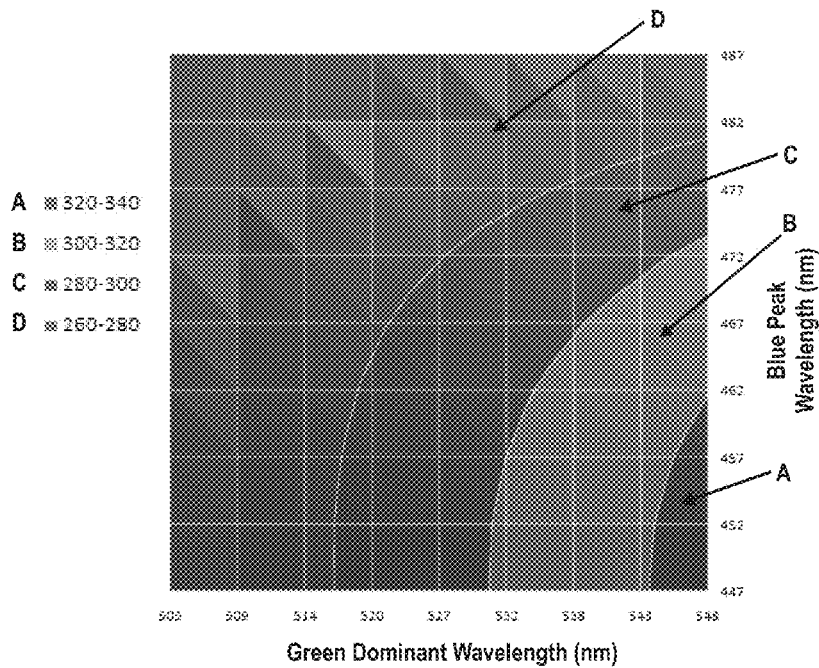
FIG._25B

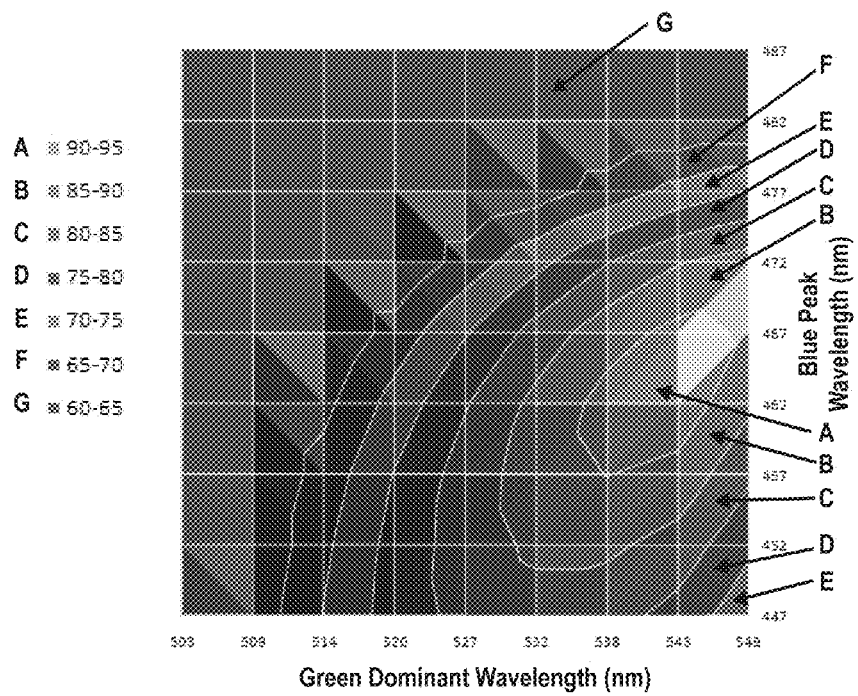
FIG._26A
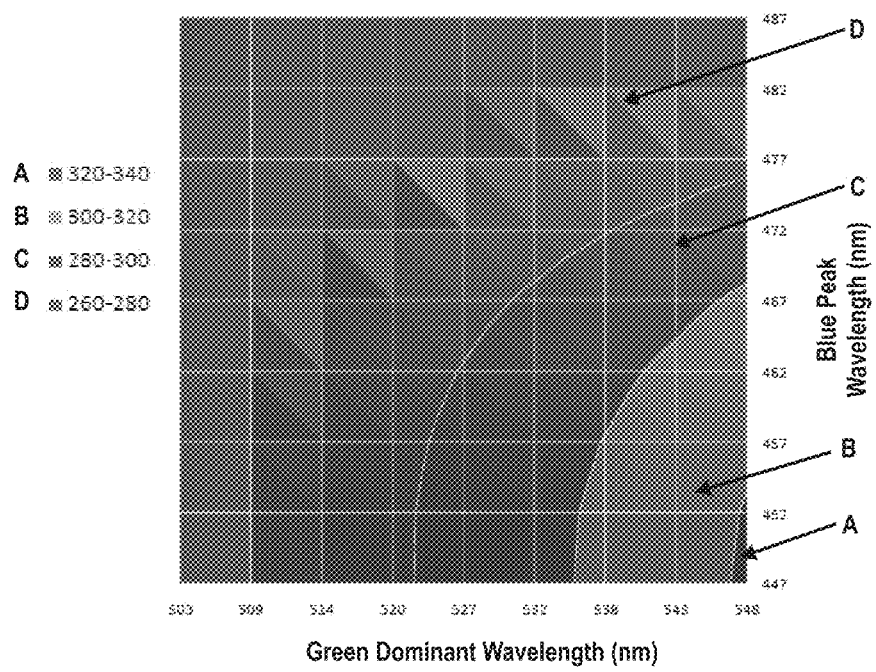
FIG._26B

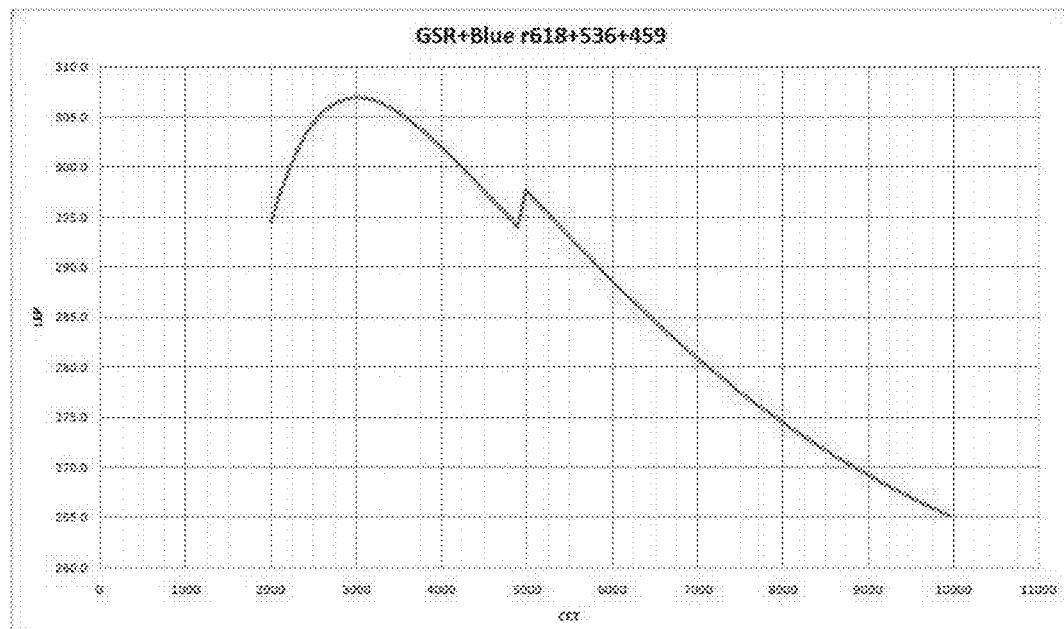
FIG._28A
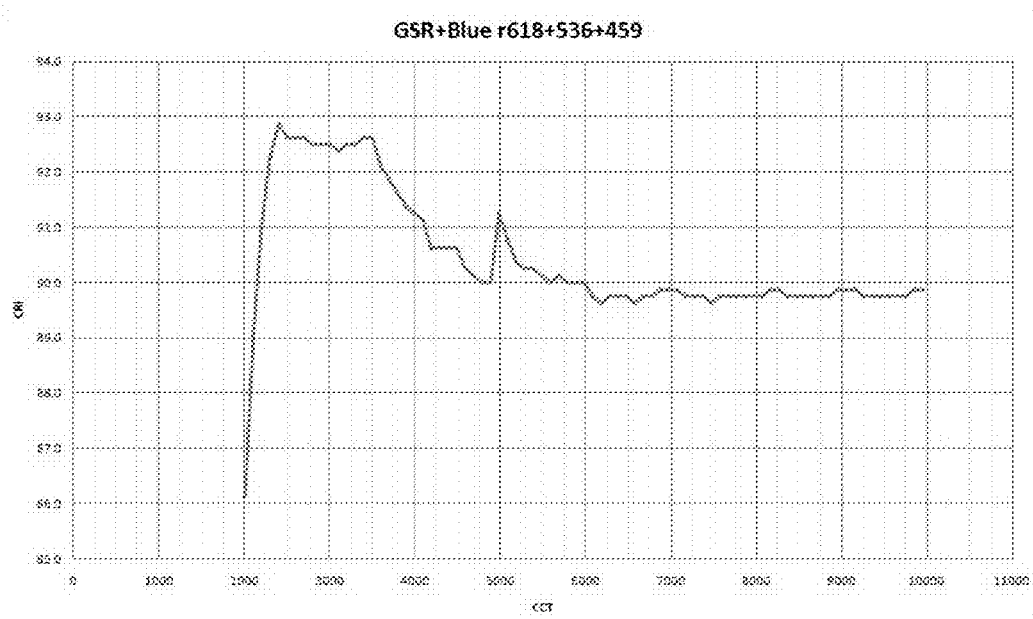
FIG._28B

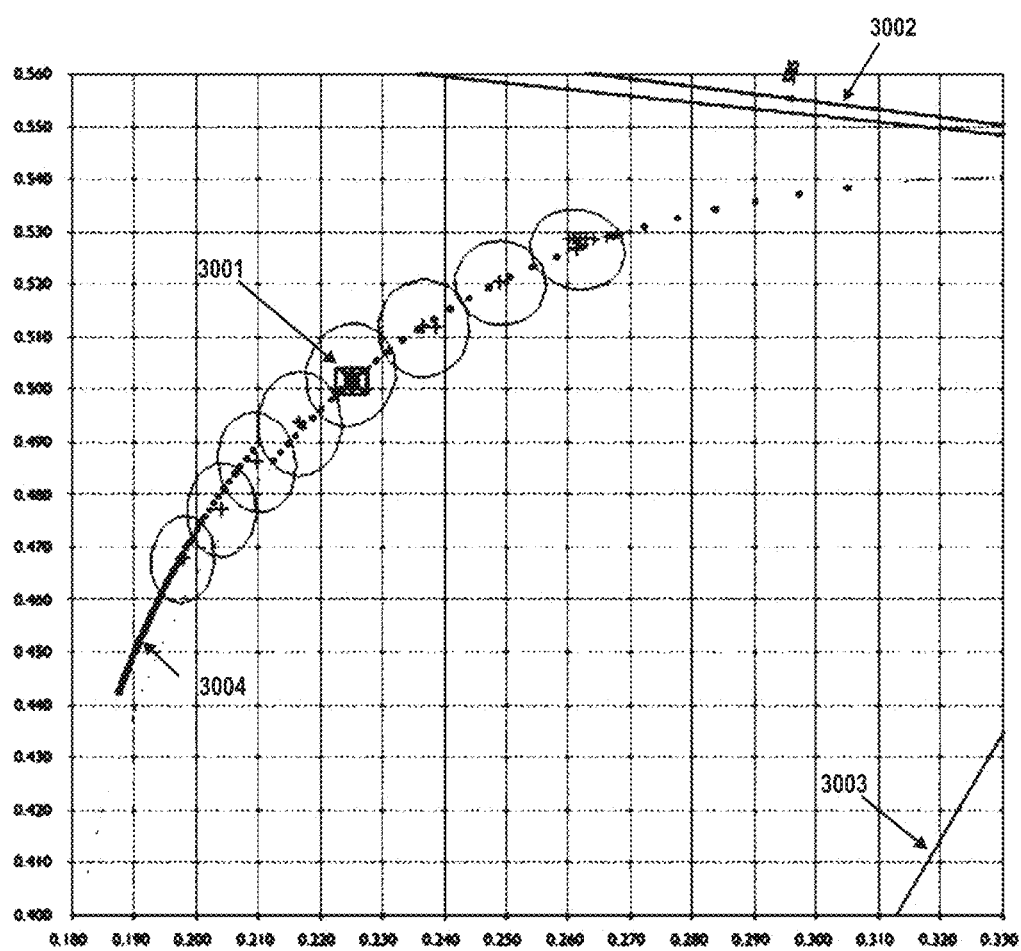
FIG._30

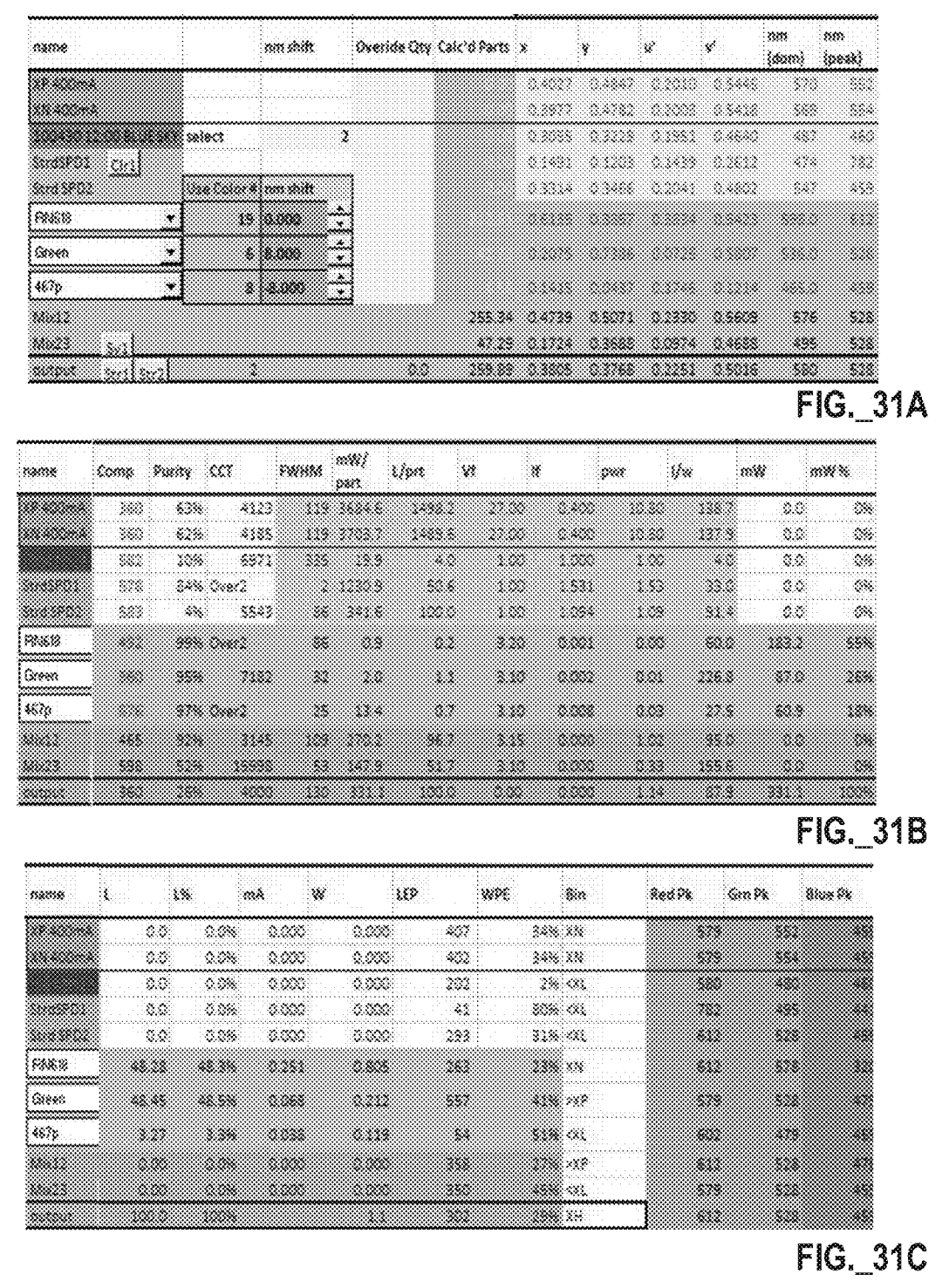

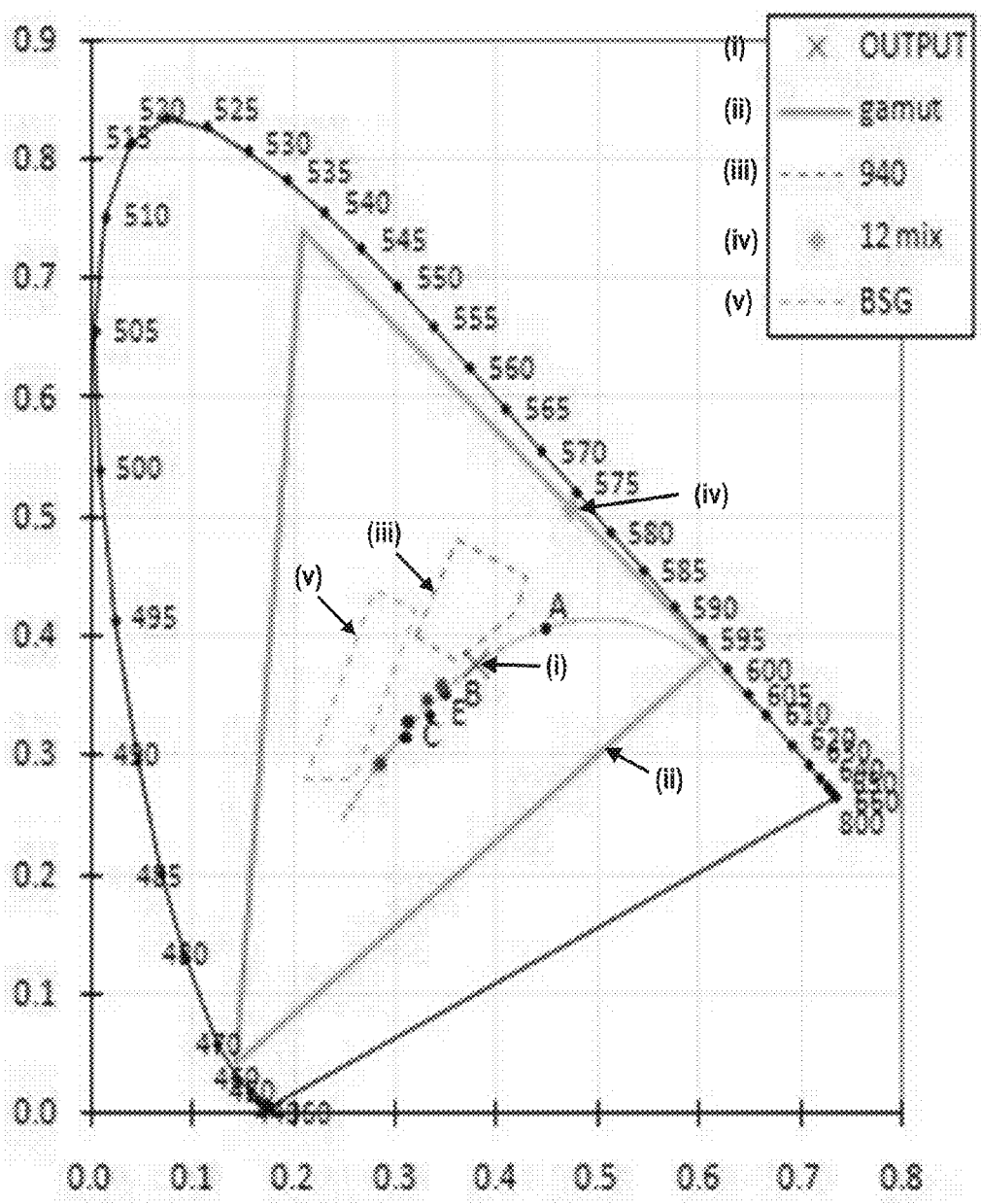
FIG._32

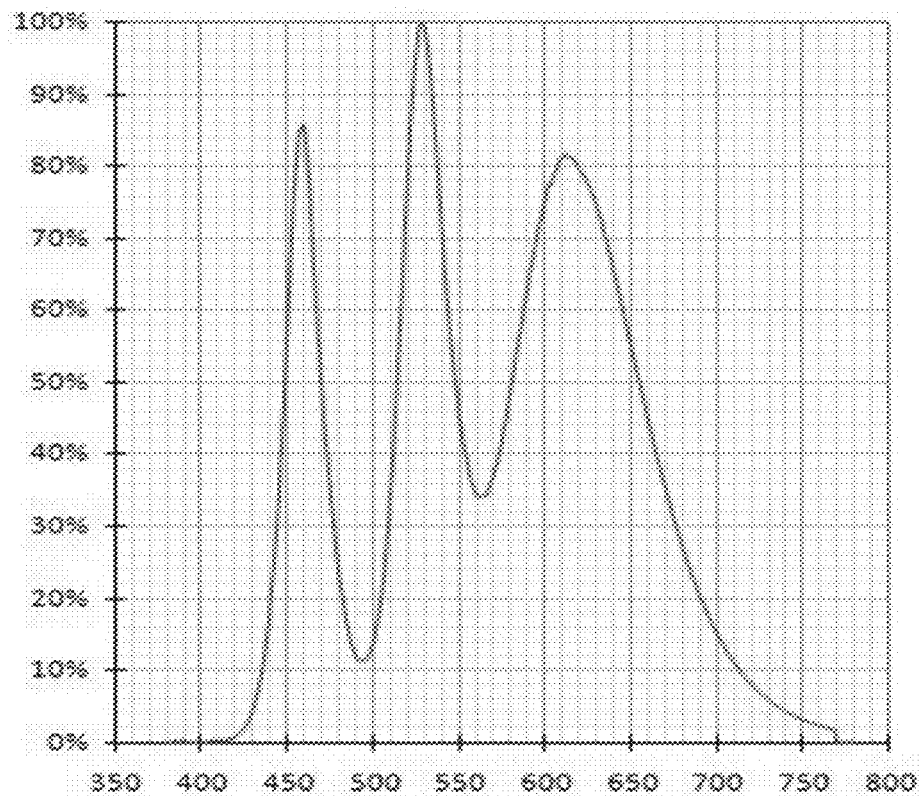
FIG._33
FIG._34
FIG._35

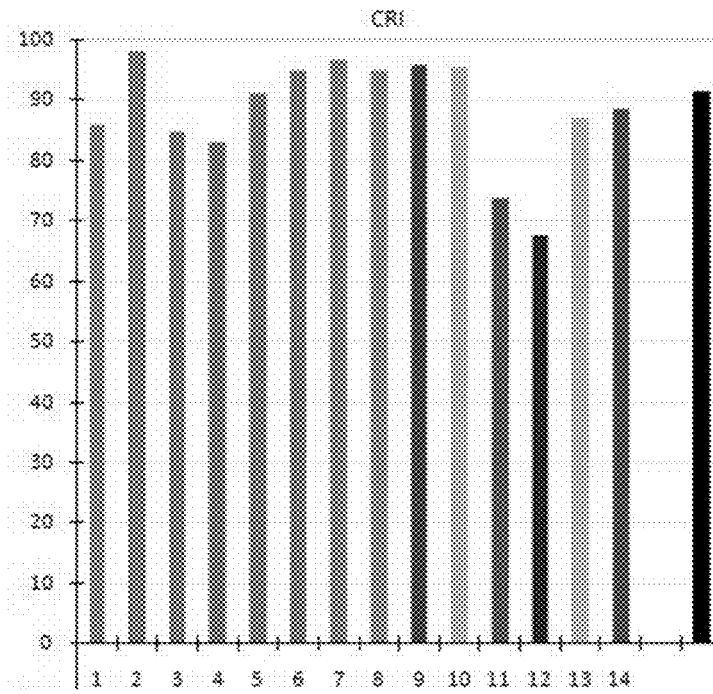
FIG._36A
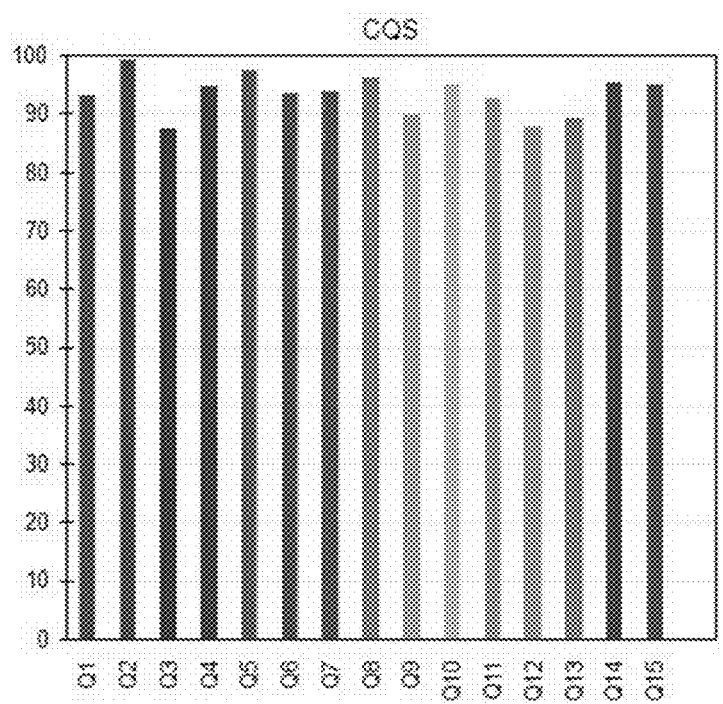
FIG._36B

| output | |
|---|---|
| CCT: | 3999 |
| Duv: | 0.000 |
| CRI Ra: | 91 |
| R(9-12): | 83 |
| R9: | 96 |
| LER (lm/W): | 302 |
| CQS | 93 |
| GAI | 55 |

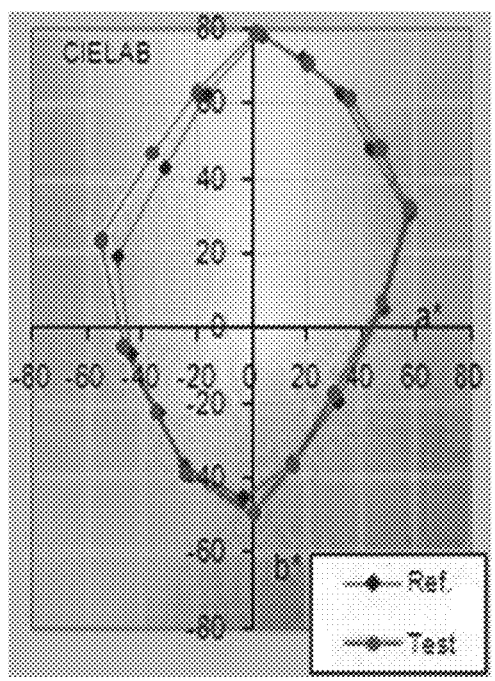
FIG._39
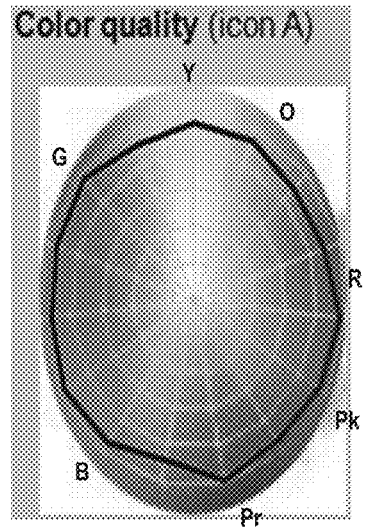
FIG._40A
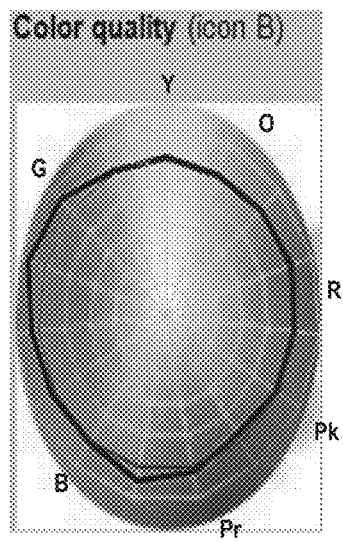
FIG._40B

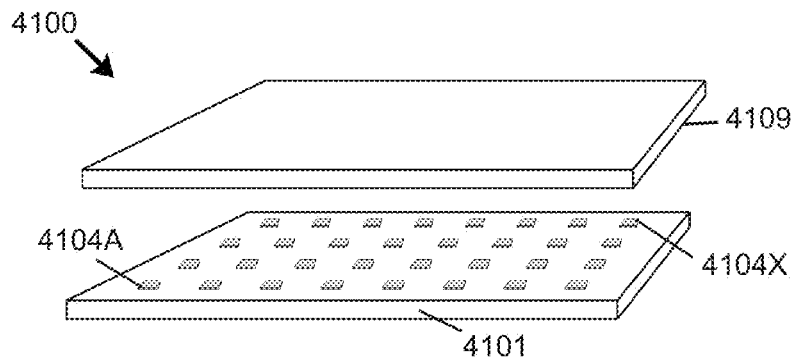
FIG._41
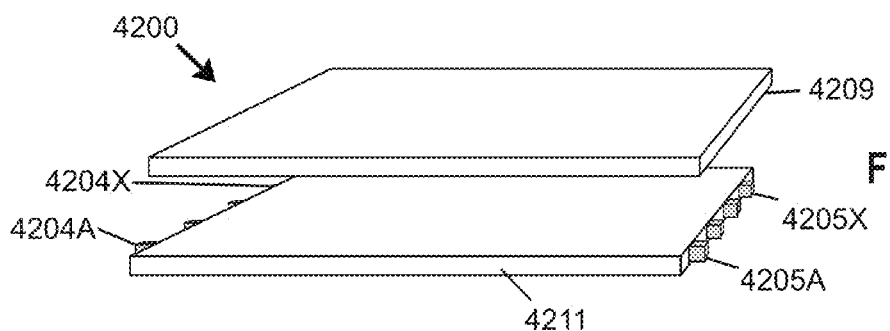
FIG._42
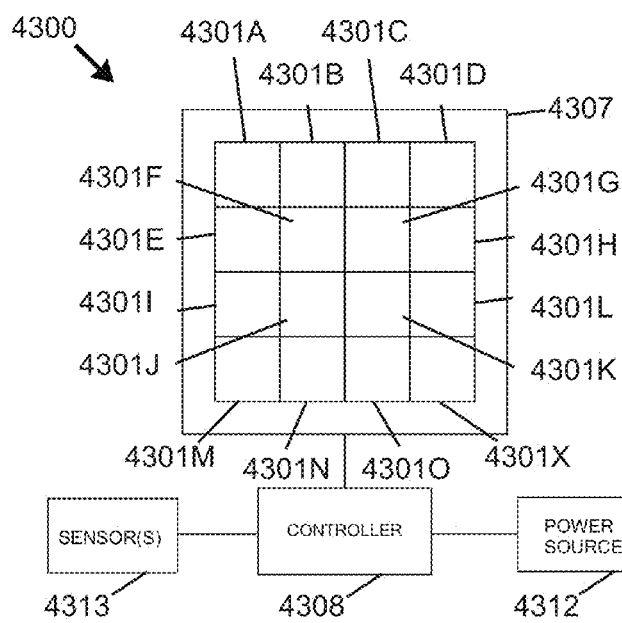
FIG._43

SOLID STATE LIGHTING DEVICE INCLUDING GREEN SHIFTED RED COMPONENT

CROSS REFERENCE TO RELATED APPLICATION

This application claims priority of U.S. Provisional Patent Application No. 61/474,169 filed on Apr. 11, 2011. The disclosure of the foregoing application is hereby incorporated by reference herein in its entirety, for all purposes.

TECHNICAL FIELD

The present invention relates to solid state lighting devices, including devices with at least one luminescent or lumiphoric materials stimulated by a solid state emitter, and methods of making and using same.

BACKGROUND

Solid state light sources may be utilized to provide colored (e.g., non-white) or white LED light (e.g., perceived as being white or near-white). White solid state emitters have been investigated as potential replacements for white incandescent lamps due to reasons including substantially increased efficiency and longevity. Longevity of solid state emitters is of particular benefit in environments where access is difficult and/or where change-out costs are extremely high.

A solid state lighting device may include, for example, at least one organic or inorganic light emitting diode ("LED") or a laser. A solid state lighting device produces light (ultraviolet, visible, or infrared) by exciting electrons across the band gap between a conduction band and a valence band of a semiconductor active (light-emitting) layer, with the electron transition generating light at a wavelength that depends on the band gap. Thus, the color (wavelength) of the light emitted by a solid state emitter depends on the materials of the active layers thereof. Solid state light sources provide potential for very high efficiency relative to conventional incandescent or fluorescent sources, but solid state light sources present significant challenges in simultaneously achieving good efficacy, good color reproduction, and color stability (e.g., with respect to variations in operating temperature).

Color reproduction is commonly measured using Color Rendering Index (CRI) or average Color Rendering Index (CRI Ra). In the calculation of the CRI, the color appearance of 14 reflective samples is simulated when illuminated by a reference illuminant and the test source. After accounting for chromatic adaptation with a Von Kries correction, the difference in color appearance $\Delta E_i$, for each sample, between the test and reference illumination, is computed in CIE 1964 W*U*V* uniform color space. It therefore provide a relative measure of the shift in surface color and brightness of an object when lit by a particular lamp. The general color rendering index CRI Ra is a modified average utilizing the first eight indices, all of which have low to moderate chromatic saturation. The CRI Ra equals 100 (a perfect score) if the color coordinates and relative brightness of a set of test colors being illuminated by the illumination system are the same as the coordinates of the same test colors being irradiated by the reference radiator. Daylight has a high CRI (Ra of approximately 100), with incandescent bulbs also being relatively close (Ra greater than 95), and fluorescent lighting being less accurate (typical Ra of 70-80).

Aspects relating to the present inventive subject matter may be better understood with reference to the 1931 CIE (Commission International de l'Eclairage) Chromaticity Diagram and/or the 1976 CIE Chromaticity Diagram, both of which are well-known and readily available to those of ordinary skill in the art. The CIE Chromaticity Diagrams map out the human color perception in terms of two CIE parameters x and y (in the case of the 1931 diagram) or u' and v' (in the case of the 1976 diagram). The 1931 CIE Chromaticity Diagram is reproduced at FIG. 1, and the 1976 CIE Chromaticity Diagram (also known as (u'v') chromaticity diagram) is reproduced at FIG. 2. The spectral colors are distributed around the edge of the outlined space, which includes all of the hues perceived by the human eye. The boundary line represents maximum saturation for the spectral colors. The 1976 CIE Chromaticity Diagram is similar to the 1931 Diagram, except that the 1976 Diagram has been modified such that similar distances on the Diagram represent similar perceived differences in color.

Since similar distances on the 1976 Diagram represent similar perceived differences in color, deviation from a point on the 1976 Diagram can be expressed in terms of the coordinates, u' and v', e.g., distance from the point=$(\Delta u'^2 + \Delta v'^2)^{1/2}$, and the hues defined by a locus of points that are each a common distance from a specified hue consist of hues that would each be perceived as differing from the specified hue to a common extent.

The chromaticity coordinates (i.e., color points) that lie along the blackbody locus obey Planck's equation: $E(\lambda) = A \lambda^{-5}/(e^{B/T} - 1)$, where E is the emission intensity, $\lambda$ is the emission wavelength, T the color temperature of the blackbody, and A and B are constants. Color coordinates that lie on or near the blackbody locus yield pleasing white light to a human observer. The 1931 CIE Diagram (FIG. 1) includes temperature listings along the blackbody locus (embodying a curved line emanating from the right corner). These temperature listings show the color path of a blackbody radiator that is caused to increase to such temperatures. As a heated object becomes incandescent, it first glows reddish, then yellowish, then white, and finally bluish. This occurs because the wavelength associated with the peak radiation of the blackbody radiator becomes progressively shorter with increased temperature, consistent with the Wien Displacement Law. Illuminants which produce light that is on or near the blackbody locus can thus be described in terms of their color temperature. As used herein, the term "white light" refers to light that is perceived as white, is within 7 MacAdam ellipses of the black body locus on a 1931 CIE chromaticity diagram, and has a CCT ranging from 2000 K to 10,000 K.

Illumination with a CRI Ra of less than 50 is very poor and only used in applications where there is no alternative for economic issues. Lights with a CRI Ra between 70 and 80 have application for general illumination where the colors of objects are not important. For some general interior illumination, a CRI Ra>80 is acceptable. A light with color coordinates within 4 MacAdam step ellipses of the Planckian locus and a CRI Ra>85 is more suitable for general illumination purposes. CRI Ra>90 is preferable and provides greater color quality.

CRI only evaluates color rendering, or color fidelity, and ignores other aspects of color quality, such as chromatic discrimination and observer preferences. The Color Quality Scale (CQS) developed by National Institute of Standards and Technology (NIST) is designed to incorporate these other aspects of color appearance and address many of the shortcomings of the CRI, particularly with regard to solid-state lighting. The method for calculating the CQS is based on modifications to the method used for the CRI. CQS uses a set of 15 Munsell samples having much higher chroma than the CRI indices, and span the entire hue circle in approximately even spacing. CQS is calculated using the CIE 1976 L*a*b (CIELAB) uniform object color space, which is more uniform than the object color space (1964 W*U*V) utilized by CRI. CQS will only penalize a lamp's score for hue shifts, lightness shifts, and reductions in chroma. Lamps that increase object chroma relative to the reference illuminant are not penalized because these positive effects are generally preferred.

Because light that is perceived as white is necessarily a blend of light of two or more colors (or wavelengths), no single light emitting diode junction has been developed that can produce white light. A representative example of a white LED lamp includes a package of a blue LED chip (e.g., made of InGaN and/or GaN), coated with a phosphor (typically YAG:Ce or BOSE). Blue LEDs made from InGaN exhibit high efficiency (e.g., external quantum efficiency as high as 70%). In a blue LED/yellow phosphor lamp, a blue LED chip may produce an emission with a wavelength of about 450 nm, and the phosphor may produce yellow fluorescence with a peak wavelength of about 550 nm upon receipt of the blue emission. Part of the blue ray emitted from the blue LED chip passes through the phosphor, while another portion of the blue ray is absorbed by the phosphor, which becomes excited and emits a yellow ray. The viewer perceives an emitted mixture of blue and yellow light (sometimes termed 'blue shifted yellow' or 'BSY' light) as white light. Such light is typically perceived as cool white in color. A BSY device typically exhibits good efficacy but only medium CRI Ra (e.g., between 60 and 75), or very good CRI Ra and low efficacy. Cool white LEDs have a color temperature of approximately 5000K, which is generally not visually comfortable for general illumination, but may be desirable for the illumination of commercial goods or advertising and printed materials.

Various methods exist to enhance cool white light to increase its warmth. Acceptable color temperatures for indoor use are typically in a range of from 2700-3500K; however, warm white LED devices may be on the order of only half as efficient as cool white LED devices. To promote warm white colors, an orange phosphor or a combination of a red phosphor (e.g., $CaAlSiN_3$ ('CASN') based phosphor) and yellow phosphor (e.g., Ce:YAG or YAG:Ce) can be used in conjunction with a blue LED. Cool white emissions from a BSY element (including a blue emitter and yellow phosphor) may also be supplemented with a red LED (with such combination being referred to hereinafter as "BSY+R"), such as disclosed by U.S. Pat. No. 7,095,056 to Vitta, et al. and U.S. Pat. No. 7,213,940 to Negley et al., to provide warmer light. While such devices permit the correlative color temperature (CCT) to be changed, the CRI of such devices is reduced significantly at higher color temperatures.

Use of red and blue LEDs in the same device entails additional problems, since phosphide-based red LEDs exhibit substantially different changes in intensity and/or chromaticity than nitride-based blue LEDs with respect to changes in device operating temperature. That is, red LEDs include active regions typically formed of Group III phosphide (e.g., (Al,In,Ga)P) material, in contrast to blue LEDs, which include active regions typically are formed of Group III nitride materials (e.g., represented as (Al,In,Ga)N, including but not limited to InGaN). Group III phosphide materials typically exhibit substantially less temperature stability than Group III nitride materials. Due to their chemistry, red LEDs lose a significant portion (e.g., 40-50%) of their efficacy when operating at 85° C. versus operating at a cold condition (i.e., room temperature or less). When red and blue LEDs are in conductive thermal communication with one another (e.g., affixed to a common substrate or in thermal communication with a common heatsink), heat emanating from the blue LEDs will increase the temperature of the red LEDs. To maintain a relatively constant color point utilizing a device including a Group III-nitride-based blue LED (e.g., as part of a BSY emitter) and Group III-phosphide based red LED, current to the Group III-phosphide based red LED emitter must be altered as temperature increases because of the different temperature responses of the blue and red LED. Such current reduction results in reduction in total flux from the combination of emitters at a desired color point, limiting utility of such a device.

As an alternative to stimulating a yellow phosphor with a blue LED, another method for generating white emissions involves combined use of red, green, and blue ("RGB") light emitting diodes in a single package. The combined spectral output of the red, green, and blue emitters may be perceived by a user as white light. Each "pure color" red, green, and blue diode typically has a full-width half-maximum (FWHM) wavelength range of from about 15 nm to about 30 nm. Due to the narrow FWHM values of these LEDs (particularly the green and red LEDs), aggregate emissions from the red, green, and blue LEDs exhibit very low color rendering in general illumination applications. Moreover, use of AlInGaP-based red LEDs entails the same limitations as noted above.

Another example of a known white LED lamp includes one or more ultraviolet (UV)-based LEDs combined with red, green, and blue phosphors. Such lamps typically provide reasonably high color rendering, but exhibit low efficacy due to substantial Stokes shift losses.

The therefore art continues to seek improved solid state lighting devices that address one or more limitations inherent to conventional devices. For example, it would be desirable to provide solid state lighting devices capable of providing white light in a wider variety of applications, with greater energy efficiency, with improved color rendering index over a range of correlative color temperatures, with improved efficacy, with improved color stability at high flux, and/or with longer duration of service.

SUMMARY

The present invention relates in various aspects to lighting devices including at least one element with at least one first solid state light emitter comprising a dominant wavelength in a range of from 500 nm to 570 nm (e.g., encompassing the green spectral region) and at least one first lumiphor arranged to receive emissions from the at least one first solid state light emitter and responsively generate lumiphor emissions comprising a peak wavelength of at least about 591 nm (e.g., encompassing the red spectral region, optionally bounded at an upper wavelength range at 700 nm), with other novel features and/or elements.

In one aspect, the invention relates to a lighting device comprising: at least one first solid state light emitter comprising a dominant wavelength in a range of from 500 nm to 570 nm; at least one second solid state light emitter comprising a peak wavelength in a range of from 430 nm to 480 nm; and at least one first lumiphor arranged to receive emissions from the at least one first solid state light emitter and responsively generate lumiphor emissions comprising a peak wavelength of at least about 591 nm; wherein the lighting device is arranged to output combined emissions including at least a portion of light emissions generated by each of the at least one first solid state light emitter, the at least one second solid state light emitter, and the at least one first lumiphor; and wherein the lighting device is devoid of any lumiphor (a) comprising a peak wavelength in a range of from 555 nm to 590 nm, and (b) being arranged to receive emissions from the second solid state light emitter.

In another aspect, the invention relates to a lighting device comprising: at least one first solid state light emitter comprising a dominant wavelength in a range of from 500 nm to 570 nm; at least one second solid state light emitter comprising a peak wavelength in a range of from 430 nm to 480 nm; and at least one first lumiphor arranged to receive emissions from the at least one first solid state light emitter and responsively generate lumiphor emissions comprising a peak wavelength of at least about 591 nm; wherein the at least one first lumiphor is spatially segregated from the first solid state light emitter; wherein the lighting device is arranged to output combined emissions including at least a portion of light emissions generated by each of the at least one first solid state light emitter, the at least one second solid state light emitter, and the at least one first lumiphor.

In a further aspect, the invention relates to a lighting device comprising: a first solid state emitter comprising a first dominant wavelength; a second solid state light emitter comprising a second dominant wavelength that differs from the first dominant wavelength by at least 20 nm; and a lumiphor arranged to receive emissions from one or more of (i) the at least one first solid state light emitter and (ii) the at least one second solid state light emitter, and responsively generate lumiphor emissions; wherein the lighting device is arranged to output combined emissions including at least a portion of light emissions generated by each of the first solid state light emitter, the second solid state light emitter, and the lumiphor; wherein the combined emissions embody at least one of (a) a color rendering index (CRI Ra) value of at least 85 over a correlative color temperature (CCT) range of from 5000K to 3000K, and (b) a color quality scale (CQS) value of at least 85 over a correlative color temperature (CCT) range of from 5000K to 3000K. Such lighting device may be devoid of any lumiphor (a) comprising a peak wavelength in a range of from 555 nm to 590 nm, and (b) being arranged to receive emissions from a solid state light emitter comprising a peak wavelength in a range of from 430 nm to 480 nm.

In another aspect, the invention relates to a lighting device comprising: at least one first solid state light emitter comprising a dominant wavelength in a range of from 500 nm to 570 nm; at least one first lumiphor arranged to receive emissions from the at least one first solid state light emitter and responsively generate lumiphor emissions comprising a peak wavelength in a range of from 591 nm to 700 nm; at least one second solid state light emitter comprising a peak wavelength in a range of from 430 nm to 480 nm; at least one second lumiphor arranged to receive emissions from the at least one second solid state light emitter and responsively generate lumiphor emissions comprising a peak wavelength in a range of from 591 nm to 700 nm; at least one third solid state light emitter comprising a peak wavelength in a range of from 430 nm to 480 nm; and at least one third lumiphor arranged to receive emissions from the at least one third solid state light emitter and responsively generate lumiphor emissions comprising a peak wavelength in a range of from 500 nm to 570 nm.

A further aspect of the invention relates to a lighting device comprising: at least one first solid state light emitter comprising a dominant wavelength in a range of from 500 nm to 570 nm; at least one first lumiphor arranged to receive emissions from the at least one first solid state light emitter and responsively generate lumiphor emissions comprising a peak wavelength of at least about 591 nm; at least one second solid state light emitter comprising a peak wavelength in a range of from 430 nm to 470 nm; and at least one third solid state light emitter comprising a peak wavelength in a range of from 470 to 500 nm; wherein the lighting device is arranged to output combined emissions including at least a portion of light emissions generated by each of the at least one first solid state light emitter, the at least one first lumiphor, the at least one second solid state light emitter, and the at least one third solid state light emitter.

A still further aspect of the invention relates to a lighting device comprising: at least one first solid state light emitter comprising a dominant wavelength in a range of from 500 nm to 570 nm; at least one first lumiphor arranged to receive emissions from the at least one first solid state light emitter and responsively generate lumiphor emissions comprising a peak wavelength in a range of from 591 nm to 700 nm; at least one second solid state light emitter comprising a peak wavelength in a range of from 430 nm to 480 nm; at least one third solid state light emitter comprising a peak wavelength in a range of from 500 nm to 570 nm; and at least one fourth solid state light emitter comprising a peak wavelength in a range of from 591 to 700 nm.

In another aspect, any of the foregoing aspects, and/or various separate aspects and features as described herein, may be combined for additional advantage.

Other aspects, features and embodiments of the invention will be more fully apparent from the ensuing disclosure and appended claims.

BRIEF DESCRIPTION OF THE DRAWINGS

FIG. 1 is a 1931 CIE Chromaticity Diagram including representation of the blackbody locus.

FIG. 2 is a 1976 CIE Chromaticity Diagram.

FIG. 3A is a top plan schematic view of a lighting device including two solid state emitters.

FIG. 3B is a top plan schematic view of a lighting device including two solid state emitters.

FIG. 3C is a top plan schematic view of a lighting device including three solid state emitters.

FIG. 3D is a top plan schematic view of a lighting device including three solid state emitters.

FIG. 3E is a top plan schematic view of a lighting device including three solid state emitters.

FIG. 3F is a top plan schematic view of a lighting device including four solid state emitters.

FIG. 3G is a top plan schematic view of a lighting device including four solid state emitters.

FIG. 3H is a top plan schematic view of a lighting device including four solid state emitters.

FIG. 3I is a top plan schematic view of a lighting device including three solid state emitters.

FIG. 4 is a side cross-sectional view of at least a portion of a lighting device including multiple solid state emitters arranged in a solid state emitter package.

FIG. 5A is a side cross-sectional schematic view of a portion of a solid state lighting device including multiple solid state emitters and at least one lumiphor dispersed in an encapsulant material disposed over the multiple solid state emitters.

FIG. 5B is a side cross-sectional schematic view of a portion of a solid state lighting device including multiple solid state emitters and at least one lumiphor in one or more layers spatially separated from the multiple solid state emitters.

FIG. 5C is a side cross-sectional schematic view of a portion of a solid state lighting device including multiple solid state emitters, with at least one solid state emitter having a lumiphor material individually applied or coated over at least one surface thereof.

FIG. 5D is a side cross-sectional schematic view of a portion of a solid state lighting device including solid state light emitters arranged in different reflectors supported by a common substrate, with at least one lumiphor being spatially separated from each solid state light emitter.

FIG. 5E is a side cross-sectional schematic view of a portion of a solid state lighting device including solid state light emitters arranged in a single reflector.

FIG. 6 is a schematic view of a lighting device including multiple emitters controllable by a control circuit.

FIG. 7 is a spectral power distribution plot of relative spectral power (percent) versus wavelength resulting from a simulation of a green LED arranged to stimulate emissions from a red phosphor at a correlative color temperature (CCT) of 3398 K.

FIG. 8 is a table summarizing characteristics of the green LED/red phosphor combination utilized in the simulation for which the spectral power distribution of FIG. 7 was obtained.

FIG. 9 is a 1931 CIE Chromaticity Diagram over which output of the green shifted red simulation described in connection with FIGS. 7-8 (at a CCT of 4000 K) have been superimposed, with comparison of the color space described in U.S. Pat. No. 7,213,940.

FIG. 10 is a plot of relative spectral power (percent) versus wavelength resulting from a simulation of a green LED arranged to stimulate emissions from a red phosphor, in combination with a blue LED, at a CCT of 3398 K.

FIG. 11 is a table summarizing simulation results including CRI performance and characteristics of a green LED arranged to stimulate emissions from a red phosphor, in combination with a blue LED, over eight different correlative color temperatures ranging from 2725K to 6532K.

FIG. 12 is a plot of relative spectral power (percent) versus wavelength resulting from a simulation of a green LED arranged to stimulate emissions from a red phosphor, in combination with a blue LED, at a CCT of 4000 K.

FIG. 13A is a bar chart embodying Color Rendering Index (CRI) performance for a simulation including a green LED arranged to stimulate emissions from a red phosphor, in combination with a blue LED, at a CCT of 4000 K.

FIG. 13B is a bar chart embodying Color Quality Scale (CQS) performance for a simulation including a green LED arranged to stimulate emissions from a red phosphor, in combination with a blue LED, at a CCT of 4000 K.

FIGS. 14A-14C provide tabulated simulation parameters and results for a simulation including a green LED arranged to stimulate emissions from a red phosphor, in combination with a blue LED.

FIG. 15 is a plot of relative spectral power versus wavelength for a simulation of a comparative white light emitting device including a blue LED arranged to stimulate emissions from a yellow phosphor, in combination with a red LED (resulting in blue shifted yellow plus red light or "BSY+R").

FIG. 16 is plot of relative spectral power versus wavelength for white light emitting device including a green LED arranged to stimulate emissions from a red phosphor, in combination with a blue LED (resulting in green shifted red plus blue light or "GSR+B"), according to one embodiment of the invention.

FIG. 17 is a table comparing selected results of the simulations described in connection with FIGS. 15 and 16.

FIG. 18 is a plot of CCy versus CCx for various GSR lighting devices (green LED arranged to stimulate red phosphor) constructed by applicants showing the effect of varying loading of red phosphor on a green LED.

FIG. 18A is a plot of relative spectral power versus wavelength for the GSR lighting device identified with label "F18A" in FIG. 18.

FIG. 18B is a plot of relative spectral power versus wavelength for another GSR lighting device identified with label "F18B" in FIG. 18.

FIG. 18C is a plot of relative spectral power versus wavelength for another GSR lighting device identified with label "F18C" in FIG. 18.

FIG. 19 is a plot of Lumen Equivalent Ratio (LER) (in lumens/Watt-optical) versus CCx comparing results of simulations of BSY (blue shifted yellow, including blue LED arranged to stimulate yellow phosphor) devices at different phosphor loadings versus results of simulations of GSR (green shifted yellow, including a green LED arranged to stimulate red phosphor) devices at different phosphor loadings, with larger sized indicators provided for phosphor loadings required to attain 2700K for a BSY device in combination with a red LED and for a GSR device in combination with a blue LED.

FIG. 20 is a plot of Stokes' Shift (%) versus CCx comparing results of simulations of BSY (blue shifted yellow, including blue LED arranged to stimulate yellow phosphor) devices at different phosphor loadings versus results of simulations of GSR (green shifted yellow, including green LED arranged to stimulate red phosphor) devices at different phosphor loadings, with larger sized indicators provided for phosphor loadings required to attain 2700K for a BSY device in combination with a red LED and for a GSR device in combination with a blue LED.

FIG. 21 is a plot of CRI versus blue led peak wavelength (nm) for nine simulated GSR+B lighting devices at 4000K, with each device containing a different green led (with dominant wavelengths ranging from 503 nm to 548 nm, respectively), a blue led, and a BOSE red phosphor.

FIG. 23 is a plot of CRI versus blue led peak wavelength (nm) for nine simulated GSR+B lighting devices at 4000K, with each device containing a different green led (with dominant wavelengths ranging from 503 nm to 548 nm, respectively), a blue led, and a nitride 598 red phosphor.

FIG. 25A is a plot of CRI Ra for a modeled GSR+B lighting device at 4000K including a nitride red 598 nm (dominant wavelength) phosphor, as a function of variable blue LED wavelength (y-axis), and variable green LED wavelength (x-axis).

FIG. 25B is a plot of LEP luminous efficacy (lumens/watt optical) for the modeled GSR+B lighting device of FIG. 25A at 4000K.

FIG. 26A is a plot of CRI Ra for a modeled GSR+B lighting device at 5000K including a nitride red 598 nm (dominant wavelength) phosphor, as a function of variable blue LED wavelength (y-axis), and variable green LED wavelength (x-axis).

FIG. 26B is a plot of LEP luminous efficacy (lumens/watt optical) for the modeled GSR+B lighting device of FIG. 26A at 5000K.

FIG. 28A is a plot of LEP luminous efficiency (lumens/watt optical) versus correlative color temperature (CCT) for a modeled GSR+B lighting device including a nitride red 598 nm (dominant wavelength) phosphor, a green 536 nm (dominant wavelength) LED, and a blue 459 nm (peak wavelength) LED, for CCT values from 2000K to 10000K.

FIG. 28B is a plot of CRI versus correlative color temperature (CCT) for the modeled GSR+B lighting device of FIG. 28A, for CCT values from 2000K to 10000K.

FIG. 30 is a plot of u', v' chromaticity coordinates for the modeled lighting device of FIGS. 28A, 28B, and 29 at 3000K superimposed over a portion of a (CIE 1976) chromaticity diagram.

FIGS. 31A-31C provide tabulated simulation parameters and results for a simulation including a GSR+B lighting device including a nitride red 618 nm (dominant wavelength) phosphor, a green 536 nm (dominant wavelength) LED, and a blue 459 nm (peak wavelength) LED, for CCT of 4000K.

FIG. 32 is a 1931 CIE Chromaticity Diagram over which output of the GSR+B device simulation described in connection with FIGS. 31A-31O (at a CCT of 4000 K) have been superimposed, with comparison of the color space described in U.S. Pat. No. 7,213,940.

FIG. 33 is a plot of relative spectral power (percent) versus wavelength resulting from the GSR+B device simulation described in connection with FIGS. 31A-31C at a CCT of 4000K.

FIG. 34 is a table identifying LED output values resulting from the GSR+B device simulation described in connection with FIGS. 31A-31O at a CCT of 4000K.

FIG. 35 is a table identifying fixture output values for the resulting from the GSR+B device simulation described in connection with FIGS. 31A-31O at a CCT of 4000K.

FIG. 36A is a bar chart embodying CRI performance for the GSR+B device simulation described in connection with FIGS. 31A-31O at a CCT of 4000K.

FIG. 36B is a bar chart embodying CQS performance for the GSR+B device simulation described in connection with FIGS. 31A-31O at a CCT of 4000K.

FIG. 39 is a CIELAB (CIEL*a*b*) diagram (generated by NIST Colorview software) depicting CQS performance for the GSR+B device simulation described in connection with FIGS. 31A-31C at a CCT of 4000K, with comparison between the fifteen CQS reference color samples and test values for these fifteen samples as obtained from the simulation.

FIGS. 40A-40B are color quality diagrams for the GSR+B device simulation described in connection with FIGS. 31A-31C at a CCT of 4000K.

FIG. 41 is a perspective assembly view of a display device including direct backlight including a two-dimensional array of light emitting devices as described herein arranged to backlight a display (e.g., LCD) panel.

FIG. 42 is a perspective assembly view of a display device including a waveguide arranged to be lit along edges thereof by multiple light emitting devices as described herein, with the waveguide arranged to backlight a display (e.g., LCD) panel.

FIG. 43 is a schematic view of an array of light emitting devices as described herein arranged to be controlled with a control element.

DETAILED DESCRIPTION

Figure 22:
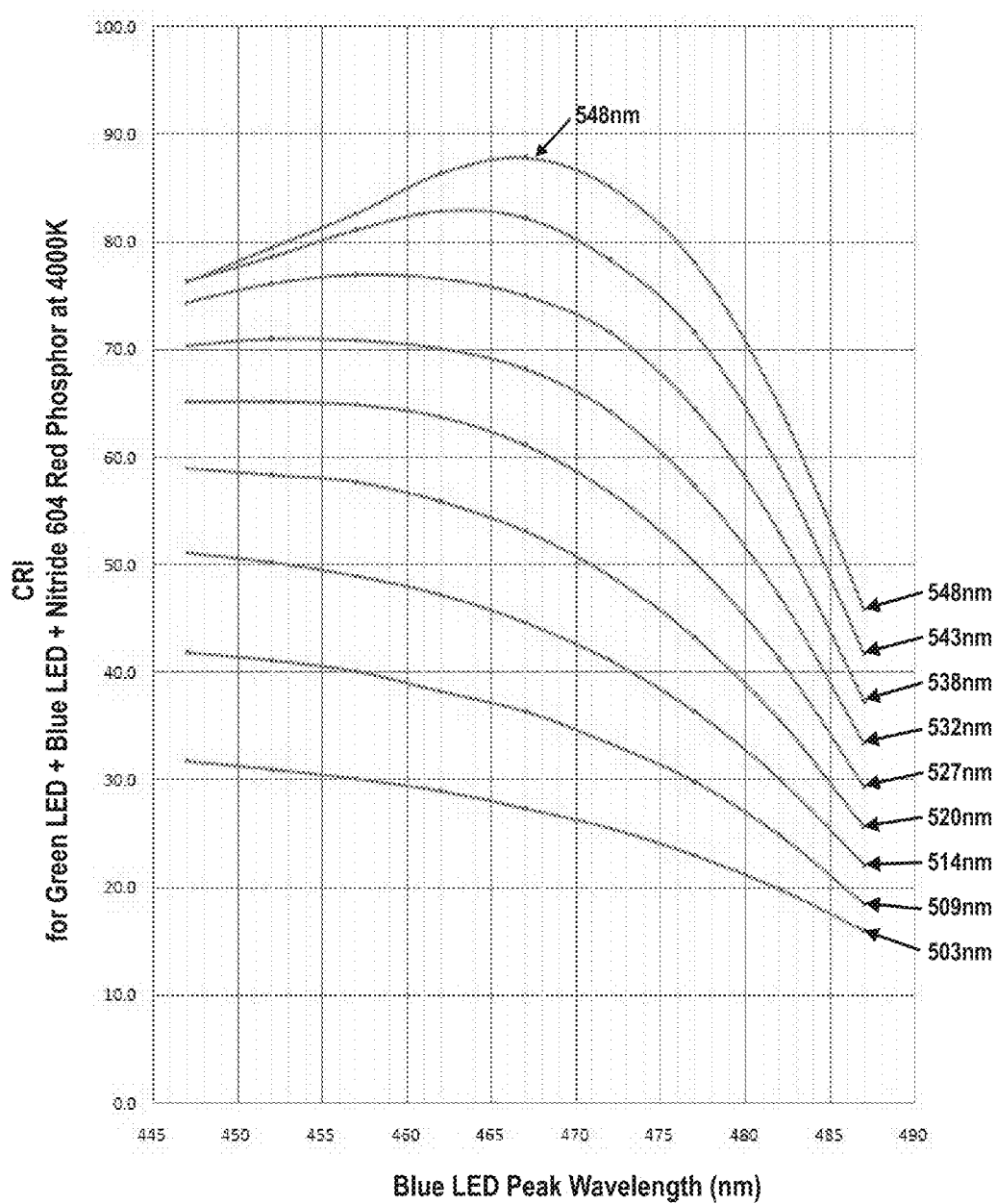
FIG. 22 is a plot of CRI versus blue led peak wavelength (nm) for nine simulated GSR+B lighting devices at 4000K, with each device containing a different green led (with dominant wavelengths ranging from 503 nm to 548 nm, respectively), a blue led, and a nitride red 604 nm phosphor.

The present invention relates in various aspects to lighting devices including at least one green shifted red element, with other novel features and/or elements. The phrase "green shifted red" (or "GSR") as used herein refers to use of at least one first solid state light emitter having a peak wavelength in a range of from 500 nm to 570 nm encompassing the green spectral region (or in any suitable subrange, such as 500-560 nm, 500-554 nm, 500-550 nm, 500-540 nm, 505-560 nm, 505-554 nm, 505-540 nm, 510-570 nm, 510-560 nm, 510-554 nm, or 510-540 nm), and at least one first lumiphor arranged to receive emissions from the at least one first solid state light emitter and responsively generate lumiphor emissions having peak wavelength in a range of at least about 591 nm encompassing the red spectral region (optionally bounded at an upper wavelength range of 700 nm or 750 nm, or in any suitable subrange, such as 591-750 nm, 591-730 nm, 591-710 nm, 591-700 nm, 591-690 nm, 591-680 nm, 591-670 nm, 591-660 nm, 600-750 nm, 600-700 nm, 600-690 nm, 600-680 nm, 600-670 nm, 600-660 nm, 610-700 nm, 610-690 nm, 610-680 nm, 610-670 nm, 610-660 nm, 620-700 nm, 620-690 nm, 620-680 nm, 620-670 nm, or 620-660 nm).

In certain embodiments, one or more GSR elements are used in combination with one or more blue solid state light emitters, with the resulting combination being termed "green shifted red plus blue" or "GSR+B."

GSR+B light emitting devices provide the potential for high efficiency, comparable to that attainable with BSY+R light emitting devices, due to reduced Stokes shift losses. Stokes shift is the difference (in wavelength or frequency units) between positions of the band maxima of the absorption and emission spectra of the same electronic transition. When a system (e.g., molecule or atom) absorbs a photon, it gains energy and enters an excited state; the system can relax by emit a photon, thus losing energy. When the emitted photon has less energy than the absorbed photon, such energy difference represents the Stokes shift. Because the difference between the band maxima of the absorption and emission spectra of a yellow phosphor stimulated by a blue LED (e.g., in a BSY element) is greater than the difference between the band maxima of the absorption and emission spectra of a red phosphor stimulated by a green LED (e.g., in a GSR element), a GSR element embodies substantially less Stokes shift losses than a BSY element. Although years of development have yielded highly efficient blue LEDs and yellow phosphors with high conversion efficiencies, it is expected that continued development will result in similar enhancements of green LED efficiency and red phosphors with greater conversion efficiencies.

Another benefit of GSR+B light emitting devices compared to BSY+R light emitting devices is that a green and blue solid state emitters of a GSR+B device embody nitride-based (e.g., InGaN) active regions, thereby eliminating the phosphide-based (e.g., AlInGaP) red LEDs with their attendant drawbacks including dramatic variations in intensity and/or chromaticity with respect to operating temperature. Nitride-based blue and green solid state light emitters exhibit more stable intensity and chromaticity with respect to temperature, thereby permitting a GSR+B device to be operated at high intensity without requiring color compensating circuits or color compensating schemes as may be necessary with high flux BSY+R devices.

A further benefit of GSR+B devices is that they are capable of average color rendering index (CRI Ra) and/or color quality scale (CQS) values on the order of 90 or greater over a range of corrected color temperatures from 5000K to 2700K. In contrast, CRI Ra values for conventional BSY+R devices tend to decline substantially for color temperatures in excess of 3000K.

The mixed color point of green LEDs plus red phosphors are close to the CIE31 locus edge. The color can be adjusted to any point from the excitation green color to almost the pure red of the phosphor with the color being very saturated. Accordingly, GSR combined emitters may provide highly saturated color in the green gap, yellow-green, yellow, and orange color spectra, taking advantage of the excellent external quantum efficiency of InGaN-based LEDs.

In certain embodiments, red lumiphors may include phosphors such as BOSE red O6040 (Internatix, Fremont, Calif.), which comprises Eu doped silicates with peak emissions of 609 nm, and an excitation range of from 200 nm to 580 nm. In other embodiments, a O5742 phosphor (Internatix) may be used. Other lumiphors may be used in further embodiments.

In certain embodiments, green solid state emitters may include InGaN-based devices such as Cree® XR-E LEDs (Cree, Inc., Durham, N.C.). Solid state emitters of other colors, models, and manufacturers may be used.

Various devices as described herein may embody supplemental emitters and/or lumiphors of various colors or wavelength ranges, such as the following:
  Blue (preferably 430 nm to 480 nm; optionally 430-475 nm, 440-475 nm, 450-475 nm, or any suitable sub-range of 430-480 nm);
  Cyan (preferably 481 nm to 499 nm);
  Green (preferably 500 nm to 570 nm, optionally including any suitable sub-range as articulated previously herein);
  Yellow (preferably 571 to 590 nm); and
  Red (preferably 591 to 750 nm, including an optional orange sub-range (preferably 591 to 620 nm), and/or any suitable sub-range as articulated previously herein).
Other suitable intermediate colors and wavelength ranges or sub-ranges may be used.

In various embodiments, a solid state lighting device including one or more GSR+B light emitting elements is devoid of any lumiphor (a) having a peak wavelength in a range of from 555 nm to 590 nm (encompassing yellow), and (b) being arranged to receive emissions from a solid state light emitter having a peak wavelength in a range of from 430 nm to 480 nm (encompassing blue). Omission of a blue solid state emitter-yellow lumiphor combination reduces Stokes shift losses in the resulting device.

Unless otherwise defined, terms (including technical and scientific terms) used herein should be construed to have the same meaning as commonly understood by one of ordinary skill in the art to which this invention belongs. It will be further understood that terms used herein should be interpreted as having a meaning that is consistent with their meaning in the context of this specification and the relevant art, and should not be interpreted in an idealized or overly formal sense unless expressly so defined herein.

Unless the absence of one or more elements is specifically recited, the terms "comprising," "including," and "having" as used herein should be interpreted as open-ended terms that do not preclude the presence of one or more elements.

The terms "electrically activated emitter" and "emitter" as used herein refers to any device capable of producing visible or near visible (e.g., from infrared to ultraviolet) wavelength radiation, including but not limited to, xenon lamps, mercury lamps, sodium lamps, incandescent lamps, and solid state emitters, including diodes (LEDs), organic light emitting diodes (OLEDs), and lasers.

The terms "solid state light emitter" or "solid state emitter" may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials.

Solid state light emitting devices according to embodiments of the invention may include III-V nitride (e.g., gallium nitride) based LEDs or lasers fabricated on a silicon carbide substrate or a sapphire substrate such as those devices manufactured and sold by Cree, Inc. of Durham, N.C. Such LEDs and/or lasers may be configured to operate such that light emission occurs through the substrate in a so-called "flip chip" orientation. Such LEDs and/or lasers may also be devoid of substrates (e.g., following substrate removal).

Solid state light emitters may be used individually or in combination with one or more lumiphoric materials (e.g., phosphors, scintillators, lumiphoric inks) and/or optical elements to generate light at a peak wavelength, or of at least one desired perceived color (including combinations of colors that may be perceived as white). Inclusion of lumiphoric (also called 'luminescent') materials in lighting devices as described herein may be accomplished by direct coating on solid state light emitter, adding such materials to encapsulants, adding such materials to lenses, by embedding or dispersing such materials within lumiphor support elements, and/or coating such materials on lumiphor support elements. Other materials, such as light scattering elements (e.g., particles) and/or index matching materials, may be associated with a lumiphor, a lumiphor binding medium, or a lumiphor support element that may be spatially segregated from a solid state emitter.

The expression "correlative color temperature" or "CCT" is used according to its well-known meaning to refer to the temperature of a blackbody that is, in a well-defined sense (i.e., can be readily and precisely determined by those skilled in the art), nearest in color.

The expression "peak wavelength", as used herein, means (1) in the case of a solid state light emitter, to the peak wavelength of light that the solid state light emitter emits if it is illuminated, and (2) in the case of a luminescent material, the peak wavelength of light that the luminescent material emits if it is excited.

The expression "dominant wavelength", is used herein according to its well-known and accepted meaning to refer to the perceived color of a spectrum, i.e., the single wavelength of light which produces a color sensation most similar to the color sensation perceived from viewing light emitted by the light source (i.e., it is roughly akin to "hue"), as opposed to "peak wavelength", which is well-known to refer to the spectral line with the greatest power in the spectral power distribution of the light source. Because the human eye does not perceive all wavelengths equally (e.g., it perceives yellow and green better than red and blue), and because the light emitted by many solid state light emitter (e.g., LEDs) is actually a range of wavelengths, the color perceived (i.e., the dominant wavelength) is not necessarily equal to (and often differs from) the wavelength with the highest power (peak wavelength). A truly monochromatic light such as a laser has the same dominant and peak wavelengths.

A solid state emitter as disclosed herein can be saturated or non-saturated. The term "saturated" as used herein means having a purity of at least 85%, with the term "purity" having a well-known meaning to those skilled in the art, and procedures for calculating purity being well-known to those skilled in the art.

A wide variety of luminescent materials (also known as lumiphors or luminophoric media, e.g., as disclosed in U.S. Pat. No. 6,600,175 and U.S. Patent Application Publication No. 2009/0184616), are well-known and available to persons of skill in the art. Examples of luminescent materials (lumiphors) include phosphors, scintillators, day glow tapes, nano-phosphors, quantum dots, and inks that glow in the visible spectrum upon illumination with (e.g., ultraviolet) light. Inclusion of lumiphors in LED devices has been accomplished by providing layers (e.g., coatings) of such materials over solid state emitters and/or by dispersing luminescent materials to a clear encapsulant (e.g., epoxy-based or silicone-based curable resin or other polymeric matrix) arranged to cover one or more solid state light emitters. One or more luminescent materials useable in devices as described herein may be down-converting or up-converting, or can include a combination of both types.

Various embodiments include lumiphoric materials and lumiphor support elements that are spatially segregated (i.e., remotely located) from one or more solid state emitters. In certain embodiments, such spatial segregation may involve separation of a distances of at least about 1 mm, at least about 2 mm, at least about 5 mm, or at least about 10 mm. In certain embodiments, conductive thermal communication between a spatially segregated lumiphoric material and one or more electrically activated emitters is not substantial. Lumiphoric materials may be supported by or within one or more lumiphor support elements, such as (but not limited to) glass layers or discs, optical elements, or layers of similarly translucent or transparent materials capable of being coated with or embedded with lumiphoric material. In one embodiment, lumiphoric material (e.g., phosphor) is embedded or otherwise dispersed in a body of a lumiphor support element.

Some embodiments of the present invention may use solid state emitters, emitter packages, fixtures, luminescent materials/elements, power supplies, control elements, and/or methods such as described in U.S. Pat. Nos. 7,564,180; 7,456,499; 7,213,940; 7,095,056; 6,958,497; 6,853,010; 6,791,119; 6,600,175; 6,201,262; 6,187,606; 6,120,634; 5,912,477; 5,739,554; 5,631,190; 5,604,135; 5,523,589; 5,416,342; 5,393,993; 5,359,345; 5,338,944; 5,210,051; 5,027,168; 5,027,168; 4,966,862, and/or 4,918,497, and U.S. Patent Application Publication Nos. 2009/0184616; 2009/0080185; 2009/0050908; 2009/0050907; 2008/0308825; 2008/0198112; 2008/0179611, 2008/0173884, 2008/0121921; 2008/0012036; 2007/0253209; 2007/0223219; 2007/0170447; 2007/0158668; 2007/0139923, and/or 2006/0221272; with the disclosures of the foregoing patents and published patent applications being hereby incorporated by reference as if set forth fully herein.

The expression "lighting device", as used herein, is not limited, except that it is capable of emitting light. That is, a lighting device can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or backlighting (e.g., backlight poster, signage, LCD displays), bulb replacements (e.g., for replacing AC incandescent lights, low voltage lights, fluorescent lights, etc.), lights used for outdoor lighting, lights used for security lighting, lights used for exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting—work lights, etc., mirrors/vanity lighting, or any other light emitting device.

The present inventive subject matter further relates in certain embodiments to an illuminated enclosure (the volume of which can be illuminated uniformly or non-uniformly), comprising an enclosed space and at least one lighting device according to the present inventive subject matter, wherein the lighting device illuminates at least a portion of the enclosure (uniformly or non-uniformly).

The present inventive subject matter is further directed to an illuminated area, comprising at least one item, e.g., selected from among the group consisting of a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, etc., having mounted therein or thereon at least one lighting device as described herein.

Certain embodiments of the present invention relate to use of solid state emitter packages. A solid state emitter package typically includes at least one solid state emitter chip that is enclosed with packaging elements to provide environmental and/or mechanical protection, color selection, and light focusing, as well as electrical leads, contacts or traces enabling electrical connection to an external circuit. Encapsulant material, optionally including lumiphoric material, may be disposed over solid state emitters in a solid state emitter package. Multiple solid state emitters may be provided in a single package. A package including multiple solid state emitters may include at least one of the following: a single leadframe arranged to conduct power to the solid state emitters, a single reflector arranged to reflect at least a portion of light emanating from each solid state emitter, a single submount supporting each solid state emitter, and a single lens arranged to transmit at least a portion of light emanating from each solid state emitter.

Individual emitters or groups of emitters in a solid state emitter package (e.g., wired in series) may be separately controlled. Multiple solid state emitter packages may be arranged in a single solid state lighting device. Individual solid state emitter packages or groups of solid state emitter packages (e.g., wired in series) may be separately controlled. Separate control of individual emitters, groups of emitters, individual packages, or groups of packages, may be provided by independently applying drive currents to the relevant components with control elements known to those skilled in the art. In one embodiment, at least one control circuit a may include a current supply circuit configured to independently apply an on-state drive current to each individual solid state emitter, group of solid state emitters, individual solid state emitter package, or group of solid state emitter packages. Such control may be responsive to a control signal (optionally including at least one sensor arranged to sense electrical, optical, and/or thermal properties and/or environmental conditions), and a control system may be configured to selectively provide one or more control signals to the at least one current supply circuit. In various embodiments, current to different circuits or circuit portions may be pre-set, user-defined, or responsive to one or more inputs or other control parameters.

In certain embodiments, a GSR+B lighting device is devoid of a yellow lumiphor arranged to be stimulated by a blue LED.

In certain embodiments, a GSR+B lighting device is devoid of any solid state light emitter having a phosphide-based (e.g., AlInGaP) active region. Each emitter of the GSR+B lighting device may be independently controllable relative to one another, such as by using a control circuit arranged to independently supply current to each solid state emitter. Lumiphor emissions generated by at least one red lumiphor may have a peak wavelength of at least about 591 nm, and in certain embodiments such lumiphor has a peak wavelength of less than or equal to about 700 nm. At least one second lumiphor may be provided. In one embodiment, at least one second lumiphor has a peak wavelength in a range of from 555 nm to 590 nm, and is arranged to receive emissions from a green solid state light emitter of the GSR+B device. In another embodiment, at least one second lumiphor has a peak wavelength in a range of from 555 nm to 590 nm, and is arranged to receive emissions from the blue solid state light emitter of the GSR+B device. In one embodiment, a GSR+B lighting device includes an additional solid state light emitter having a peak wavelength in a range of from 481 nm to 499 nm (e.g., cyan).

In certain embodiments, a combination of (A) light exiting a GSR+B lighting device that was emitted by a green solid state emitter, (B) light exiting the GSR+B lighting device that was emitted by a blue light emitter, and (C) light exiting the GSR+B lighting device that was emitted by a red lumiphor, in an absence of any additional light, would produce a mixture of light having x, y coordinates on a 1931 CIE Chromaticity Diagram that define a point within ten MacAdam ellipses of at least one point on the blackbody locus on a 1931 CIE Chromaticity diagram.

In certain embodiments, a GSR+B lighting device include multiple green solid state light emitters, multiple blue solid state light emitters, and/or multiple lumiphors. In certain embodiments, a GSR+B lighting device includes multiple green solid state light emitters having dominant wavelengths that differ from one another by at least 10 nm. In certain embodiments, a GSR+B lighting device includes multiple blue solid state light emitters having peak wavelengths that differ from one another by at least 10 nm. In certain embodiments, a GSR+B lighting device includes multiple lumiphors having peak wavelengths that differ from one another by at least 10 nm.

In certain embodiments, a red lumiphor of a GSR+B lighting device arranged to be simulated by a green solid state light emitter is spatially segregated from the green solid state light emitter of the lighting device.

In certain embodiments, combined emissions of a GSR+B lighting device embody at least one of (a) a color rendering index (CRI Ra) value of at least 85 over a correlative color temperature (CCT) range of from 5000K to 3000K, and (b) a color quality scale (CQS) value of at least 85 over a correlative color temperature (CCT) range of from 5000K to 3000K. In certain embodiments, combined emissions of such a device have a luminous efficacy of at least 280 lumens/watt optical.

In certain embodiments, a GSR+B lighting device includes a red lumiphor arranged to be stimulated by a green solid state emitter, wherein the red lumiphor is remotely located (i.e., spatially segregated) relative to the green solid state. The resulting lighting device may be arranged to output combined emissions including at least a portion of light emissions generated by at least one green solid state emitter, at least one blue solid state emitter, and the red lumiphor. Such GSR+B lighting device is preferably devoid of any yellow lumiphor arranged to be stimulated by a blue solid state light emitter.

In certain embodiments, a GSR+B lighting device includes multiple solid state emitters having dominant wavelengths that differ from one another by at least 20 mm, and at least one lumiphor arranged to receive emissions from one or more of the multiple solid state emitters and responsively generate lumiphor emissions, wherein the lighting device is arranged to output combined emissions including at least a portion of light emissions generated by each of the multiple solid state light emitters and the lumiphor, and the combined emissions embody at least one of (a) a color rendering index (CRI Ra) value of at least 85 over a correlative color temperature (CCT) range of from 5000K to 3000K, and (b) a color quality scale (CQS) value of at least 85 over a correlative color temperature (CCT) range of from 5000K to 3000K. Such combined emissions may further have a luminous efficacy of at least 280 lumens/watt optical. Such GSR+B lighting device is preferably devoid of any yellow lumiphor arranged to be stimulated by a blue solid state light emitter.

In certain embodiments, a GSR+B lighting device may embody a green shifted red component (i.e., at least one red lumiphor arranged to be stimulated by at least one green solid state light emitter), a blue shifted red component (i.e., at least one red lumiphor arranged to be stimulated by at least one blue solid state light emitter), and a blue shifted green (i.e., at least one green lumiphor arranged to be stimulated by at least one blue solid state light emitter). The resulting device may be termed a GSR+BSR+BSG device, as one variant of a GSR+B device described herein. Each solid state emitter of such a device may be independently controllable, such as with one or more control circuits. By modulating currents to the solid state emitters, various colors and white light with various color temperatures may be generated by a GSR+BSR+BSG device. One or more (potentially all) of the foregoing lumiphors of GSR+BSR+BSG device may be spatially segregated from the solid state emitters arranged to stimulate the corresponding lumiphors. Multiple solid state light emitters (whether of substantially the same peak or dominant wavelength, or having peak wavelengths and/or dominant wavelengths differing by at least 10 nm) may be provided for one or more components of a GSR+BSR+BSG device. Similarly, multiple lumiphors (e.g., having peak wavelengths and/or dominant wavelengths differing by at least 10 nm) may be provided for one or more components of a GSR+BSR+BSG device. Combined emissions of such device preferably embody at least one of (a) a color rendering index (CRI Ra) value of at least 85 over a correlative color temperature (CCT) range of from 5000K to 3000K, and (b) a color quality scale (CQS) value of at least 85 over a correlative color temperature (CCT) range of from 5000K to 3000K. Such emissions may further embody a luminous efficacy of at least 280 lumens/watt optical. A GSR+BSR+BSG lighting device is preferably devoid of any yellow lumiphor arranged to be stimulated by a blue solid state light emitter.

In certain embodiments, a GSR+B device includes an additional cyan solid state emitter. The resulting device may be termed a GSR+B+C device, as one variant of a GSR+B device described herein. Such lighting device is preferably devoid of any yellow lumiphor arranged to be stimulated by a blue solid state light emitter. Presence of a cyan LED (which is preferably independently controllable) is desirable to permit adjustment or tuning of color temperature of the lighting device 330 (since the tie line for a solid state emitter having a ~487 nm peak wavelength is substantially parallel to the blackbody locus for a color temperature of less than 3000K to about 4000K). Each emitter is preferably independently controllable, to permit output color and/or color temperature to be tuned. Multiple solid state light emitters (whether of substantially the same peak or dominant wavelength, or having peak wavelengths and/or dominant wavelengths differing by at least 10 nm) may be provided for one or more components of a GSR+B+C device. Similarly, multiple lumiphors (e.g., having peak wavelengths and/or dominant wavelengths differing by at least 10 nm) may be provided.

In certain embodiments, a GSR+B device includes additional green and red solid state emitters. The resulting device may be termed a GSR+R+G+B device, as one variant of a GSR+B device described herein. A GSR+R+G+B lighting device is preferably devoid of any yellow lumiphor arranged to be stimulated by a blue solid state light emitter. Each solid state light emitter is preferably independently controllable relative to one another, such as with one or more control circuits. Multiple solid state light emitters (whether of substantially the same peak or dominant wavelength, or having peak wavelengths and/or dominant wavelengths differing by at least 10 nm) may be provided for one or more components of a GSR+R+G+B device. Similarly, multiple lumiphors (e.g., having peak wavelengths and/or dominant wavelengths differing by at least 10 nm) may be provided. At least one lumiphor arranged to be stimulated by a solid state emitter in such device may be spatially segregated from the solid state emitter.

FIGS. 3A-3I illustrate examples of multi-chip solid state lamps embodying GSR+B lighting devices.

Referring to FIG. 3A, a multi-chip LED lamp 300 includes a common (single) substrate or submount 301 including first and second die mounting regions 302A, 302B each configured to accept a solid state emitter chip such as a LED, an OLED, or a laser diode. First and second solid state emitter chips (e.g., LED chips) 303A, 303B are mounted on the respective die mounting regions 302A, 302B of the submount or substrate 301. At least one lumiphor 304A is arranged to at least partially cover or overlie the first solid state emitter 303A, so as to absorb at least a portion of the emissions from the first solid state emitter 303A and re-emit light in a different wavelength range. The first and the second solid state emitters 303A, 303B may be independently energized and/or driven by a control circuit. In one embodiment, the first solid state emitter chip 303A comprises a LED chip having a dominant wavelength in the green wavelength range, the second solid state emitter chip 303B comprises a blue LED chip having a peak wavelength in the blue wavelength range, and at least one lumiphor includes a red phosphor 304A is arranged over the green LED chip 302A, with the lighting device 300 embodying a GSR+B device. The green and/or blue LED chips 303A, 303B may be InGaN-based green and/or blue LED chips commercially available from Cree, Inc. (Durham, N.C., USA). Preferably, the device 300 is devoid of any lumiphor that has a peak wavelength in the yellow range and that is arranged to be stimulated by emissions of a blue LED.

In one embodiment, a multi-emitter solid state lighting device may include multiple solid state emitters each arranged to stimulate emissions from a different lumiphoric material. Referring to FIG. 3B, a multi-chip solid state lamp 310 includes a common (single) substrate or submount 311 that includes first and second die mounting regions 312A, 312B each configured to accept a solid state emitter chip (e.g., LED, an OLED, or laser diode). First and second solid state emitter chips (e.g., LED chips) 313A, 313B are mounted on the respective die mounting regions 312A, 312B of the submount or substrate 311. At least one first lumiphor 314A is arranged to at least partially cover or overlie the first solid state emitter 303A, and at least one second lumiphor 314B is arranged to at least partially cover or overlie the second solid state emitter 313B. In one embodiment, the first solid state emitter chip 313A comprises a LED chip having a dominant wavelength in the green wavelength range, the second solid state emitter chip 313B comprises a blue LED chip having a peak wavelength in the blue wavelength range, the at least one first lumiphor comprises a red phosphor 314A, and the at least one second lumiphor has a peak wavelength outside the yellow range, with the lighting device 310 embodying a GSR+B device. Any one or both of the at least one first lumiphor 314A and the at least one second lumiphor may include multiple lumiphors having different peak wavelengths. In one embodiment, any one or both of the at least one first lumiphor and the at least one second lumiphor extends at least partially over both solid state emitter chips 313A, 313B.

FIGS. 3C-3E illustrate multi-emitter solid state lighting devices including three solid state emitters. Referring to FIG. 3C, a multi-emitter solid state lighting device 320 includes a common substrate or submount 321 that includes first, second, and third die mounting regions 322A-322C each configured to accept a solid state emitter chip. First, second, and third solid state emitter chips (e.g., LED chips) 323A-323C are mounted on the respective die mounting regions 322A-322C. At least one first lumiphor 324A is arranged to at least partially cover the first solid state emitter 323A, and at least one second lumiphor 324C is arranged to at least partially cover the third solid state emitter 323C. In one embodiment, the first solid state emitter chip 323A comprises a LED chip having a dominant wavelength in the green wavelength range, the second solid state emitter chip 323B comprises a blue LED chip having a peak wavelength in the blue wavelength range, the third solid state emitter chip 323C comprises a LED chip having a dominant wavelength in the green wavelength range (with the dominant wavelengths of the first and third chips optionally being the same or being different), the at least one first lumiphor comprises a red phosphor 324A, and the at least one third lumiphor comprises another phosphor 324C having a peak wavelength within any suitable wavelength range, such (but not limited to) as yellow, orange, or red, with the lighting device 320 embodying a GSR+B device. Any one or both of the at least one lumiphor and the at least one second lumiphor may include multiple lumiphors and/or may extend at least partially over multiple solid state emitter chips 323A-323C. At least one additional lumiphor may optionally be provided over the second solid state emitter (e.g., blue LED) chip 323B, but if provided, such additional lumiphor preferably has a peak wavelength outside the yellow wavelength range.

FIG. 3D illustrates a multi-emitter solid state lighting device 330 that includes a common substrate or submount 331 that includes first, second, and third die mounting regions 332A-332C each configured to accept a solid state emitter chip. First, second, and third solid state emitter chips (e.g., LED chips) 333A-333C are mounted on the respective die mounting regions 332A-332C. At least one lumiphor 334B is arranged to at least partially cover or be arranged over the second solid state emitter 323B. In one embodiment, the first solid state emitter chip 333A comprises a LED chip having a dominant wavelength in the blue wavelength range, the second solid state emitter chip 333B comprises a green LED chip having a dominant wavelength in the green wavelength range, the third solid state emitter chip 333C comprises a LED chip having a dominant wavelength in the cyan wavelength range, and the at least one lumiphor comprises a red phosphor 334B, with the lighting device 330 embodying a GSR+B device. Presence of a cyan LED (which is preferably independently controllable) is desirable to permit adjustment or tuning of color temperature of the lighting device 330 (since the tie line for a solid state emitter having a ~487 nm peak wavelength is substantially parallel to the blackbody locus for a color temperature of less than 3000K to about 4000K). The at least one lumiphor may optionally include multiple lumiphors and/or may extend at least partially over multiple solid state emitter chips 323A-323C. One or more additional lumiphors may optionally be provided to interact with one or more of the solid state emitter chips 323A-323C. If an additional lumiphor is provided over a blue solid state emitter (e.g., blue LED), then such additional lumiphor preferably has a peak wavelength outside the yellow wavelength range.

FIG. 3E illustrates a multi-emitter solid state lighting device 340 that includes a common substrate or submount 341 with first, second, and third die mounting regions 342A-342C each configured to accept a solid state emitter chip. First, second, and third solid state emitter chips (e.g., LED chips) 343A-343C are mounted on the respective die mounting regions 342A-342C. At least one lumiphor 344B is arranged to at least partially cover or be arranged over the second solid state emitter 343B. In one embodiment, the first solid state emitter chip 343A comprises a LED chip having a dominant wavelength in the blue wavelength range, the second solid state emitter chip 343B comprises a green LED chip having a dominant wavelength in the green wavelength range, the third solid state emitter chip 343C comprises a LED chip having a dominant wavelength in the yellow wavelength range, and the at least one lumiphor comprises a red phosphor 344B, with the lighting device 340 embodying a GSR+B device. Such device is preferably devoid of any lumiphor having a peak wavelength in the yellow wavelength range that is stimulated by a solid state emitter having a peak wavelength in the blue wavelength range. One or more additional lumiphors may optionally be provided to interact with one or more of the solid state emitter chips 343A-343C.

FIGS. 3F-3H illustrate multi-emitter solid state lighting devices each including four solid state emitter chips.

Referring to FIG. 3F, a multi-emitter solid state lighting device 350 with a common substrate or submount 351 includes four die mounting regions 352A-352D each configured to accept a solid state emitter chip. First, second, third, and fourth solid state emitter chips (e.g., LED chips) 353A-353C are mounted on the respective die mounting regions 352A-352D. At least one lumiphor 354B is arranged to at least partially cover or be arranged over the second solid state emitter 353B, and at least one additional lumiphor 354C is arranged to at least partially cover or be arranged over the third solid state emitter 353C. In one embodiment, the first solid state emitter chip 353A comprises a LED chip having a peak wavelength in the blue wavelength range, the second solid state emitter chip 353B comprises a green LED chip having a dominant wavelength in the green wavelength range, the third solid state emitter chip 353C comprises a LED chip having a dominant wavelength in the green wavelength range, the fourth solid state emitter chip 353D comprises a LED chip having a peak wavelength in the cyan wavelength range, the least one lumiphor comprises a red phosphor 354B, and the at least one additional lumiphor comprises another phosphor that may have a peak wavelength in the yellow, orange, or red wavelength ranges, with the lighting device 350 embodying a GSR+B device. Presence of a cyan LED (which is preferably independently controllable) is desirable to permit adjustment or tuning of color temperature of the lighting device 350. Such device 350 is preferably devoid of any lumiphor having a peak wavelength in the yellow wavelength range that is stimulated by a solid state emitter having a peak wavelength in the blue wavelength range. One or more additional lumiphors may optionally be provided to interact with one or more of the solid state emitter chips 353A-353D.

FIG. 3G illustrates a multi-emitter solid state lighting device 360 with a common substrate or submount 361 that includes four die mounting regions 362A-362D configured to accept first, second, third, and fourth solid state emitter (e.g., LED) chips 363A-363D. At least one lumiphor 364B is arranged to at least partially cover or be arranged over the second solid state emitter chip 363B. One or more additional lumiphors may optionally be provided to interact with one or more of the solid state emitter chips 363A-363D, but the device 360 is preferably devoid of any lumiphor having a peak wavelength in the yellow wavelength range that is stimulated by a solid state emitter having a peak wavelength in the blue wavelength range. In one embodiment, the first solid state emitter chip 363A comprises a LED chip having a peak wavelength in the blue wavelength range, the second solid state emitter chip 363B comprises a green LED chip having a dominant wavelength in the green wavelength range, the third and fourth solid state emitter chips 363C-363D comprises LED chips having peak wavelengths in any one or more of the blue, cyan, green, yellow, orange, or red wavelength ranges, and the least one lumiphor comprises a red phosphor 364B, with the lighting device 360 embodying a GSR+B device.

FIG. 3H illustrates a multi-emitter solid state lighting device 370 with a common substrate or submount 371 that includes four die mounting regions 372A-372D configured to accept first, second, third, and fourth solid state emitter (e.g., LED) chips 373A-373D. At least one lumiphor 374B is arranged to at least partially cover or be arranged over the second solid state emitter chip 373B. One or more additional lumiphors may optionally be provided to interact with one or more of the solid state emitter chips 373A-373D, but the device 370 is preferably devoid of any lumiphor having a peak wavelength in the yellow wavelength range that is stimulated by a solid state emitter having a peak wavelength in the blue wavelength range. In one embodiment, the first, second, third, and four solid state emitter chips 373A-373D comprise LED chips having a peak wavelengths in the blue, green, green and red wavelength ranges, respectively, and the at least one lumiphor comprises a red phosphor 374B, with the lighting device 370 embodying a GSR+B device (e.g., with supplemental green and red emitters). The device may also be termed a RBG device (including emitters 373A, 373C, 373D) with a green-shifted red supplemental emitter (i.e., emitter 373B in conjunction with the lumiphor 374B).

FIG. 3I illustrates a multi-emitter solid state lighting device 380 with a common substrate or submount 381 that includes three die mounting regions 382A-382C configured to accept first, second, and third solid state emitter (e.g., LED) chips 383A-383D. At least one different lumiphor 384A-384C is arranged to at least partially cover or be arranged over each different solid state emitter chip 383A-383C, respectively. The device 380 is preferably devoid of any lumiphor having a peak wavelength in the yellow wavelength range that is stimulated by a solid state emitter having a peak wavelength in the blue wavelength range. In one embodiment, the first, second, and third solid state emitter chips 373A-373C comprise LED chips having a peak wavelengths in the green, blue, and blue wavelength ranges, respectively, with the first lumiphor comprising a red phosphor 384A, the second lumiphor comprising an orange and/or red phosphor 384B, and the third lumiphor comprising a cyan phosphor 384C, with the lighting device 370 embodying a GSR+B device (e.g., with a supplemental blue emitter).

Various lighting devices as described herein may be embodied in, or may include, one or more solid state emitter packages. Referring to FIG. 4, an exemplary emitter package 400 may include multiple emitters 412A, 412B (e.g., LED chips manufactured by Cree, Inc., Durham, N.C.) with integral conductive substrates. Such solid emitters 412A, 412B may be vertical devices including anode and cathode contacts on opposing faces, respectively. The solid state emitters 412A, 412B may be mounted in a flip-chip configuration, with light emitting upward through substrates of the emitters 412A, 412B. Flip-chip mounting is not required; in other embodiments, solid state emitter chips may be mounted with substrate portions thereof proximate to a submount 414 or other supporting structure. At least the first solid state emitter 412A is arranged to interact with at least one lumiphor 424, which may be coated on or over the emitter 412A, or dispersed in an encapsulant 420 which may optionally include an associated lens (not shown). As shown, the at least one lumiphor 424 may be spatially segregated from the first solid state emitter 412A. Wirebond connections (not shown) may connect external leads 415, 416 with conductive traces on the submount 414. The electrical leads 415, 416 may extend laterally outward past a side edge 410C of the body structure 410. The submount 414 and emitters 412A, 412B are arranged in a reflector cup 418 positioned on an upper surface 410A of (or optionally integrated with) a package body structure 410. The body structure 410 preferably comprises an electrically insulating material such as a molded polymeric composition. Disposed within a central portion of the body 410 is a heatsink 417, which extends between the submount 414 and a lower surface 410B of the body 410. The heatsink 417 may be integrally formed with, or joined to, a leadframe. A similar solid state emitter package and fabrication details regarding same are provided in U.S. Pat. No. 7,655,957 to Loh, et al., which is incorporated by reference herein. As shown in FIG. 4, the package 400 includes multiple emitters 412A, 412B arranged over a single submount 414 and within a single reflector 418 which may be covered by a single lens (e.g., as may be associated with the encapsulant 420). Although only two solid state emitter chips 412A, 412B are shown in the package 400 according to FIG. 4, it is to be appreciated that any desirable number of solid state emitter chips may be provided in a single package and/or group of solid state emitter packages.

Various exemplary lighting devices including multiple solid state emitters (e.g., LED chips) and reflectors, which may embody GSR+B lighting device, are illustrated and described in connection with FIGS. 5A-5E.

FIG. 5A is a side cross-sectional schematic view of at least a portion of a solid state lighting device 500 including first and second solid state emitters (e.g., LEDs) 504, 505 mounted on, over, or in a reflector cup 502 or similar support structure, and at least one lumiphor (e.g., phosphor) 507 dispersed in an encapsulant material (optionally enhanced with scattering and/or brightness enhancing material(s)) disposed over the LEDs 504, 505 and within the reflector cup 502. Multiple lumiphors 507 may be provided (e.g., whether provided as a mixture, or provided as discrete layers or regions of different lumiphor compositions) and arranged to interact with one or more solid state emitters 504, 505. At least a portion of light emissions from each solid state emitter 504, 505 preferably escapes from an emissive end or surface 500A of the lighting device 500.

In one embodiment, one or more lumiphors may be arranged to interact with only a single LED 504, 505. In certain embodiments, at least one lumiphor may be disposed in an amount (e.g., thickness, width, etc.) or concentration that varies with respect to position within a solid state lighting device, such as may be embodied in variations of presence, amount, or concentration with respect to different solid state emitters 504, 505. For example, at least one lumiphor may be coated over or arranged over one LED, and not coated or arranged over (or arranged in a different thickness or concentration over) another LED. In certain embodiments, one solid state emitter 504 comprises a green LED, another solid state emitter 505 comprises a blue LED, and the at least one lumiphor 507 comprises a red phosphor arranged to be stimulated by at least the green LED, with the device 500 embodying a GSR+B lighting device. Additional lumiphors and/or solid state emitters may be provided.

In one embodiment, a solid state lighting device may include multiple solid state emitters and at least one lumiphor arranged in one or more layers spatially separated from the solid state emitters. FIG. 5B is a side cross-sectional schematic view of at least a portion of a solid state lighting device 510 including first and second solid state emitters (e.g., LEDs) 514, 515 mounted in, on, or over a reflector cup 512 or similar support structure, and one or more lumiphors 518, 519 arranged in one or more layers that are spatially segregated from the LEDs 514, 515 and arranged between the LEDs 514, 515 and a light emitting end or surface 510A of the lighting device 510. An encapsulant 516 and/or other material may be disposed between the LEDs 514, 515 and the lumiphors 518, 519; alternatively, the LEDs 514, 515 and lumiphors 518, 519 may be separated by a gap. In one embodiment, the lumiphors 518, 519 may be arranged in alternating layers that may be uniform or non-uniform in character. One advantage of confining different lumiphors to different layers is to avoid undue absorption of emission spectrum of one lumiphor that may overlap with excitation spectrum of another lumiphor (e.g., excitation spectrum of first phosphor (e.g., red) may overlap with emission spectrum of another phosphor which would result in loss of efficiency). In one embodiment, lumiphor material may be dispersed in a non-uniform manner (e.g., patterned) within an individual lumiphor layer. In one embodiment, a lumiphor material layer may have a thickness that is non-uniform with respect to position. In certain embodiment, one solid state emitter 514 comprises a green LED, another solid state emitter 515 comprises a blue LED, and at least one lumiphor 518, 519 comprises a red phosphor arranged to be stimulated by at least the green LED, with the device 510 embodying a GSR+B lighting device. Additional lumiphors and/or solid state emitters may be provided.

Although FIG. 5A illustrates the at least one lumiphor 507 as being dispersed in an encapsulant material, it is to be appreciated that one or more lumiphors may be disposed in any suitable conformation to receive emissions from a solid state (e.g., LED) emitter and responsively re-emit light. In certain embodiments, at least one lumiphor may be coated directly on or over a solid state emitter. In certain embodiments, one or more lumiphors may be arranged in separate layers that may be spatially separated from each solid state emitter and/or one another. In certain embodiment, one or more lumiphors may be disposed remotely from at least one solid state emitter. At least one lumiphor may be spatially separated from each solid state emitter, and/or at least one other lumiphor, by a gap or void. Spatial separation between at least one lumiphor and at least one other lumiphor and/or at least one solid state emitter in various embodiments may be at least about 0.5 mm, at least 1 mm, at least about 2 mm, at least about 5 mm, or at least about 10 mm. In one embodiment, conductive thermal coupling between at least one lumiphor and a solid state emitter is not substantial, such that conductive heating from a solid state emitter to the lumiphor is minimized. Reducing conductive thermal coupling between a lumiphor and a LED may extend the operative life of the lumiphor, and may reduce lumiphor spectral shift with respect to variations in surface temperature of a solid state emitter.

In certain embodiments, at least one lumiphor may be coated on or over at least one surface of a solid state emitter. FIG. 5C illustrates a lighting device 520 including first and second solid state emitters (e.g., LEDs) 524, 525 mounted in, on, or over a reflector 522 or other suitable support structure, with at least one lumiphor 523 coated on or over at least one surface of the first solid state emitter 524. Encapsulant materials 526 (optionally including at least one additional lumiphor, scattering, and/or brightness enhancing material) may be arranged between the solid state emitters 524, 525 and a light emitting end or surface 520A of the lighting device 520. In certain embodiments, the first solid state emitter 524 comprises a green LED, the second solid state emitter 525 comprises a blue LED, and the lumiphor 523 disposed over the green LED 523 comprises a red phosphor, with the device 520 embodying a GSR+B lighting device. Additional lumiphors and/or solid state emitters may be provided.

In certain embodiments, different solid state emitters may be arranged in, on, or over different reflectors disposed over a common (single) submount or other structural support element of a lighting device. FIG. 5D is a side cross-sectional schematic view of at least a portion of a solid state lighting device 530 including a first solid state emitter (e.g., first LED) 534 mounted in or on a first reflector 532A, and including a second solid state emitter (e.g., second LED) 535 mounted in or on a second reflector 532B, with each reflector 532A, 532B arranged on or over a single submount 501 or other support structure. Each solid state emitter 534, 535 may be covered with an encapsulant material 536A, 536B and may have at least one lumiphor and/or optical element 533A, 533B arranged between the respective solid state emitters 534, 535 and light emitting end portions or surfaces 530A, 530B of the lighting device 530. In certain embodiments, one solid state emitter 534 comprises a green LED, another solid state emitter 535 comprises a blue LED, element 533A includes a red phosphor arranged to be stimulated by the green LED 534, and element 533B is devoid of any yellow phosphor, with the device 530 embodying a GSR+B lighting device. Additional lumiphors and/or solid state emitters may be provided.

In certain embodiments, individual lumiphors may be arranged in non-contacting relationship over different solid state emitters of a solid state lighting device. Referring to FIG. 5E, a solid state lighting device 540 includes first and second solid state emitters (e.g., LED chips) 544, 545 supported in, on, or over a reflector cup 542 or other support structure, with at least one different lumiphor 543A, 543B arranged in non-contacting relationship over each solid state emitter 544, 545. The amount, concentration, and/or thickness of each lumiphor 543A, 543B may be the same or differ as compared to one another, and any one or more of lumiphor amount, concentration, and/or thickness may vary spatially with respect to each individual solid state emitter 544, 545. Encapsulant material 546, and optical elements and/or additional lumiphors(s) 548, may be arranged between the solid state emitters 544, 545 and a light emitting end or surface 540 of the lighting device 540. In certain embodiments, a first solid state emitter 544 comprises a green LED, a second solid state emitter 545 comprises a blue LED, a first lumiphor 543A includes a red phosphor arranged to be stimulated by the green LED 544, and the second lumiphor 543B has a peak wavelength outside the yellow range, with the device 540 embodying a GSR+B lighting device. Additional lumiphors and/or solid state emitters may be provided.

Although only two solid state emitters are illustrated in each of FIGS. 5A-5E, it is to be appreciated that any desirable number of solid state emitters may be provided in a single device, and/or additional lumiphors may be provided. Additional components such as diffusers, light scattering layers, lenses, and the like may be provided with solid state lighting devices as disclosed herein to affect direction, diffusion, focusing, or other properties of emissions generated by a lighting device.

In various embodiments, different solid state emitters of a lighting device as disclosed herein (including GSR+B solid state lighting devices) are independently controllable relative to one another. Independent control may be accomplished with any one or more suitable control elements, that may include (but are not limited to) one or more microprocessors or other control elements arranged to automatically execute machine-readable instructions such as may be embodied in software. One or more lighting devices as disclosed herein may be arranged in or embody light fixtures. A light fixture may include two or more multi-emitter solid state emitter devices, optionally supplemented with one or more individual solid state emitter chips. Multiple lighting devices and/or light fixtures may be controlled with one or more control elements, such as to control intensity, color, chromaticity, color rendering, and/or other parameters. In one embodiment, individual emitters or groups of emitters within a single light fixture or group of light fixtures may be controlled by one or more control elements. Control of individual lighting devices and/or light fixtures may be responsive to outputs of one or more sensors (optionally integrated with lighting devices or light fixtures). Individual solid state emitter packages or groups of solid state emitter packages (e.g., wired in series) may be separately controlled. Separate control of individual emitters, groups of emitters, individual packages, or groups of packages, may be provided by independently applying drive currents to the relevant components with control elements known to those skilled in the art. In one embodiment, at least one control circuit a may include a current supply circuit configured to independently apply an on-state drive current to each individual solid state emitter, group of solid state emitters, individual solid state emitter package, or group of solid state emitter packages. Such control may be responsive to a control signal (optionally including at least one sensor arranged to sense electrical, optical, and/or thermal properties), and a control system may be configured to selectively provide one or more control signals to the at least one current supply circuit. In various embodiments, current to different circuits or circuit portions may be pre-set, user-defined, or responsive to one or more inputs or other control parameters.

FIG. 6 illustrates a light fixture 600 according to at least one embodiment of the present invention. The light fixture 600 includes a mounting plate 615 to which multiple multi-chip solid state emitter (e.g., LED) lamps 610-1 to 610-6 are attached. Although the mounting plate 615 is illustrated as having a circular shape, the mounting plate may be provided in any suitable shape or configuration (including non-planar and curvilinear configurations). As used herein, the term "multi-chip solid state lamp" refers to a lamp including at least two solid state emitter chips (e.g., LED chips). Different solid state emitter chips within a single multi-chip solid state emitter lamp may be configured to emit the same or different colors (e.g., wavelengths) of light. With specific reference to the first multi-chip solid state lamp 610-1, each multi-chip solid state lamp 610-1 to 610-6 includes multiple solid state emitters (e.g., LEDs) 604A-604C preferably arranged on a single submount 601. Although FIG. 6 illustrates four solid state emitter chips as being associated with each multi-chip solid state lamp 610-1 to 610-6, it is to be appreciated that any suitable number of two or more solid state emitter chips may be associated with each multi-chip solid state lamp 610-1 to 610-6, and the number of solid state emitter chips associated with different multi-chip solid state lamps may be different. Each multi-chip solid state lamp in a single fixture 600 may be substantially identical to one another, or multi-chip solid state lamps with different output characteristics may be intentionally provided in a single fixture 600.

The multi-chip solid state lamps 610-1 to 610-6 may be grouped on the mounting plate 615 in clusters or other arrangements so that the light fixture 600 outputs a desired pattern of light. In certain embodiments, at least two multi-chip solid state emitter lamps associated with a single fixture 600 include GSR+B emitters as described herein. Such GSR+B emitters may be devoid of emitters arranged to emit other wavelengths, or may be supplemented with one or more additional solid state emitters and/or lumiphors arranged to emit light with peak wavelengths other than those provided by GSR+B emitters. In one embodiment, one or more of the multi-chip solid state lamps is configured to emit light having a spectral distribution including at least four color peaks (i.e., having local peak wavelengths in wavelength ranges corresponding to at least four different colors of light) to provide white light as aggregated output. Various other combinations of solid state emitters and lumiphors may be embodied in multi-chip solid state lamps, such as (but not limited to), the combinations illustrated and described in connection with FIGS. 3A-3I and FIGS. 5A-5I.

With continued reference to FIG. 6, the light fixture 600 includes a control circuit 650A that is configured to operate the lamps 610-1 to 610-6 by independently applying drive currents to individual solid state chips 604A-604D associated with each lamp 610-1 to 610-6. In other words, each solid state chip 604A-604D in each lamp 610-1 to 610-6 may be configured to be individually addressed by the control circuit 650A. In one embodiment, the control circuit 650A may include a current supply circuit configured to independently apply an on-state drive current to each individual solid state chip responsive to a control signal, and may include one or more control elements configured to selectively provide control signals to the current supply circuit. As solid state emitters (e.g., LEDs) are current-controlled devices, the intensity of the light emitted from an electrically activated solid state emitter (e.g., LED) is related to the amount of current with which the device is driven. A common method for controlling the current driven through an LED to achieve desired intensity and/or color mixing is a Pulse Width Modulation (PWM) scheme, which alternately pulses the LEDs to a full current "ON" state followed by a zero current "OFF" state. The control circuit 650A may be configured to control the current driven through the solid state emitter chips 604A-604D associated with the lamps 610-1 to 610-6 using one or more control schemes known in the art. The control circuit 650A may be attached to an opposite or back surface of the mounting plate 615, or may be provided in an enclosure or other structure (not shown) that is spatially segregated from the lighting device 600.

While not illustrated in FIG. 6, the light fixture 600 a may further include one or more heat spreading components and/or heatsinks for spreading and/or removing heat emitted by the solid state emitter chips 604A-604D associated with the lamps 610-1 to 610-6. For example, a heat spreading component may include a sheet of thermally conductive material configured to conduct heat generated by the solid state emitter chips 604A-604D of the light fixture 600 and spread the conducted heat over the area of the mounting plate 605 to reduce thermal stratification in the light fixture 600. A heat spreading component may be embodied in a solid material, a honeycomb or other mesh material, an anisotropic thermally conductive material (e.g., graphite), and/or other materials or configurations.

To demonstrate the effectiveness of stimulating a red lumiphor (e.g., phosphor) with a green solid state emitter (e.g., LED), Applicants performed computer simulations to model performance of a GSR solid state lighting device. FIG. 7 is a spectral power distribution plot of relative spectral power (percent) versus wavelength resulting from a simulation of a green LED arranged to stimulate emissions from a red phosphor at a correlative color temperature (CCT) of 3398 K. Two peaks are visible, with the left peak corresponding to the green LED being substantially narrower than the right peak corresponding to the red phosphor. FIG. 8 is a table summarizing characteristics of the green LED/red phosphor combination utilized in the simulation for which the spectral power distribution of FIG. 7 was obtained, including color coordinates x,y and u',v', dominant wavelength (nm), peak wavelength (nm), comp, purity, CCT, and full-width half-maximum values.

FIG. 9 is a 1931 CIE Chromaticity Diagram over which output of the green shifted red simulation described in connection with FIGS. 7-8 (at a CCT of 4000 K) have been superimposed, with comparison of the color space described in U.S. Pat. No. 7,213,940. In such figure: item (i) represents the output color point (dominant wavelength 574 nm); item (ii) illustrates the gamut of the sRGB color space (triangular shape); item (iii) represents the color space described in U.S. Pat. No. 7,213,940; item (iv) represents Xbins (ANSI bins) along a tie line for a green emitter of about 568 nm; item (v) represents results of 12 green LED/phosphor combinations with different phosphor loading (described in connection with FIG. 18); and item (vi) represents results of the GSR simulation embodying multiple data points along the gamut of the sRGB color space. The curved line extending from the rightmost corner of the triangular gamut of the sRGB color space into the interior thereof represents the blackbody locus.

FIG. 10 is a spectral power distribution plot representing relative spectral power (percent) versus wavelength resulting from a simulation of a green LED arranged to stimulate emissions from a red phosphor, in combination with a blue LED, at a CCT of 3398 K. Three peaks are visible, with the left peak corresponding to the blue LED (peak at approximately 460 nm), the center peak corresponding to the green LED (peak at approximately 525 nm), and the right peak corresponding to the red phosphor (peak at approximately 600 nm). As shown in FIG. 10, relative spectral power is greatest for the blue peak, lower for the green peak, and still lower for the red peak, with the red peak being substantially broader than each of the blue and green peaks, and the green peak being somewhat broader than the blue peak.

FIG. 11 is a table summarizing simulation results including CRI performance and characteristics of a green LED arranged to stimulate emissions from a red phosphor, in combination with a blue LED, over eight different correlative color temperatures ranging from 2725K to 6532K. The twelve columns of the table according to FIG. 11 provide values for correlative color temperature (CCT), CRI Ra (average CRI), R9 (i.e., value for the ninth sample according to CRI), color quality scale (CQS), luminous efficacy of radiation (LER), lumen percentage for a O6040 red phosphor stimulated by a 530 nm dominant wavelength green LED (part of GSR combination), lumen percentage for a 530 nm dominant wavelength green LED arranged to stimulate the O6040 red phosphor (part of GSR combination), lumen percentage for a 460 nm peak wavelength blue LED, color coordinate x for the GSR combination, color coordinate y for the GSR combination, and dominant wavelength of the GSR combination, respectively. The simulated GSR+B lighting device exhibits CRI Ra of 90 or greater over a CCT range of from 3465 K to 6532 K, and exhibits CQS of 90 or greater over a CCT range of from 3985 K to 6532 K.

FIG. 12 is a plot of relative spectral power (percent) versus wavelength resulting from a simulation of a green LED arranged to stimulate emissions from a red phosphor, in combination with a blue LED, at a CCT of 4000 K. As shown in FIG. 12, the blue LED has a peak wavelength of about 460 nm, the green LED has a peak wavelength of about 525 nm, and the red phosphor has a peak wavelength of about 600 nm. The width of the red phosphor peak is wider than the widths of each of the blue and green peaks, with the green peak also being slightly wider than the blue peak.

FIG. 13A is a bar chart embodying Color Rendering Index (CRI) performance for a simulation including a green LED arranged to stimulate emissions from a red phosphor, in combination with a blue LED, at a CCT of 4000 K. The rightmost bar of FIG. 13A embodies CRI Ra, with a value greater than 90. FIG. 13B is a bar chart embodying Color Quality Scale (CQS) performance for a simulation including a green LED arranged to stimulate emissions from a red phosphor, in combination with a blue LED, at a CCT of 4000 K. As shown in FIG. 13B, values for Q2 through Q13 are 90 or greater, with values for Q1, Q14, and Q15 being above 75.

FIGS. 14A-14C embody first, second, and third portions of a table including results of a simulation including a green LED (peak λ=523 nm, dominant λ=530 nm) arranged to stimulate emissions from a BOSE red phosphor (peak λ=600 nm, dominant λ=595 nm), in combination with a blue LED (peak λ=457 nm, dominant λ=461.5 nm), with the combination embodying a GSR+B lighting device. In FIG. 14A, the rightmost four columns provide values for color coordinates x,y and x',v', respectively. In FIG. 14B, the second through twelfth columns provide values for dominant A, peak A, comp, purity, correlative color temperature (CCT), full width half maximum (FWHM), radiant intensity per part (mW/part), lumens per part (L/prt), forward voltage, forward current, and power, respectively. In FIG. 14C, the second through twelfth columns provide values for luminous efficacy (l/w), radiant intensity (mW), radiant intensity percentage (mW %), lumens (L), lumen percentage (L %), power (W), LEP luminous efficacy (lumens/watt optical), and wall plug efficiency (representing a ratio of optical visible and electrical power), and bin, respectively.

FIG. 15 is a plot of relative spectral power versus wavelength for a simulation of a comparative (i.e., conventional) white light emitting device including a blue LED (peak λ=455 nm) arranged to stimulate emissions from a yellow phosphor (YAG 335), in combination with a red LED (peak λ=624 nm), resulting in blue shifted yellow plus red or "BSY+R" device. As shown in FIG. 15, output relative spectral power of the red LED is greater than that of the yellow phosphor, and output relative spectral power of the yellow phosphor is greater than that of the blue LED.

FIG. 16 is plot of relative spectral power versus wavelength for white light emitting device including a green LED (dominant λ=525 nm) arranged to stimulate emissions from an O6040 red phosphor, in combination with a blue LED (peak λ=455 nm), resulting in green shifted red plus blue light or "GSR+B" device, according to one embodiment of the invention. As shown in FIG. 16, output relative spectral power of the red phosphor is greater than that of the green LED, and output relative spectral power of the green LED is greater than that of the blue LED.

FIG. 17 is a table comparing selected results of the simulations described in connection with FIGS. 15 and 16, including values for LEP luminous efficiency, Stokes' shift, CRI Ra (average CRI) and CRI R9 (i.e., value for the ninth sample according to CRI), and percent power (W) and percent lumens (L) for each of the blue, green (or yellow in the case of the BSY+R device), and red components of the BSY+R and GSR+B devices. As shown in FIG. 17, LER and CRI Ra values are similar for the BSY+R device (342 lum/W-opt and 90) and the GSR+B device (320 lum/W-opt and 87), with the GSR+B device embodying a dramatically lower Stokes' shift (12.1% versus 20.2% for the BSY+R device).

FIG. 18 is a plot of color coordinates (CCy versus CCx) for various GSR lighting devices (green LED arranged to stimulate red phosphor) constructed by applicants demonstrating the effectiveness of stimulating red phosphor emissions using a green LED, and showing the effect of varying loading of the red phosphor on the green LED. Increased phosphor loading is represented by the large arrow extending in a downward direction from upper left to lower right in FIG. 18, which is fit to twelve data points. The data point at upper left represents a GSR combination with the lowest phosphor loading (thereby expected to generate relatively more green spectral output and relatively less red spectral output), whereas the data point at lower right represents a GSR combination with the highest phosphor loading (thereby expected to generate relatively more red spectral output and relatively green spectral output). A segment of the sRGB gamut line 1801 is provided for reference. The curved line bordered from above and below with labeled ANSI white bin numbers and color temperatures represents the blackbody locus 1802. Xbins (ANSI bins) 1803 are illustrated along a tie line for a green emitter of about 568 nm. Points labeled with F18A, F18B, and F18C correspond to plots embodied in FIGS. 18A, 18B, and 18C, respectively.

FIGS. 18A-18C embody plots of spectral power versus wavelength for the GSR lighting devices identified with labels F18A-F18C, respectively, in FIG. 18, with increased red phosphor loading exhibited from FIG. 18A to FIG. 18B, and still further increased red phosphor loading exhibited from FIG. 18B to 18C. In FIG. 18A, the relative spectral power of the green peak is much greater than that of the red peak; in FIG. 18B, the relative spectral power of the green and red peaks is approaching parity; and in FIG. 18C, the relative spectral power of the red peak is much greater than that of the green peak.

FIG. 19 is a plot of Lumen Equivalent Ratio (LER) (in lumens/Watt-optical) versus CCx, comparing results of simulations of BSY (blue shifted yellow, including blue LED arranged to stimulate yellow phosphor) devices at different phosphor loadings to results of simulations of GSR (green shifted yellow, including green LED arranged to stimulate red phosphor) devices at different phosphor loadings. A first enlarged indicator 1901 is provided for the phosphor loading required to attain a 2700K color point for a BSY device in combination with a red LED, and a second enlarged indicator 1902 is provided for a GSR device in combination with a blue LED to attain the 2700K color point.

FIG. 20 is a plot of Stokes' Shift (%) versus CCx, comparing results of simulations of BSY (blue shifted yellow, including blue LED arranged to stimulate yellow phosphor) devices at different phosphor loadings to results of simulations of GSR (green shifted yellow, including green LED arranged to stimulate red phosphor) devices at different phosphor loadings. A first enlarged indicator 2001 is provided the phosphor loading require to attain a 2700K color point for a BSY device in combination with a red LED, and second enlarged indicator 2002 is provided for a GSR device in combination with a blue LED to attain the 2700K color point. As shown in FIG. 20, the GSR device embodies a substantially lower Stokes' shift than a BSY device at all CCx values, including a difference of 20% (BSY) versus 12% (GSR) at the representative 2700K color point.

FIG. 21 is a plot of CRI versus blue led peak wavelength (nm) for nine simulated GSR+B lighting devices at a CCT of 4000K, with each device containing a different green led (with dominant wavelengths ranging from 503 nm to 548 nm, respectively), a blue led, and a BOSE red phosphor. As shown in FIG. 21, among these simulation results, the highest CRI is attained with use of a green LED having a dominant wavelength of 532 nm (in conjunction with a blue LED having a peak wavelength of about 457 nm), with the next highest CRI values attained by use of green LEDs having dominant wavelengths of 527 nm and 528 nm, respectively.

FIG. 22 is a plot of CRI versus blue led peak wavelength (nm) for nine simulated GSR+B lighting devices at a CCT of 4000K, with each device containing a different green led (with dominant wavelengths ranging from 503 nm to 548 nm, respectively), a blue led, and a nitride red 604 nm phosphor. As shown in FIG. 22, among these simulation results, the highest CRI is attained with use of a green LED having a dominant wavelength of 548 nm, with lower CRI attained with use green LEDs having progressively shorter dominant wavelengths.

FIG. 23 is a plot of CRI versus blue led peak wavelength (nm) for nine simulated GSR+B lighting devices at a CCT 4000K, with each device containing a different green led (with dominant wavelengths ranging from 503 nm to 548 nm, respectively), a blue led, and a nitride 598 red phosphor. As shown in FIG. 23, among these simulation results, the highest CRI is attained with use of a green LED having a dominant wavelength of 543 nm (in conjunction with a blue LED having a peak wavelength of about 457 nm), with the next highest CRI values attained by use of green LEDs having dominant wavelengths of 538 nm and 548 nm, respectively.

FIGS. 24A, 25A, 26A, and 27A embody plots of CRI Ra, and FIGS. 24B, 25B, 26B, and 27B embody plots of LEP luminous efficiency for modeled (simulated) GSR+B lighting devices at correlative color temperatures of 3000K, 4000K, 5000K, and 6500K, respectively. A desirable GSR+B lighting device would provide good color rendering (i.e., high CRI Ra and/or high CQS) simultaneously with high luminous efficiency.

Figure 24A:
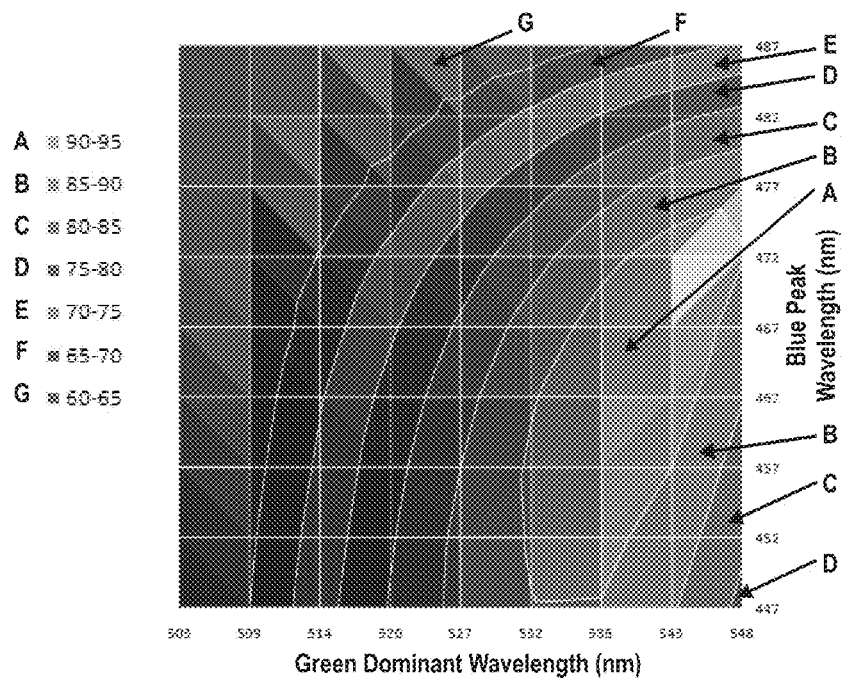
FIG. 24A is a plot of CRI Ra for a modeled GSR+B lighting device at 3000K including a nitride red 598 nm (dominant wavelength) phosphor, as a function of variable blue LED wavelength (y-axis), and variable green LED wavelength (x-axis).
Figure 24B:
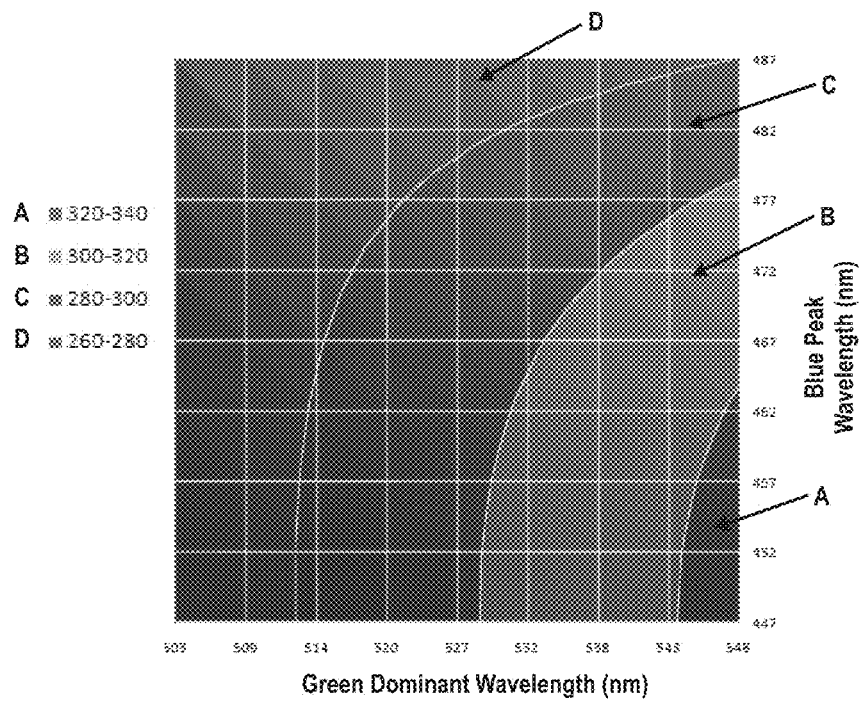
FIG. 24B is a plot of LEP luminous efficacy (lumens/watt optical) for the modeled GSR+B lighting device of FIG. 24A at 3000K.

FIG. 24A is a plot of CRI Ra for a modeled GSR+B lighting device at 3000K including a nitride red 598 nm (dominant wavelength) phosphor, as a function of variable blue LED wavelength (y-axis), and variable green LED wavelength (x-axis). FIG. 24B is a plot of LEP luminous efficacy (lumens/watt optical) for the modeled GSR+B lighting device of FIG. 24A at 3000K.

FIG. 25A is a plot of CRI Ra for a modeled GSR+B lighting device at 4000K including a nitride red 598 nm (dominant wavelength) phosphor, as a function of variable blue LED wavelength (y-axis), and variable green LED wavelength (x-axis). FIG. 25B is a plot of LEP luminous efficacy (lumens/watt optical) for the modeled GSR+B lighting device of FIG. 25A at 4000K.

FIG. 26A is a plot of CRI Ra for a modeled GSR+B lighting device at 5000K including a nitride red 598 nm (dominant wavelength) phosphor, as a function of variable blue LED wavelength (y-axis), and variable green LED wavelength (x-axis). FIG. 26B is a plot of LEP luminous efficacy (lumens/watt optical) for the modeled GSR+B lighting device of FIG. 26A at 5000K.

Figure 27A:
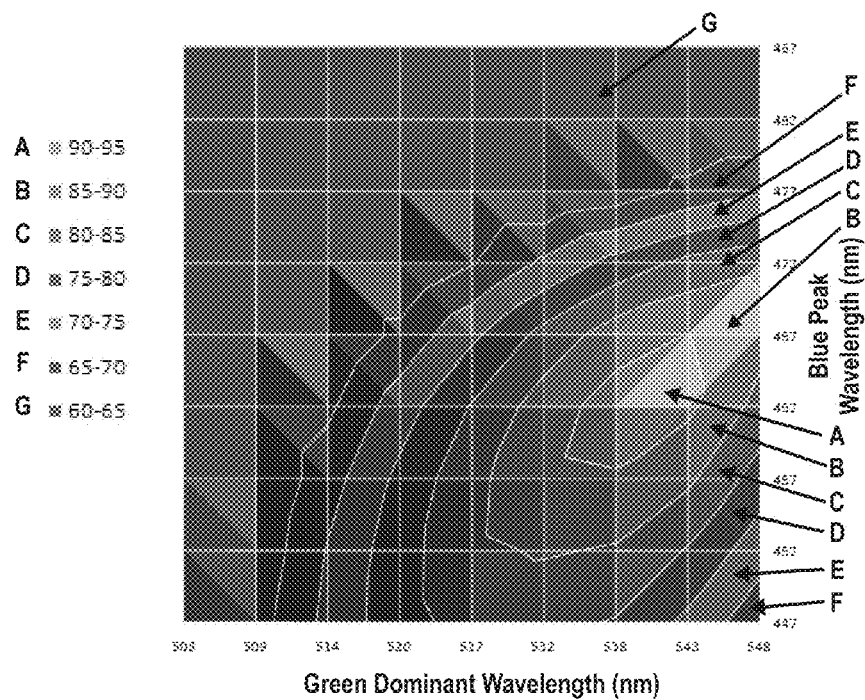
FIG. 27A is a plot of CRI Ra for a modeled GSR+B lighting device at 6500K including a nitride red 598 nm (dominant wavelength) phosphor, as a function of variable blue LED wavelength (y-axis), and variable green LED wavelength (x-axis).
Figure 27B:
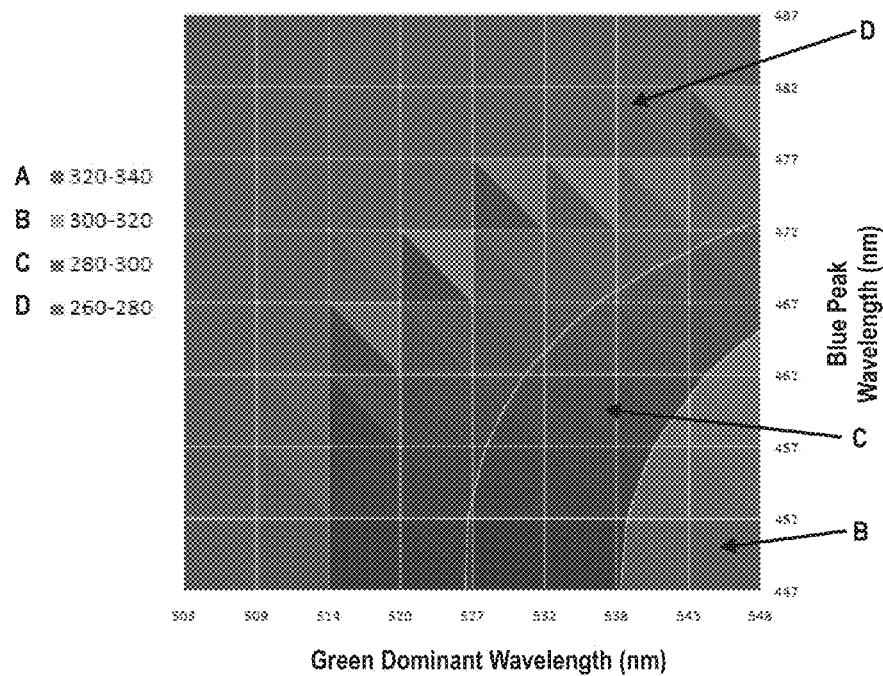
FIG. 27B is a plot of LEP luminous efficacy (lumens/watt optical) for the modeled GSR+B lighting device of FIG. 27A at 6500K.

FIG. 27A is a plot of CRI Ra for a modeled GSR+B lighting device at 6500K including a nitride red 598 nm (dominant wavelength) phosphor, as a function of variable blue LED wavelength (y-axis), and variable green LED wavelength (x-axis). FIG. 27B is a plot of LEP luminous efficacy (lumens/watt optical) for the modeled GSR+B lighting device of FIG. 27A at 6500K.

Comparing FIGS. 24A, 25A, 26A, and 27A, it is apparent that the regions embodying potential combinations of blue and green LEDs providing high color rendering index (e.g., CRI Ra>90) are reduced in size with an increase in CCT. Similarly, comparing FIGS. 24B, 25B, 26B, and 27B, the regions embodying high luminous efficiency are also reduced in size with an increase in CCT.

FIG. 28A is a plot of LEP luminous efficiency (lumens/watt optical) versus correlative color temperature (CCT) for a modeled GSR+B lighting device including a nitride red 598 nm (dominant wavelength) phosphor, a green 536 nm (dominant wavelength) LED, and a blue 459 nm (peak wavelength) LED, for CCT values from 2000K to 10000K. The plot of FIG. 28A shows a maximum luminous efficiency at a CCT value of about 3000K.

FIG. 28B is a plot of CRI Ra versus CCT for the modeled GSR+B lighting device of FIG. 28A, for CCT values from 2000K to 10000K. The plot of FIG. 28B shows a maximum CRI of about 92.7 at a CCT of about 2400K, with high CRI values of 90 or greater over a CCT range of from about 2200K to about 6000K.

Figure 29:
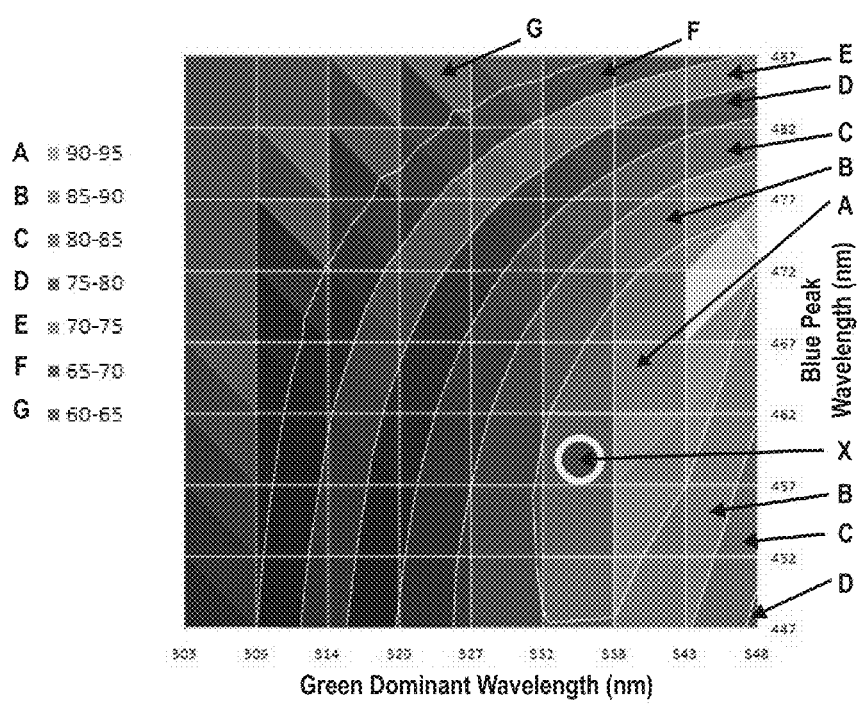
FIG. 29 is a plot of CRI Ra as a function of variable blue LED peak wavelength (y-axis), and variable green LED dominant wavelength (x-axis) for the modeled lighting device of FIGS. 28A-28B at 3000K.

FIG. 29 is a plot of CRI Ra as a function of variable blue LED peak wavelength (y-axis), and variable green LED dominant wavelength (x-axis) for the modeled lighting device of FIGS. 28A-28B at 3000K, represented by data point "X." The modeled lighting device exhibits a CRI of between 90-95 at 3000K.

FIG. 30 is a plot of u', v' chromaticity coordinates (represented by indicator 2001) for the modeled lighting device of FIGS. 28A, 28B, and 29 at 3000K superimposed over a portion of a (CIE 1976) chromaticity diagram, with the color coordinates for the device lying with the ANSI white region on or along the blackbody locus 3004. Segments 3002, 3003 of the sRGB gamut are further illustrated for reference.

FIGS. 31A-31C provide tabulated simulation parameters and results for a simulation including a GSR+B lighting device including a nitride red 618 nm (dominant wavelength) phosphor, a green 536 nm (dominant wavelength) LED, and a blue 459 nm (peak wavelength) LED, for CCT of 4000K. The sixth through eighth rows below the header of each table correspond to the nitride red 618 nm phosphor (labeled RN618), the green LED, and the blue LED, respectively. The last row in each instance corresponds to the combined output of the red phosphor, the green LED, and the blue LED.

In FIG. 31A, the six rightmost columns provide values for color coordinate x, color coordinate y, color coordinate u', color coordinate v', dominant wavelength (nm), and peak wavelength (nm). In FIG. 31B, the second through thirteenth columns provide values for comp, purity, correlated color temperature (CCT), full width half maximum (FWHM), radiant intensity per part (mW/part), lumens per part (L/prt), forward voltage, forward current, power, for luminous efficacy (l/w), radiant intensity (mW), and radiant intensity percentage (mW %), respectively. In FIG. 31C, the second through eleventh columns provide values for lumens (L) (based on assumed 100 lumen output), lumen percentage (L %), power (W), LEP luminous efficacy (lumens/watt optical), and wall plug efficiency (representing a ratio of optical visible and electrical power), bin, red peak, green peak, and blue peak, respectively. As shown in FIG. 31C, the simulation provides for the following lumen percentage outputs: red phosphor=48.3%; green LED=48.5%; and blue LED=3.3%, with overall peak wavelengths of 612 nm (red), 528 nm (green), and 459 nm (blue).

FIG. 32 is a 1931 CIE Chromaticity Diagram over which output of the GSR+B device simulation described in connection with FIGS. 31A-31C (at a CCT value of 4000 K) have been superimposed, with comparison of the color space described in U.S. Pat. No. 7,213,940. In such figure: item (i) represents the output color point; item (ii) illustrates the gamut of the sRGB color space (triangular shape); item (iii) represents the color space described in U.S. Pat. No. 7,213, 940; item (iv) represents results of 12 green LED/phosphor combinations with different phosphor loading (described in connection with FIG. 18); and item (v) represents Xbins (ANSI bins) for a theoretical blue shifted green emitter along a green emitter tie line of about 560 nm. The curved line extending from the rightmost corner of the triangular gamut of the sRGB color space into the interior thereof represents the blackbody locus.

FIG. 33 is a plot of relative spectral power (percent) versus wavelength resulting from the GSR+B device simulation described in connection with FIGS. 31A-31C at a CCT of 4000K. As shown in FIG. 33, the blue LED has a peak wavelength of about 460 nm, the green LED has a peak wavelength of about 530 nm, and the red phosphor has a peak wavelength of about 610 nm. The width of the red phosphor peak is wider than the widths of each of the blue and green peaks.

FIG. 34 is a table identifying LED output values resulting from the GSR+B device simulation described in connection with FIGS. 31A-31O at a CCT of 4000K, including values for color coordinates x,y, CRI Ra (value of 91), LEP luminous efficacy (lumens/watt optical, and CRI R9 (i.e., value for the ninth sample according to CRI. FIG. 35 is a table identifying fixture output values for the resulting from the GSR+B device simulation described in connection with FIGS. 31A-31C at a CCT of 4000K, including a value of 92.7 for color quality scale (CQS) and a gamut area index (GAI) value of 85%.

FIG. 36A is a bar chart embodying CRI performance for the GSR+B device simulation described in connection with FIGS. 31A-31C at a CCT of 4000K. The rightmost bar of FIG. 13A embodies CRI Ra, with a value greater than 90. FIG. 36B is a bar chart embodying CQS performance for the GSR+B device simulation described in connection with FIGS. 31A-31C at a CCT of 4000K. As shown in FIG. 36B, values for Q2 through Q13 are 90 or greater, with values for Q1, Q14, and Q15 being above 75.

Figures 37, 38:
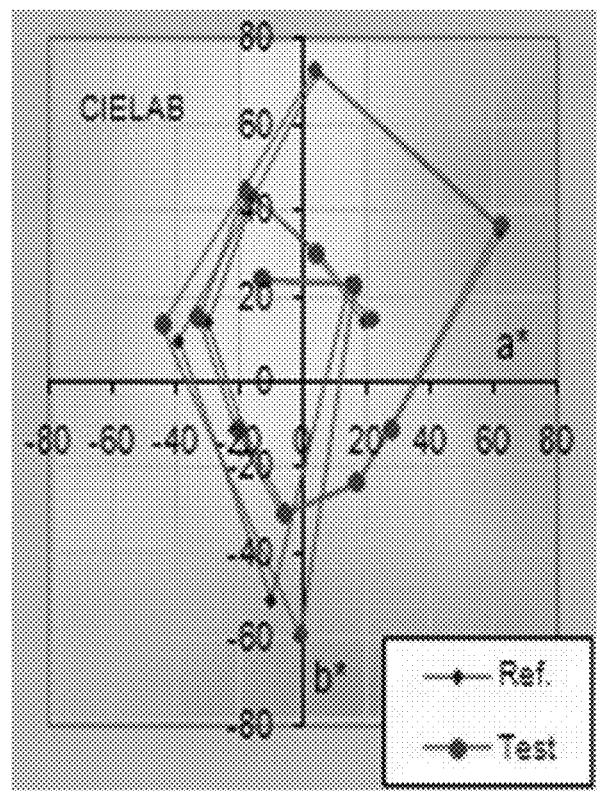
FIG. 37 is a table identifying output values for a NIST Colorview software analysis of the GSR+B device simulation described in connection with FIGS. 31A-31O at a CCT of about 4000K.
FIG. 38 is a CIELAB (CIEL*a*b*) diagram (generated by NIST Colorview software) depicting CRI performance for the GSR+B device simulation described in connection with FIGS. 31A-31C at a CCT of 4000K, with comparison between the fourteen CRI reference color samples and test values for these fourteen samples as obtained from the simulation.

FIG. 37 is a table identifying output values for a NIST Colorview software analysis of the GSR+B device simulation described in connection with FIGS. 31A-31C at a CCT of about 4000K. Such table includes a CRI Ra value of 91, R9-12 value of 83, R9 value of 96, LER (lm/W) value of 302, CQS value of 93, and a gamut area index (GAI) value of 85%.

FIG. 38 is a CIELAB (CIEL*a*b*) diagram (generated by NIST Colorview software) depicting CRI performance for the GSR+B device simulation described in connection with FIGS. 31A-31C at a CCT of 4000K, with comparison between the fourteen CRI reference color samples and test values for these fourteen samples as obtained from the simulation.

FIG. 39 is a CIELAB (CIEL*a*b*) diagram (generated by NIST Colorview software) depicting CQS performance for the GSR+B device simulation described in connection with FIGS. 31A-31C at a CCT of 4000K, with comparison between the fifteen CQS reference color samples and test values for these fifteen samples as obtained from the simulation.

FIGS. 40A-40B are color quality diagrams for the GSR+B device simulation described in connection with FIGS. 31A-31C at a CCT of 4000K.

In certain embodiments, one or more GSR+B devices as described herein may be embodied in backlights for display panels. Various embodiments including backlights are illustrated in FIGS. 41-43.

FIG. 41 is a perspective assembly view of a display device 4100 including a substrate 4101 supporting multiple solid state lamps 4104A-4104X arranged to backlight (e.g., directly backlight) a display (e.g., LCD) panel 4109, such as may be arranged to display text, images, and/or graphics. (Although FIG. 41 shows the display device 4100 having thirty-two solid state light emitters, it will be readily apparent to one skilled in the art that any suitable number of emitters may be provided. For this reason, the designation "X" is used to represent the last element in a series, with the understanding that the suffix "X" in such context represents a variable that could represent any desired number of elements. This convention is used elsewhere within this document.) In certain embodiments, each solid state lamp 4104A-4104X comprises a GSR+B solid state lighting device. Each GSR+B lighting device may include additional solid state emitters and/or lumiphors as described previously herein. In other embodiments, some solid state lamps 4104A-4104X comprise GSR+B solid state lighting device, and others do not. In certain embodiments, each solid state lamp 4104A-4104X comprises a multi-chip solid state emitter package. Each emitter in a multi-chip solid state emitter package may be independently controlled. In certain embodiments, each solid state lamp 4104A-4104X is, or discrete groups of solid state lamps are, independently controlled with respect to at least one of intensity, color, and color temperature. Independent control of different solid state lamp 4104A-4104X may be used to provide local dimming and/or local coloring/color enhancement. In certain embodiments, the display panel 4109 is arranged to display three-dimensional images.

FIG. 42 is a perspective assembly view of a display device 4200 including a waveguide 4211 arranged to be lit along edges thereof by multiple solid state light emitting devices 4204A-4204X, 4205A-4205X as described herein, with the waveguide 4211 arranged to backlight a display (e.g., LCD) panel. Although FIG. 42 illustrates only two edges of the waveguide 4211 as having associated light emitting devices 4204A-4204X, 4205A-4205X, it is to be understood that all four edges of the waveguide 4211 may have associated solid state light emitters. In certain embodiments, each solid state lamp 4204A-4204X, 4205A-4205X comprises a GSR+B solid state lighting device. Each GSR+B lighting device may include additional solid state emitters and/or lumiphors as described previously herein. In certain embodiments, each solid state lamp 4204A-4204X, 4205A-4205X comprises a multi-chip solid state emitter package, in which each solid state emitter thereof may be independently controlled. In certain embodiments, each solid state lamp 4204A-4204X, 4205A-4205X, or discrete groups of solid state lamps are, independently controlled with respect to at least one of intensity, color, and color temperature. Independent control of different solid state lamp 4204A-4204X, 4205A-4205X may be used to provide local dimming and/or local coloring/color enhancement. In certain embodiments, a display panel may be backlit by a combination of direct backlighting and edge-type backlighting, with at least some (and in some cases all) lighting devices thereof comprising GSR+B lamps as disclosed herein.

FIG. 43 is a schematic view of a light emitting array 4300 or group including multiple GSR+B solid state lamps 4301A-4301X as described herein, optionally supported by a substrate 4307, and in communication with at least one controller 4308 or other control device. The controller 430, which preferably includes a microprocessor arranged to implement a machine-readable instruction set, is arranged to receive power from a power source 4312. Operation of the lighting device 4300 may optionally be responsive to output signals of one or more sensors 4313 (e.g., arranged to sense electrical, optical, and/or thermal properties and/or environmental conditions) in communication with the controller 4308. Each lighting device 4301A-4301X, and preferably each solid state emitter within or associated with each lighting device, may be independently controlled. Although FIG. 43 illustrates each lamp 4301A-4301X as being supported by a common substrate 4307, in certain embodiments, different lighting devices of an array or group 4300 may be supported on different substrates optionally spatially segregated from one another. The controller 4308 or other control element may be integrated with a lighting device including one or more of the lamps 4301A-4301X, or the controller 4308 may be remotely located therefrom. In certain embodiments, the controller 4308 includes a communication element (not shown) arranged to receive signals from a network, remote device, or wireless link to affect control or operation of the lamps 4301A-4301X. The array or group 4300 may comprise a backlight, light fixture, group of lighting devices or light fixtures, or other desirable implementation as described or suggested herein.

Certain embodiments of the invention are directed to methods for illuminating an object, a space, or an environment, utilizing at least one GSR+B lighting device as described herein.

In one embodiment, a lighting device includes: a first solid state emitter comprising a first dominant wavelength; a second solid state light emitter comprising a second dominant wavelength that differs from the first dominant wavelength by at least 20 nm; and a lumiphor arranged to receive emissions from one or more of (i) the at least one first solid state light emitter and (ii) the at least one second solid state light emitter, and responsively generate lumiphor emissions; wherein the lighting device is arranged to output combined emissions including at least a portion of light emissions generated by each of the first solid state light emitter, the second solid state light emitter, and the lumiphor; and wherein the combined emissions embody at least one of (a) a color rendering index (CRI Ra) value of at least 85 over a correlative color temperature (CCT) range of from 5000K to 3000K, and (b) a color quality scale (CQS) value of at least 85 over a correlative color temperature (CCT) range of from 5000K to 3000K. Such embodiment may be further characterized by one or more of the following features: (A) the combined emissions have a luminous efficacy of at least 280 lumens/watt optical; (B) the lighting device is devoid of any lumiphor (i) comprising a peak wavelength in a range of from 555 nm to 590 nm, and (ii) being arranged to receive emissions from a solid state light emitter comprising a peak wavelength in a range of from 430 nm to 480 nm; (C) the first solid state light emitter has a dominant wavelength in a range of from 500 nm to 570 nm, and the second solid state light emitter has a peak wavelength in a range of from 430 nm to 480 nm; (D) the lumiphor has a peak wavelength in a range of from 591 nm to 700 nm; (E) a combination of (A) light exiting said lighting device that was emitted by said first solid state light emitter, (B) light exiting said lighting device that was emitted by said second solid state light emitter, and (C) light exiting said lighting device that was emitted by said lumiphor, in an absence of any additional light, would produce a mixture of light having x, y coordinates on a 1931 CIE Chromaticity Diagram that define a point within ten MacAdam ellipses of at least one point on the blackbody locus on a 1931 CIE Chromaticity diagram; (F) the lighting device is devoid of any solid state light emitter comprising a phosphide-based active region; and (G) a backlight for a display element arranged to display text and/or images may include a plurality of such lighting devices; (H) such lighting device may be utilized in a method of illuminating an object, a space, or an environment.

In one embodiment, a lighting device includes: at least one first solid state light emitter comprising a dominant wavelength in a range of from 500 nm to 570 nm; at least one first lumiphor arranged to receive emissions from the at least one first solid state light emitter and responsively generate lumiphor emissions comprising a peak wavelength in a range of from 591 nm to 700 nm; at least one second solid state light emitter comprising a peak wavelength in a range of from 430 nm to 480 nm; at least one second lumiphor arranged to receive emissions from the at least one second solid state light emitter and responsively generate lumiphor emissions comprising a peak wavelength in a range of from 591 nm to 700 nm; at least one third solid state light emitter comprising a peak wavelength in a range of from 430 nm to 480 nm; and at least one third lumiphor arranged to receive emissions from the at least one third solid state light emitter and responsively generate lumiphor emissions comprising a peak wavelength in a range of from 500 nm to 570 nm. Such embodiment may be further characterized by one or more of the following features: (A) the at least one first solid state light emitter, the at least one second solid state light emitter, and the at least one third solid state light emitter are independently controllable relative to one another; (B) the lighting device comprises a control circuit arranged to independently supply current to the at least one first solid state light emitter, the at least one second solid state light emitter, and the at least one third solid state light emitter; (C) the lighting device is arranged to output combined emissions including at least a portion of light emissions generated by each of the at least one first solid state light emitter, the at least one second solid state light emitter, the at least one third solid state light emitter, the at least one first lumiphor, the at least one second lumiphor, and the at least one third lumiphor; (D) the at least one first lumiphor is spatially segregated from any of (i) the at least one first solid state light emitter, (ii) the at least one second solid state light emitter, and (iii) the at least one third solid state light emitter; (E) a combination of (i) light exiting said lighting device that was emitted by said at least one first solid state light emitter, (ii) light exiting said lighting device that was emitted by said at least one second solid state light emitter, (iii) light exiting said lighting device that was emitted by said at least one third solid state light emitter, (iv) light exiting said lighting device that was emitted by said at least one first lumiphor, (v) light exiting said lighting device that was emitted by said at least one second lumiphor, and (vi) light exiting said lighting device that was emitted by said at least one third lumiphor, in an absence of any additional light, would produce a mixture of light having x, y coordinates on a 1931 CIE Chromaticity Diagram that define a point within ten MacAdam ellipses of at least one point on the blackbody locus on a 1931 CIE Chromaticity diagram; (F) any one or more of the at least one first solid state light emitter, the at least one second solid state light emitter, and the at least one third solid state light emitter, comprises multiple solid state light emitters; (G) the lighting device comprises one or more of the following features (i) to (iii): (i) the at least one first solid state light emitter comprises multiple first solid state light emitters, with at least two first solid state light emitters of the multiple first solid state light emitters comprising dominant wavelengths that differ from one another by at least 10 nm, (ii) the at least one second solid state light emitter comprises multiple second solid state light emitters, with at least two second solid state light emitters of the multiple second solid state light emitters comprising peak wavelengths that differ from one another by at least 10 nm, and (iii) the at least one third solid state light emitter comprises multiple third solid state light emitters, with at least two third solid state light emitters of the multiple third solid state light emitters comprising peak wavelengths that differ from one another by at least 10 nm; (H) any one or more of the at least one lumiphor, the at least one second lumiphor, and the at least one third lumiphor comprises multiple lumiphors comprising peak wavelengths that differ from one another by at least 10 nm; (I) the lighting device is devoid of any solid state light emitter comprising a phosphide-based active region; (J) the lighting device comprises a single leadframe (arranged to conduct electrical power to the at least one first, second, and third solid state light emitters), a single reflector (arranged to reflect at least a portion of light emanating from the at least one first, second, and third solid state light emitters), a single submount (supporting the at least one first, second, and third solid state light emitters), and/or a single lens (arranged to transmit at least a portion of light emanating from each of the at least one first, second, and third solid state light emitters); (K) the combined emissions embody at least one of (a) a color rendering index (CRI Ra) value of at least 85 over a correlative color temperature (CCT) range of from 5000K to 3000K, and (b) a color quality scale (CQS) value of at least 85 over a correlative color temperature (CCT) range of from 5000K to 3000K, optionally wherein the combined emissions have a luminous efficacy of at least 280 lumens/watt optical; (L) a backlight for a display element arranged to display text and/or images may include a plurality of such lighting devices; (M) the lighting device includes a control circuit arranged to supply electric current independently to the at least one first solid state light emitter and the at least one second solid state light emitter of each lighting device of the plurality of lighting devices, optionally wherein each lighting device of the plurality of lighting devices is independently controllable relative to one another; and (N) such lighting device may be utilized in a method of illuminating an object, a space, or an environment.

In one embodiment, a lighting device includes: at least one first solid state light emitter comprising a dominant wavelength in a range of from 500 nm to 570 nm; at least one first lumiphor arranged to receive emissions from the at least one first solid state light emitter and responsively generate lumiphor emissions comprising a peak wavelength of at least about 591 nm; at least one second solid state light emitter comprising a peak wavelength in a range of from 430 nm to 470 nm; and at least one third solid state light emitter comprising a peak wavelength in a range of from 470 to 500 nm; and wherein the lighting device is arranged to output combined emissions including at least a portion of light emissions generated by each of the at least one first solid state light emitter, the at least one first lumiphor, the at least one second solid state light emitter, and the at least one third solid state light emitter. Such embodiment may be further characterized by one or more of the following features: (A) the lighting device is devoid of any lumiphor (a) comprising a peak wavelength in a range of from 555 nm to 590 nm, and (b) being arranged to receive emissions from the second solid state light emitter; (B) the at least one third solid state light emitter is independently controllable relative to the at least one first solid state light emitter and the at least one second solid state light emitter; (C) the at least one first solid state light emitter, the at least one second solid state light emitter, and the at least one first solid state light emitter are independently controllable relative to one another; (D) a combination of (i) light exiting said lighting device that was emitted by said at least one first solid state light emitter, (ii) light exiting said lighting device that was emitted by said at least one second solid state light emitter, (iii) light exiting said lighting device that was emitted by said at least one third solid state light emitter and (iv) light exiting said lighting device that was emitted by said at least one lumiphor, in an absence of any additional light, would produce a mixture of light having x, y coordinates on a 1931 CIE Chromaticity Diagram that define a point within ten MacAdam ellipses of at least one point on the blackbody locus on a 1931 CIE Chromaticity diagram; (E) any one or more of the at least one first solid state light emitter, the at least one second solid state light emitter, and the at least one third solid state light emitter comprises multiple solid state light emitters; (F) the lighting device comprises one or more of the following features (i) to (iii): (i) the at least one first solid state light emitter comprises multiple first solid state light emitters, with at least two first solid state light emitters of the multiple first solid state light emitters comprising dominant wavelengths that differ from one another by at least 10 nm, (ii) the at least one second solid state light emitter comprises multiple second solid state light emitters, with at least two second solid state light emitters of the multiple second solid state light emitters comprising peak wavelengths that differ from one another by at least 10 nm, and (iii) the at least one third solid state light emitter comprises multiple third solid state light emitters, with at least two third solid state light emitters of the multiple third solid state light emitters comprising peak wavelengths that differ from one another by at least 10 nm; (H) wherein the at least one first lumiphor comprises multiple lumiphors comprising peak wavelengths that differ from one another by at least 10 nm; (I) the lighting device is devoid of any solid state light emitter comprising a phosphide-based active region; (J) the lighting device comprises a single leadframe (arranged to conduct electrical power to the at least one first, second, and third solid state light emitters), a single reflector (arranged to reflect at least a portion of light emanating from the at least one first, second, and third solid state light emitters), a single submount (supporting the at least one first, second, and third solid state light emitters), and/or a single lens (arranged to transmit at least a portion of light emanating from each of the at least one first, second, and third solid state light emitters); (K) the at least one first lumiphor is spatially segregated from the at least one first solid state light emitter; (L) the combined emissions embody at least one of (a) a color rendering index (CRI Ra) value of at least 85 over a correlative color temperature (CCT) range of from 5000K to 3000K, and (b) a color quality scale (CQS) value of at least 85 over a correlative color temperature (CCT) range of from 5000K to 3000K, optionally wherein the combined emissions have a luminous efficacy of at least 280 lumens/watt optical; (L) a backlight for a display element arranged to display text and/or images may include a plurality of such lighting devices; (M); such lighting device may be utilized in a method of illuminating an object, a space, or an environment, optionally including varying the supply of current to the at least one third solid state light emitter to adjust correlative color temperature of aggregated emissions exiting the lighting device.

In one embodiment, a lighting device includes: at least one first solid state light emitter comprising a dominant wavelength in a range of from 500 nm to 570 nm; at least one first lumiphor arranged to receive emissions from the at least one first solid state light emitter and responsively generate lumiphor emissions comprising a peak wavelength in a range of from 591 nm to 700 nm; at least one second solid state light emitter comprising a peak wavelength in a range of from 430 nm to 480 nm; at least one third solid state light emitter comprising a peak wavelength in a range of from 500 nm to 570 nm; and at least one fourth solid state light emitter comprising a peak wavelength in a range of from 591 to 700 nm. Such embodiment may be further characterized by one or more of the following features: (A) the lighting device is devoid of any lumiphor (i) comprising a peak wavelength in a range of from 555 nm to 590 nm, and (ii) being arranged to receive emissions from the second solid state light emitter; (B) the lighting device is arranged to output combined emissions including at least a portion of light emissions generated by each of the at least one first, at least one second, and at least one third solid state light emitters; (C) each of the at least one first solid state light emitter, the at least one second solid state light emitter, the at least one third solid state light emitter, and the at least one fourth solid state light emitter is independently controllable relative to one other; (D) the lighting device includes a control circuit arranged to independently supply current to the at least one first solid state light emitter, the at least one second solid state light emitter, the at least one third solid state light emitter, and the at least one fourth solid state light emitter; (E) a combination of (i) light exiting said lighting device that was emitted by said at least one first solid state light emitter, (ii) light exiting said lighting device that was emitted by said at least one second solid state light emitter, (iii) light exiting said lighting device that was emitted by said at least one third solid state light emitter, (iv) light exiting said lighting device that was emitted by said at least one third solid state light emitter, and (v) light exiting said lighting device that was emitted by said at least one first lumiphor, in an absence of any additional light, would produce a mixture of light having x, y coordinates on a 1931 CIE Chromaticity Diagram that define a point within ten MacAdam ellipses of at least one point on the blackbody locus on a 1931 CIE Chromaticity diagram; (F) any one or more of the at least one first solid state light emitter, the at least one second solid state light emitter, and the at least one third solid state light emitter, comprises multiple solid state light emitters; (G) the lighting device comprises one or more of the following features (i) to (iii): (i) the at least one first solid state light emitter comprises multiple first solid state light emitters, with at least two first solid state light emitters of the multiple first solid state light emitters comprising dominant wavelengths that differ from one another by at least 10 nm, (ii) the at least one second solid state light emitter comprises multiple second solid state light emitters, with at least two second solid state light emitters of the multiple second solid state light emitters comprising peak wavelengths that differ from one another by at least 10 nm, and (iii) the at least one third solid state light emitter comprises multiple third solid state light emitters, with at least two third solid state light emitters of the multiple third solid state light emitters comprising peak wavelengths that differ from one another by at least 10 nm; (H) any one or more of the at least one lumiphor, the at least one second lumiphor, and the at least one third lumiphor comprises multiple lumiphors comprising peak wavelengths that differ from one another by at least 10 nm; (I) the at least one first lumiphor is spatially segregated from the at least one first solid state light emitter; (J) the lighting device comprises a single leadframe (arranged to conduct electrical power to the at least one first, second, and third solid state light emitters), a single reflector (arranged to reflect at least a portion of light emanating from the at least one first, second, and third solid state light emitters), a single submount (supporting the at least one first, second, and third solid state light emitters), and/or a single lens (arranged to transmit at least a portion of light emanating from each of the at least one first, second, and third solid state light emitters; (K) a backlight for a display element arranged to display text and/or images may include a plurality of such lighting devices; and (L); such lighting device may be utilized in a method of illuminating an object, a space, or an environment, optionally including varying the supply of current to the at least one third solid state light emitter to adjust correlative color temperature of aggregated emissions exiting the lighting device.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Any of the various features and elements as disclosed herein may be combined with one or more other disclosed features and elements unless indicated to the contrary herein. Correspondingly, the invention as hereinafter claimed is intended to be broadly construed and interpreted, as including all such variations, modifications and alternative embodiments, within its spirit and scope.

What is claimed is:
1. A lighting device comprising:
at least one first solid state light emitter comprising a dominant wavelength in a range of from 500 nm to 570 nm;
at least one second solid state light emitter comprising a peak wavelength in a range of from 430 nm to 480 nm; and
at least one first lumiphor arranged to receive emissions from the at least one first solid state light emitter and responsively generate lumiphor emissions comprising a peak wavelength of at least about 591 nm;
wherein the lighting device is arranged to output combined emissions including at least a portion of light emissions generated by each of the at least one first solid state light emitter, the at least one second solid state light emitter, and the at least one first lumiphor; and wherein the lighting device is devoid of any lumiphor (a) comprising a peak wavelength in a range of from 555 nm to 590 nm, and (b) being arranged to receive emissions from the second solid state light emitter.

2. The lighting device of claim 1, wherein the at least one first solid state light emitter and the at least one second solid state light emitter are independently controllable relative to one another.

3. The lighting device of claim 2, further comprising a control circuit arranged to independently supply current to the at least one first solid state light emitter and the at least one second solid state light emitter.

4. The lighting device of claim 1, wherein the lumiphor emissions generated by the at least one first lumiphor have a peak wavelength of less than or equal to about 700 nm.

5. The lighting device of claim 1, further comprising at least one second lumiphor (a) comprising a peak wavelength in a range of from 555 nm to 590 nm, and (b) being arranged to receive emissions from the at least one first solid state light emitter.

6. The lighting device of claim 1, further comprising at least one third solid state light emitter comprising a peak wavelength in a range of from 481 to 499 nm.

7. The lighting device of claim 1, wherein the at least one third solid state light emitter is independently controllable relative to the at least one first solid state light emitter and the at least one second solid state light emitter.

8. The lighting device of claim 1, wherein a combination of (A) light exiting said lighting device that was emitted by said at least one first solid state light emitter, (B) light exiting said lighting device that was emitted by said at least one second solid state light emitter, and (C) light exiting said lighting device that was emitted by said at least one lumiphor, in an absence of any additional light, would produce a mixture of light having x, y coordinates on a 1931 CIE Chromaticity Diagram that define a point within ten MacAdam ellipses of at least one point on the blackbody locus on a 1931 CIE Chromaticity diagram.

9. The lighting device of claim 1, wherein any one or more of the at least one first solid state light emitter and the at least one second solid state light emitter comprises multiple solid state light emitters.

10. The lighting device of claim 1, comprising at least one of the following features:
(a) the at least one first solid state light emitter comprises multiple first solid state light emitters, with at least two first solid state light emitters of the multiple first solid state light emitters comprising dominant wavelengths that differ from one another by at least 10 nm; and
(b) the at least one second solid state light emitter comprises multiple second solid state light emitters, with at least two second solid state light emitters of the multiple second solid state light emitters comprising peak wavelengths that differ from one another by at least 10 nm.

11. The lighting device of claim 1, wherein the at least one first lumiphor comprises multiple lumiphors comprising peak wavelengths that differ from one another by at least 10 nm.

12. The lighting device of claim 1, being devoid of any solid state light emitter comprising a phosphide-based active region.

13. The lighting device of claim 1, wherein the at least one first lumiphor is spatially segregated from the at least one first solid state light emitter.

14. The lighting device of claim 1, comprising at least one of the following:
a single leadframe arranged to conduct electrical power to the at least one first solid state light emitter and the at least one second solid state light emitter;
a single reflector arranged to reflect at least a portion of light emanating from the at least one first solid state light emitter and the at least one second solid state light emitter;
a single submount supporting the at least one first solid state light emitter and the at least one second solid state light emitter; and
a single lens arranged to transmit at least a portion of light emanating from each of the at least one first solid state light emitter and the at least one second solid state light emitter.

15. The lighting device of claim 1, wherein the combined emissions embody at least one of (a) a color rendering index (CRI Ra) value of at least 85 over a correlative color temperature (CCT) range of from 5000K to 3000K, and (b) a color quality scale (CQS) value of at least 85 over a correlative color temperature (CCT) range of from 5000K to 3000K.

16. The lighting device of claim 15, wherein the combined emissions have a luminous efficacy of at least 280 lumens/watt optical.

17. A backlight for a display element arranged to display text and/or images, the backlight including a plurality of lighting devices according to claim 1.

18. The backlight according to claim 17, comprising a control circuit arranged to supply electric current independently to the at least one first solid state light emitter and the at least one second solid state light emitter of each lighting device of the plurality of lighting devices.

19. The backlight according to claim 17, wherein each lighting device of the plurality of lighting devices is independently controllable relative to one another.

20. A method comprising illuminating an object, a space, or an environment, utilizing a lighting device according to claim 1.

21. A lighting device comprising:
at least one first solid state light emitter comprising a dominant wavelength in a range of from 500 nm to 570 nm;
at least one second solid state light emitter comprising a peak wavelength in a range of from 430 nm to 480 nm; and
at least one first lumiphor arranged to receive emissions from the at least one first solid state light emitter and responsively generate lumiphor emissions comprising a peak wavelength of at least about 591 nm;
wherein the at least one first lumiphor is spatially segregated from the first solid state light emitter;
wherein the lighting device is arranged to output combined emissions including at least a portion of light emissions generated by each of the at least one first solid state light emitter, the at least one second solid state light emitter, and the at least one first lumiphor.

22. The lighting device of claim 21, wherein the lighting device is devoid of any lumiphor (a) comprising a peak wavelength in a range of from 555 nm to 590 nm, and (b) being arranged to receive emissions from the second solid state emitter.

23. The lighting device of claim 21, wherein the first solid state light emitter and the second solid state light emitter are independently controllable relative to one another.

24. The lighting device of claim 21, wherein a combination of (A) light exiting said lighting device that was emitted by said at least one first solid state light emitter, (B) light exiting said lighting device that was emitted by said at least one second solid state light emitter, and (C) light exiting said lighting device that was emitted by said at least one lumiphor, in an absence of any additional light, would produce a mixture of light having x, y coordinates on a 1931 CIE Chromaticity Diagram that define a point within ten MacAdam ellipses of at least one point on the blackbody locus on a 1931 CIE Chromaticity.

25. The lighting device of claim 21, wherein any one or more of the at least one first solid state light emitter and the at least one second solid state light emitter comprises multiple solid state light emitters.

26. The lighting device of claim 21, comprising at least one of the following features:
    (a) the at least one first solid state light emitter comprises multiple first solid state light emitters, with at least two first solid state light emitters of the multiple first solid state light emitters comprising dominant wavelengths that differ from one another by at least 10 nm; and
    (b) the at least one second solid state light emitter comprises multiple second solid state light emitters, with at least two second solid state light emitters of the multiple second solid state light emitters comprising peak wavelengths that differ from one another by at least 10 nm.

27. The lighting device of claim 21, wherein the at least one first lumiphor comprises multiple lumiphors comprising peak wavelengths that differ from one another by at least 10 nm.

28. The lighting device of claim 21, being devoid of any solid state light emitter comprising a phosphide-based active region.

29. The lighting device of claim 21, comprising at least one of the following:
    a single leadframe arranged to conduct electrical power to the at least one first solid state light emitter and the at least one second solid state light emitter;
    a single reflector arranged to reflect at least a portion of light emanating from the at least one first solid state light emitter and the at least one second solid state light emitter;
    a single submount supporting the at least one first solid state light emitter and the at least one second solid state light emitter; and
    a single lens arranged to transmit at least a portion of light emanating from each of the at least one first solid state light emitter and the at least one second solid state light emitter.

30. The lighting device of claim 21, wherein the combined emissions embody at least one of (a) a color rendering index (CRI Ra) value of at least 85 over a correlative color temperature (CCT) range of from 5000K to 3000K, and (b) a color quality scale (CQS) value of at least 85 over a correlative color temperature (CCT) range of from 5000K to 3000K.

31. The lighting device of claim 30, wherein the combined emissions have a luminous efficacy of at least 280 lumens/watt optical.

32. A backlight for a display element arranged to display text and/or images, the backlight including a plurality of lighting devices according to claim 21.

33. A method comprising illuminating an object, a space, or an environment, utilizing a lighting device according to claim 21.

34. A lighting device comprising:
    a first solid state emitter comprising a first dominant wavelength;
    a second solid state light emitter comprising a second dominant wavelength that differs from the first dominant wavelength by at least 20 nm; and
    a lumiphor arranged to receive emissions from one or more of (i) the at least one first solid state light emitter and (ii) the at least one second solid state light emitter, and responsively generate lumiphor emissions;
    wherein the lighting device is arranged to output combined emissions including at least a portion of light emissions generated by each of the first solid state light emitter, the second solid state light emitter, and the lumiphor; and
    wherein the combined emissions embody at least one of (a) a color rendering index (CRI Ra) value of at least 85 over a correlative color temperature (CCT) range of from 5000K to 3000K, and (b) a color quality scale (CQS) value of at least 85 over a correlative color temperature (CCT) range of from 5000K to 3000K.

35. The lighting device of claim 34, wherein the combined emissions have a luminous efficacy of at least 280 lumens/watt optical.

36. The lighting device of claim 34, wherein the lighting device is devoid of any lumiphor (a) comprising a peak wavelength in a range of from 555 nm to 590 nm, and (b) being arranged to receive emissions from a solid state light emitter comprising a peak wavelength in a range of from 430 nm to 480 nm.

37. The lighting device of claim 34, wherein the first solid state light emitter has a dominant wavelength in a range of from 500 nm to 570 nm, and the second solid state light emitter has a peak wavelength in a range of from 430 nm to 480 nm.

38. The lighting device of claim 34, wherein the lumiphor has a peak wavelength in a range of from 591 nm to 700 nm.

39. The lighting device of claim 34, wherein a combination of (A) light exiting said lighting device that was emitted by said first solid state light emitter, (B) light exiting said lighting device that was emitted by said second solid state light emitter, and (C) light exiting said lighting device that was emitted by said lumiphor, in an absence of any additional light, would produce a mixture of light having x, y coordinates on a 1931 CIE Chromaticity Diagram that define a point within ten MacAdam ellipses of at least one point on the blackbody locus on a 1931 CIE Chromaticity diagram.

40. The lighting device of claim 34, being devoid of any solid state light emitter comprising a phosphide-based active region.

41. A backlight for a display element arranged to display text and/or images, the backlight including a plurality of lighting devices according to claim 34.

42. A method comprising illuminating an object, a space, or an environment, utilizing a lighting device according to claim 34.

43. A lighting device comprising:
    at least one first solid state light emitter comprising a dominant wavelength in a range of from 500 nm to 570 nm;
    at least one first lumiphor arranged to receive emissions from the at least one first solid state light emitter and responsively generate lumiphor emissions comprising a peak wavelength in a range of from 591 nm to 700 nm;
    at least one second solid state light emitter comprising a peak wavelength in a range of from 430 nm to 480 nm;
    at least one second lumiphor arranged to receive emissions from the at least one second solid state light emitter and responsively generate lumiphor emissions comprising a peak wavelength in a range of from 591 nm to 700 nm;
    at least one third solid state light emitter comprising a peak wavelength in a range of from 430 nm to 480 nm; and
    at least one third lumiphor arranged to receive emissions from the at least one third solid state light emitter and responsively generate lumiphor emissions comprising a peak wavelength in a range of from 500 nm to 570 nm.

44. A lighting device comprising:
at least one first solid state light emitter comprising a dominant wavelength in a range of from 500 nm to 570 nm;
at least one first lumiphor arranged to receive emissions from the at least one first solid state light emitter and responsively generate lumiphor emissions comprising a peak wavelength of at least about 591 nm;
at least one second solid state light emitter comprising a peak wavelength in a range of from 430 nm to 470 nm; and
at least one third solid state light emitter comprising a peak wavelength in a range of from 470 to 500 nm; and
wherein the lighting device is arranged to output combined emissions including at least a portion of light emissions generated by each of the at least one first solid state light emitter, the at least one first lumiphor, the at least one second solid state light emitter, and the at least one third solid state light emitter.

45. A lighting device comprising:
at least one first solid state light emitter comprising a dominant wavelength in a range of from 500 nm to 570 nm;
at least one first lumiphor arranged to receive emissions from the at least one first solid state light emitter and responsively generate lumiphor emissions comprising a peak wavelength in a range of from 591 nm to 700 nm;
at least one second solid state light emitter comprising a peak wavelength in a range of from 430 nm to 480 nm;
at least one third solid state light emitter comprising a peak wavelength in a range of from 500 nm to 570 nm; and
at least one fourth solid state light emitter comprising a peak wavelength in a range of from 591 to 700 nm.

* * * * *